US010892286B2

(12) United States Patent
Sato et al.

(10) Patent No.: US 10,892,286 B2
(45) Date of Patent: Jan. 12, 2021

(54) IMAGING DEVICE

(71) Applicant: Panasonic Intellectual Property Management Co., Ltd., Osaka (JP)

(72) Inventors: Yoshihiro Sato, Osaka (JP); Junji Hirase, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/411,207

(22) Filed: May 14, 2019

(65) Prior Publication Data

US 2019/0371839 A1    Dec. 5, 2019

(30) Foreign Application Priority Data

May 31, 2018    (JP) .................................. 2018-104988

(51) Int. Cl.
*H01L 27/146*    (2006.01)
*H04N 5/359*    (2011.01)
(Continued)

(52) U.S. Cl.
CPC .... *H01L 27/14603* (2013.01); *H01L 27/1461* (2013.01); *H01L 27/14609* (2013.01);
(Continued)

(58) Field of Classification Search
CPC ................. H01L 27/144; H01L 27/146; H01L 27/14601; H01L 27/14603;
(Continued)

(56) References Cited

U.S. PATENT DOCUMENTS 6,051,857 A * 4/2000 Miida ............... H01L 27/14609
257/292
6,690,423 B1 * 2/2004 Nakamura ........ H01L 27/14601
257/215
(Continued)

FOREIGN PATENT DOCUMENTS

JP    2003-234496    8/2003
JP    2009-518849    5/2009
(Continued)

*Primary Examiner* — Eduardo A Rodela
(74) *Attorney, Agent, or Firm* — McDermott Will & Emery LLP

(57) ABSTRACT

An imaging device according to the present disclosure includes: a photoelectric converter generating signal charge; a semiconductor substrate including a first semiconductor layer on a surface; a charge accumulation region of a first conductivity type in the first semiconductor layer; a first transistor including, as a source or a drain, a first impurity region of the first conductivity type in the first semiconductor layer; and a blocking structure between the charge accumulation region and the first transistor. The blocking structure includes a second impurity region of a second conductivity type in the first semiconductor layer, between the charge accumulation region and the first impurity region, and a first electrode above the first semiconductor layer, overlapping at least part of the second impurity region in plan view, the first electrode being configured to be applied with a constant voltage in a period when the charge accumulation region accumulates the signal charge.

20 Claims, 30 Drawing Sheets

(51) Int. Cl.
  *H01L 27/30* (2006.01)
  *H04N 5/369* (2011.01)
(52) U.S. Cl.
  CPC .. *H01L 27/14612* (2013.01); *H01L 27/14614* (2013.01); *H01L 27/14616* (2013.01); *H01L 27/14636* (2013.01); *H01L 27/14638* (2013.01); *H01L 27/307* (2013.01); *H04N 5/359* (2013.01); *H04N 5/379* (2018.08)
(58) Field of Classification Search
  CPC ......... H01L 27/14607; H01L 27/14609; H01L 27/1461; H01L 27/14612; H01L 27/14616; H01L 27/14638; H01L 27/14643
  See application file for complete search history.

(56) References Cited

U.S. PATENT DOCUMENTS

| | | | |
|---|---|---|---|
| 2002/0011614 A1* | 1/2002 | Rhodes | H01L 27/14609 257/291 |
| 2007/0158710 A1 | 7/2007 | Mheen et al. | |
| 2008/0142856 A1* | 6/2008 | Sato | H01L 27/14609 257/292 |
| 2008/0296645 A1* | 12/2008 | Itonaga | H01L 27/14689 257/294 |
| 2009/0278174 A1* | 11/2009 | Ichikawa | H01L 27/14609 257/222 |
| 2014/0043510 A1 | 2/2014 | Kasuga et al. | |
| 2015/0109503 A1 | 4/2015 | Mori et al. | |
| 2016/0190188 A1 | 6/2016 | Murakami et al. | |
| 2017/0250216 A1 | 8/2017 | Sato et al. | |
| 2017/0287955 A1* | 10/2017 | Ukigaya | H04N 5/378 |
| 2018/0151723 A1* | 5/2018 | Grote | H01L 29/0634 |
| 2019/0198542 A1* | 6/2019 | Ezaki | H01L 31/02 |
| 2020/0119078 A1* | 4/2020 | Moriwaki | H01L 51/42 |
| 2020/0168648 A1* | 5/2020 | Kudoh | H01L 27/14634 |

FOREIGN PATENT DOCUMENTS

| | | |
|---|---|---|
| JP | 2016-127593 | 7/2016 |
| JP | 2017-046333 | 3/2017 |
| JP | 2017-152669 | 8/2017 |
| WO | 2012/147302 | 11/2012 |
| WO | 2014/002330 | 1/2014 |

* cited by examiner

IMAGING DEVICE

BACKGROUND

1. Technical Field

The present disclosure relates to an imaging device.

2. Description of the Related Art

Charge-coupled device (CCD) image sensors and complementary metal-oxide semiconductor (CMOS) image sensors are in widespread use in digital cameras and the like. These image sensors have photodiodes formed on a semiconductor substrate, which is a well-known fact.

A structure is being proposed where a photoelectric conversion layer is disposed above the semiconductor substrate instead of the photodiodes, as disclosed in International Publication Nos. 2014/002330 and 2012/147302, for example. Imaging device that has this sort of structure may be referred to as stacked imaging devices. In a stacked imaging device, charges generated by photoelectric conversion are temporarily accumulated in diffusion regions and the like formed in the semiconductor substrate, as signal charges. Signals corresponding to the amount of charges accumulated are read out via a CCD circuit or CMOS circuit formed on the semiconductor substrate.

SUMMARY

If charges that are different from signal charges expressing an image flow into diffusion regions temporarily storing signals charges, this can lead to noise. Noise causes deterioration of the obtained image. It is advantageous to be able to suppress unintended movement of charges. Hereinafter, such unintended movement of charges may be referred to as a leak current.

One non-limiting and exemplary embodiment provides the following.

In one general aspect, the techniques disclosed here feature an imaging device including: a photoelectric converter that generates a signal charge by photoelectric conversion of light; a semiconductor substrate that includes a first semiconductor layer on a surface of the semiconductor substrate; a charge accumulation region that is an impurity region of a first conductivity type in the first semiconductor layer, the charge accumulation region being configured to accumulate the signal charge; a first transistor that includes, as a source or a drain, a first impurity region of the first conductivity type in the first semiconductor layer; and a blocking structure that is located between the charge accumulation region and the first transistor, wherein the blocking structure includes a second impurity region of a second conductivity type in the first semiconductor layer, the second impurity region being located between the charge accumulation region and the first impurity region, the second conductivity type being different from the first conductivity type, and a first electrode that is located above the first semiconductor layer, the first electrode overlapping at least a part of the second impurity region in a plan view, the first electrode being configured to be applied with a first voltage in a period when the charge accumulation region accumulates the signal charge, the first voltage being a constant voltage.

It should be noted that general or specific embodiments may be implemented as an element, a device, a module, a system, or a method. General or specific embodiments may be implemented as any selective combination of element, device, module, system, and method.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
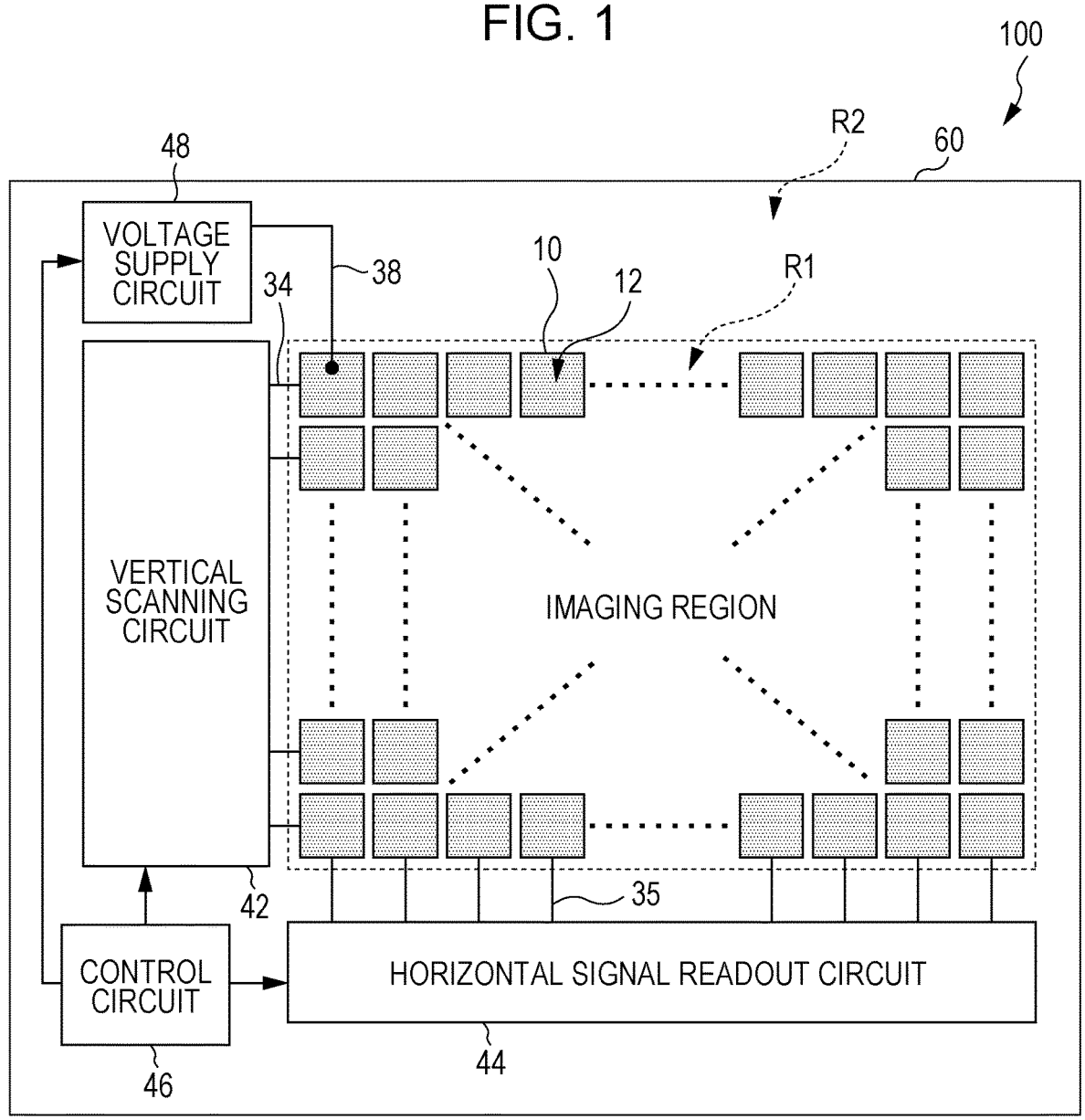
FIG. 1 is a diagram illustrating an exemplary circuit configuration of an imaging device according to a first embodiment of the present disclosure.

Aspects of the present disclosure are as described below.

Item 1

An imaging device, including:
a photoelectric converter that generates a signal charge by photoelectric conversion of light;
a semiconductor substrate that includes a first semiconductor layer on a surface of the semiconductor substrate;
a charge accumulation region that is an impurity region of a first conductivity type in the first semiconductor layer, the charge accumulation region being configured to accumulate the signal charge;
a first transistor that includes, as a source or a drain, a first impurity region of the first conductivity type in the first semiconductor layer; and
a blocking structure that is located between the charge accumulation region and the first transistor, wherein
the blocking structure includes
a second impurity region of a second conductivity type in the first semiconductor layer, the second impurity region being located between the charge accumulation region and the first impurity region, the second conductivity type being different from the first conductivity type, and
a first electrode that is located above the first semiconductor layer, the first electrode overlapping at least a part of the second impurity region in a plan view, the first electrode being configured to be applied with a first voltage in a period when the charge accumulation region accumulates the signal charge, the first voltage being a constant voltage.

Item 2

The imaging device according to Item 1, wherein the second impurity region has a first region located on the surface of the semiconductor substrate, the first electrode overlapping at least a part of the first region in the plan view.

Item 3

The imaging device according to either of Item 1 or 2, further including:
a third impurity region of the second conductivity type in the first semiconductor layer, the third impurity region being adjacent to the charge accumulation region.

Item 4

The imaging device according to Item 3, wherein
the semiconductor substrate includes
a supporting substrate of the second conductivity type, and
a second semiconductor layer of the first conductivity type, the second semiconductor layer being located between the supporting substrate and the first semiconductor layer.

Item 5

The imaging device according to any one of Items 1 through 4, wherein the first conductivity type is n-type.

Item 6

The imaging device according to Item 5, wherein
the first electrode includes an n-type impurity, and
the first voltage is 0 V or a negative voltage.

Item 7

The imaging device according to Item 5, wherein
the first electrode includes a p-type impurity, and
the first voltage is 1 V or less.

Item 8

The imaging device according to any one of Items 1 through 7, wherein the blocking structure includes a fourth impurity region of the second conductivity type in the first semiconductor layer, the fourth impurity region being located between the charge accumulation region and the first impurity region, the fourth impurity region being different from the second impurity region.

Item 9

The imaging device according to Item 8, wherein the first electrode overlaps at least a part of the fourth impurity region in the plan view.

Item 10

The imaging device according to either Item 1 or 2, further comprising:
multi-layer wiring that is located above the semiconductor substrate, the multi-layer wiring including a first wiring layer closest to the first semiconductor layer, and
the first electrode is a part of the first wiring layer.

Item 11

The imaging device according to Item 10, wherein
the semiconductor substrate includes
a supporting substrate of the second conductivity type, and
a second semiconductor layer of the first conductivity type, the second semiconductor layer being located between the supporting substrate and the first semiconductor layer.

Item 12
The imaging device according to either Item 10 or 11, wherein
the first conductivity type is n-type, and
the first voltage is equal to or less than a substrate potential.

Item 13
The imaging device according to Item 12, wherein
the multi-layer wiring includes a second wiring layer that is located farther from the semiconductor substrate than the first wiring layer is, and
a part of the second wiring layer covers the charge accumulation region and the first impurity region in the plan view, the part of the second wiring layer being configured to be applied with a voltage equal to or greater than the substrate potential.

Item 14
The imaging device according to either Item 10 or 11, wherein
the first conductivity type is p-type, and
the first voltage is equal to or greater than a substrate potential.

Item 15
The imaging device according to Item 14, wherein
the multi-layer wiring includes a second wiring layer that is located farther from the semiconductor substrate than the first wiring layer is,
a part of the second wiring layer covers the charge accumulation region and the first impurity region in the plan view, the part of the second wiring layer being configured to be applied with a voltage equal to or less than the substrate potential.

Item 16
An imaging device including one or more pixels, wherein each of the one or more pixels includes
a photoelectric converter,
a semiconductor substrate having a charge accumulation region of a first conductivity type that is electrically connected to the photoelectric converter,
a first transistor having a gate that is electrically connected to the photoelectric converter,
a second transistor having the charge accumulation region as one of a source and a drain, and
a first electrode that is located above the semiconductor substrate, and that is applied with a first voltage of constant potential during the entirety of a charge accumulation period where a charge generated by the photoelectric converter is accumulated in the charge accumulation region,
the semiconductor substrate further includes
a first impurity region of a first conductivity type, that is electrically isolated from the charge accumulation region, and
a second impurity region and a third impurity region of a second conductivity type that are disposed in the semiconductor substrate separated from each other between the charge accumulation region and the first impurity region,
the first transistor includes the first impurity region as one of a source and a drain, and
the first electrode covers at least a part of the second impurity region and at least a part of the third impurity region.

According to the configuration of Item 16, charges of inverse polarity from charges moving from the first impurity region toward the charge accumulation region can be concentrated in a region below the first electrode, by applying a negative voltage, for example, to the first electrode. The charges moving from the first impurity region toward the charge accumulation region can be eliminated by recombination, by accumulation of the charges of inverse polarity, contamination of the charge accumulation region by excess charges can be suppressed, and image deterioration due to leak current can be suppressed.

Item 17
The imaging device according to Item 16, wherein at least one of a region of the second impurity region covered by the first electrode and a region of the third impurity region covered by the first electrode is located on a surface of the semiconductor substrate.

Item 18
The imaging device according to either Item 16 or 17, wherein
the semiconductor substrate includes a first semiconductor layer of the second conductivity type, and
the charge accumulation region is located in the first semiconductor layer.

According to the configuration of Item 18, a region having a relatively low concentration of impurity can be disposed around a portion where a contact plug that has electrical connection to the photoelectric converter comes into contact with the semiconductor substrate. Accordingly, the electric field intensity at a p-n junction formed between the charge accumulation region and the periphery thereof can be reduced, for example.

Item 19
The imaging device according to Item 18, wherein
the semiconductor substrate includes
a supporting substrate of the second conductivity type, and
a second semiconductor layer located on the supporting substrate and having the first conductivity type, and
the second semiconductor layer is located between the supporting substrate and the first semiconductor layer.

According to the configuration of Item 19, inflow of minority carriers from peripheral circuits, for example, to the charge accumulation region is suppressed by the second semiconductor layer. Accordingly, effects of suppressed deterioration of image can be obtained.

Item 20
The imaging device according to any one of Items 16 through 19, wherein the first conductivity type is n-type.

According to the configuration of Item 20, a p-type silicon substrate can be used as the semiconductor substrate.

Item 21
The imaging device according to Item 20, wherein
the first electrode includes an n-type impurity, and
the first voltage is 0 V or a negative voltage.

According to the configuration of Item 21, charges of inverse polarity from charges generated at the p-n junction of the first impurity region and moving toward the charge accumulation region are concentrated in a region of the semiconductor substrate directly beneath the first electrode and near the surface. Accordingly, even if there are charges generated at the p-n junction of the first impurity region and moving toward the charge accumulation region, such charges can be eliminated by recombination at the region below the first electrode.

Item 22
The imaging device according to Item 20, wherein
the first electrode includes a p-type impurity, and
the first voltage is a voltage of 1 V or less.

According to the configuration of Item 22, the same effects as Item 21 can be obtained.

Item 23
An imaging device including one or more pixels, wherein each of the one or more pixels includes
a photoelectric converter,
a semiconductor substrate having a first semiconductor layer of a second conductivity type, and a charge accumulation region of a first conductivity type that is located in the first semiconductor layer and electrically connected to the photoelectric converter,
a first transistor having a gate that is electrically connected to the photoelectric converter,
a second transistor having the charge accumulation region as one of a source and a drain,
a first electrode that is located above the semiconductor substrate, and that is applied with a first voltage of constant potential during the entirety of a charge accumulation period when charges generated by the photoelectric converter are accumulated in the charge accumulation region, and
multi-layer wiring located above the semiconductor substrate, and including a first wiring layer and a second wiring layer that each extend over multiple pixels,
the semiconductor substrate further includes
a first impurity region of a first conductivity type, that is electrically isolated from the charge accumulation region, and
a second impurity region of the second conductivity type that is located between the charge accumulation region and the first impurity region, and that has a higher concentration of impurity than the first semiconductor layer,
the first transistor includes the first impurity region as one of a source and a drain, and
the first wiring layer is located closest to the semiconductor substrate of the wiring layers included in the multi-layer wiring, and includes, as a part thereof, a first wiring portion serving as the first electrode located between the charge accumulation region and the first impurity region in a plan view.

According to the configuration of Item 23, part of the wiring layer located above the semiconductor substrate can be used as the first electrode, and the same effects as Item 16 can be obtained.

Item 24
The imaging device according to Item 23,
wherein the first electrode covers at least a part of the second impurity region in the plan view,
and wherein the region of the second impurity region covered by the first electrode is located at the surface of the semiconductor substrate.

Item 25
The imaging device according to either Item 23 or 24, wherein
the semiconductor substrate includes
a supporting substrate of the second conductivity type, and
a second semiconductor layer located on the supporting substrate and having the first conductivity type, and
the second semiconductor layer is located between the supporting substrate and the first semiconductor layer.

According to the configuration of Item 25, effects the same as Item 19 can be obtained.

Item 26
The imaging device according to any one of Items 23 through 25, wherein
the first conductivity type is n-type, and
the first voltage is a voltage of substrate potential or less.

According to the configuration of Item 26, the same effects as Item 21 can be obtained.

Item 27
The imaging device according to Item 26, wherein
the second wiring layer is located farther from the semiconductor substrate than the first wiring layer is, and includes a second wiring portion that covers the charge accumulation region and the first impurity region in the plan view, and is applied with a voltage of the substrate potential or greater.

According to the configuration of Item 27, the second wiring layer is located in an upper layer from the gates of the first and second transistors, so the shape of the second wiring portion in the plan view can be made to be a shape crossing the charge accumulation region, for example. Also, the first electrode functions as a shielding electrode, so a voltage different from the first voltage can be applied to the second wiring portion.

Item 28
The imaging device according to any one of Items 23 through 25, wherein
the first conductivity type is p-type, and
the first voltage is a voltage of a substrate potential or greater.

According to the configuration of Item 28, the same effects as Item 22 can be obtained.

Item 29
The imaging device according to Item 28, wherein
the second wiring layer is located farther from the semiconductor substrate than the first wiring layer is, and includes a second wiring portion that covers the charge accumulation region and the first impurity region in the plan view, and is applied with a voltage of the substrate potential or greater.

According to the configuration of Item 29, the same effects as Item 27 can be obtained.

Embodiments of the present disclosure will be described in detail below, with reference to the drawings. Note that the embodiments described below are all general or specific examples of the technology of the present disclosure. Accordingly, values, shapes, materials, components, layout and connection state of the components, steps, the order of steps, and so forth illustrated in the following embodiments, are only exemplary, and are not intended to restrict the present disclosure. Various aspects described in the present embodiment may be combined with each other to the extent that there is no conflict. Components in the following embodiments which are not included in an independent Claim indicating a highest order concept are described as optional components. Components having substantially the same functions may be denoted by common reference numerals, and description thereof omitted in the description below. Also, illustrations of a part of the elements may be omitted, to avoid the drawings from becoming excessively complicated.

First Embodiment

FIG. 1 illustrates an exemplary configuration of an imaging device according to a first embodiment of the present disclosure. The imaging device 100 illustrated in FIG. 1 has multiple pixels 10 formed on a semiconductor substrate 60, and peripheral circuits.

The pixels 10 each include a photoelectric converter 12. The photoelectric converter 12 receives incident light, and generates positive and negative charges, typically a hole-electron pair. The photoelectric converter 12 may be a photoelectric conversion structure including a photoelectric conversion layer disposed above the semiconductor substrate 60, and may be a photodiode formed on the semiconductor substrate 60. Although the photoelectric converters 12 of the pixel 10 are illustrated in FIG. 1 spatially separated from each other, but this is only for convenience in describing, and the photoelectric converters 12 of the multiple pixels 10 may be continuously laid out on the semiconductor substrate 60 without spacing therebetween.

In the example illustrated in FIG. 1, the pixels 10 are arrayed in multiple rows and columns, of m rows and n columns. Here, m and n are independent integers of 1 or greater. A two-dimensional array, for example, of the pixels 10 on the semiconductor substrate 60, forms an imaging region R1. In a case where pixels 10 have a photoelectric conversion structure above the semiconductor substrate 60, for example, as the photoelectric converters 12, the imaging region R1 can be defined as a region of the semiconductor substrate 60 that is covered by the photoelectric conversion structure.

The number and layout of the pixels 10 are not restricted to those illustrated. For example, the number of pixels 10 included in the imaging device 100 may be one. Although the pixels 10 are arrayed with the centers thereof located on grid points of a square grid in this example, the multiple pixels 10 may be laid out such that the centers of the pixels 10 are located on grid points of a triangular grid, a hexagonal grid, or the like, for example. The imaging device 100 may be used as a line sensor by arraying the pixels 10 one-dimensionally, for example.

The peripheral circuits in the configuration exemplified in FIG. 1 include a vertical scanning circuit 42 and a horizontal signal readout circuit 44. The peripheral circuits may additionally include a control circuit 46 and voltage supply circuit 48, as exemplified in FIG. 1. The circuits included in the peripheral circuits are provided on the semiconductor substrate 60 in the example illustrated in FIG. 1. Note, however, that part of the peripheral circuits may be provided on another substrate that is different from the semiconductor substrate 60 on which the pixels 10 are formed.

The vertical scanning circuit 42 is also referred to as a row scanning circuit, and connects to address signal lines 34 provided corresponding to each row of the multiple pixels 10. The signal line provided corresponding to each row of the multiple pixels 10 is not restricted to the address signal line 34, and multiple types of signal lines may be connected to the vertical scanning circuit 42 for each row of multiple pixels 10, which will be described later. The horizontal signal readout circuit 44 is also referred to as a column scanning circuit, and has connection with vertical signal lines 35 provided corresponding to each column of the multiple pixels 10.

The control circuit 46 receives command data, clock, and so forth, provided from the outside of the imaging device 100 for example, and controls the entire imaging device 100. Typically, the control circuit 46 has a timing generator, and supplies drive signals to the vertical scanning circuit 42, horizontal signal readout circuit 44, voltage supply circuit 48, and so forth. Note that the arrows extending from the control circuit 46 in FIG. 1 schematically represent the flow of output signals from the control circuit 46. The control circuit 46 may be realized by a microcontroller including one or more processor, for example. The functions of the control circuit 46 may be realized by a combination of general-purpose processing circuit and software, or may be realized by hardware specialized for such processing.

The voltage supply circuit 48 supplies a predetermined voltage to the pixels 10 via the voltage line 38. The voltage supply circuit 48 is not restricted to a particular power source circuit, and may be a circuit that converts a voltage supplied from a power source such as a battery to a predetermined voltage, or may be a circuit that generates a predetermined voltage. The voltage supply circuit 48 may be part of the above-described vertical scanning circuit 42. These circuits making up the peripheral circuits typically are laid out in a peripheral region R2 outside of the imaging region R1, as schematically illustrated in FIG. 1.

Figure 2:
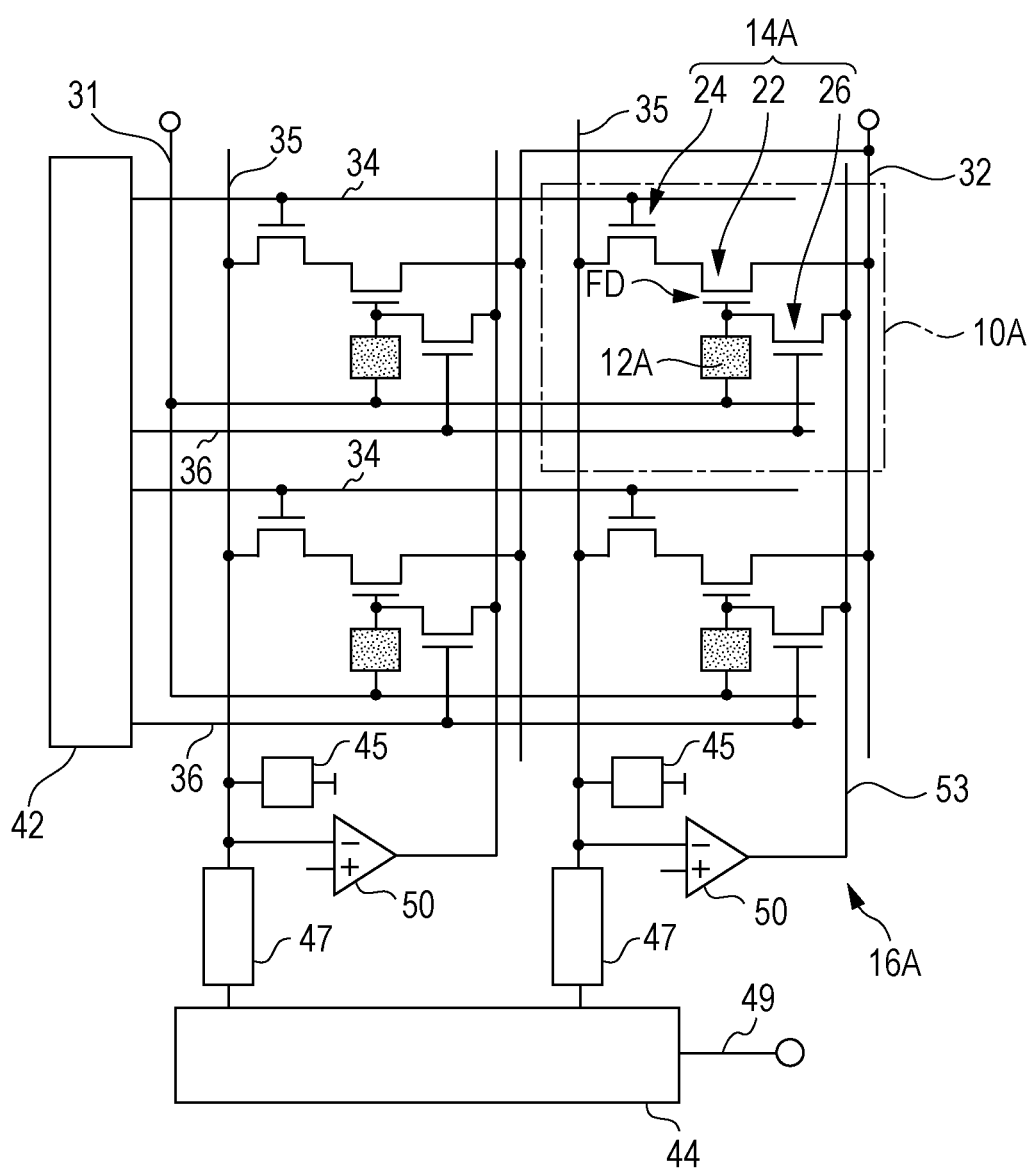
FIG. 2 is a schematic diagram illustrating an exemplary configuration of an imaging device according to the first embodiment of the present disclosure.

FIG. 2 schematically illustrates an exemplary circuit configuration of the imaging device according to the first embodiment of the present disclosure. Four pixels 10A, in a 2-row 2-column array, are representatively illustrated in FIG. 2, to avoid the drawing from becoming complicated. These pixels 10A each are an example of the pixels 10 illustrated in FIG. 1. The pixels 10A each have a photoelectric conversion structure 12A serving as the photoelectric converter 12, and include a signal detection circuit 14A electrically connected to the photoelectric conversion structure 12A. The photoelectric conversion structure 12A includes a photoelectric conversion layer disposed above the semiconductor substrate 60, which will be described later in detail with reference to the drawings. That is to say, a stacked imaging device is exemplified here as the imaging device 100. Note that in the present specification, terms such as "above", "below", "upper face", and "lower face", are used only to specify the relative positions among parts, and do not restrict the attitude of the imaging device when in use.

The photoelectric conversion structures 12A of the pixels 10A have connection with an accumulation control line 31. When the imaging device 100 is operating, a predetermined voltage is applied to the accumulation control line 31. For example, in a case of using, of the positive and negative charges generated by photoelectric conversion, the positive charge as the signal charge, a positive voltage of around 10 V, for example, may be applied to the accumulation control line 31 when the imaging device 100 is operating. A case of using holes as signal charges will be exemplified below.

In the configuration exemplified in FIG. 2, the signal detection circuit 14A includes a signal detecting transistor 22, an address transistor 24, and a reset transistor 26. The signal detecting transistor 22, address transistor 24, and reset transistor 26 typically are field-effect transistors formed on the semiconductor substrate 60 supporting the photoelectric conversion structures 12A, which will be described later in detail with reference to the drawings. An example of using an N-channel metal-oxide-semiconductor (MOS) device as the transistors will be described below, unless specifically stated otherwise.

The gate of the signal detecting transistor 22 is electrically connected to the photoelectric conversion structure 12A, as schematically illustrated in FIG. 2. Holes, for example, can be accumulated in the charge accumulation node FD as a signal charge by applying a predetermined voltage to the accumulation control line 31 when operating. The charge accumulation node FD is a node connecting the gate of the signal detecting transistor 22 to the photoelectric converter 12, and includes an impurity region formed on the semiconductor substrate 60 as a part thereof, which will be described later with reference to the drawings. In the example illustrated in FIG. 2, the charge accumulation node FD has a function of temporarily storing charges generated by the photoelectric conversion structure 12A.

The drain of the signal detecting transistor 22 is connected to power source wiring 32 that supplies power source voltage VDD around 3.3 V for example, to the pixels 10A when the imaging device 100 is operating. The source of the signal detecting transistor 22 is connected to the vertical signal line 35 via the address transistor 24. The signal detecting transistor 22 receives supply of the power source voltage VDD at the drain thereof, and thereby outputs signal voltage in accordance with the amount of the signal charge accumulated at the charge accumulation node FD.

The address signal line 34 is connected to the gate of the address transistor 24 connected between the signal detecting transistor 22 and the vertical signal line 35. Accordingly, the vertical scanning circuit 42 can read output of the signal detecting transistor 22 of a selected pixel 10A to the corresponding vertical signal line 35 by applying, to the address signal line 34, a row-selection signal that controls on and off of the address transistor 24. Note that the layout of the address transistor 24 is not restricted to the example illustrated in FIG. 2, and may be between the drain of the signal detecting transistor 22 and the power source wiring 32.

A load circuit 45 and column signal processing circuit 47 are connected to each vertical signal line 35. The load circuit 45 makes up a source follower circuit along with the signal detecting transistor 22. The column signal processing circuit 47 is also referred to as a row signal accumulating circuit, and performs noise suppression signal processing of which correlated double sampling is representative, analog/digital conversion, and so forth. The horizontal signal readout circuit 44 sequentially reads signals from multiple column signal processing circuits 47 to a horizontal common signal line 49. The load circuit 45 and column signal processing circuit 47 may be a part of the above-described peripheral circuits.

A reset signal line 36 that has connection with the vertical scanning circuit 42 is connected to the gate of the reset transistor 26. A reset signal line 36 is provided to each row of multiple pixel 10A in the same way as the address signal line 34. The vertical scanning circuit 42 can select pixels 10A to be the object of resetting, in increments of rows, by applying row selection signals to the address signal line 34. The vertical scanning circuit 42 can switch the reset transistors 26 of the selected row on by applying a reset signal to the gate of the reset transistor 26 via the reset signal line 36. The potential of the charge accumulation node FD is reset by the reset transistor 26 going on.

In this example, one of the drain and source of the reset transistor 26 is connected to the charge accumulation node FD, and the other of the drain and source is connected to a corresponding one of feedback lines 53 provided to each row of the multiple pixels 10A. That is to say, the voltage of the feedback line 53 is supplied to the charge accumulation node FD as a reset voltage to initialize the charge of the photoelectric converter 12 in this example.

In the configuration exemplified in FIG. 2, the imaging device 100 has a feedback circuit 16A that includes an inverting amplifier 50 in a part of its feedback path. An inverting amplifier 50 is provided to each of multiple columns of the multiple pixels 10A, with the above-described feedback line 53 being connected to the output terminal of a corresponding one of the multiple inverting amplifiers 50, as illustrated in FIG. 2. The inverting amplifier 50 may be part of the above-described peripheral circuits.

An inverting input terminal of the inverting amplifier 50 is connected to the vertical signal line 35 of a corresponding column, as illustrated in FIG. 2. When the imaging device 100 is operating, reference voltage Vref that is a positive voltage of 1 V or around 1 V, for example, is supplied to the non-inverting input terminal of the inverting amplifier 50. Turning the address transistor 24 and reset transistor 26 on enables a feedback path for negative feedback of the pixel 10A to be formed, and formation of the feedback path causes the voltage of the vertical signal line 35 to converge to the input reference voltage Vref to the non-inverting input terminal of the inverting amplifier 50. In other words, formation of the feedback path resets the voltage of the charge accumulation node FD, so that the voltage of the vertical signal line 35 is Vref. The voltage of an optional magnitude within the range of power source voltage to ground voltage can be used as the reference voltage Vref. Forming the feedback path enables reset noise generated by the reset transistor 26 going off to be reduced. Details of suppression of reset noise using feedback are described in International Publication No. 2012/147302. International Publication No. 2012/147302 is incorporated herein by reference in its entirety, for reference.

Device Structure of Pixel 10A

Figure 3:
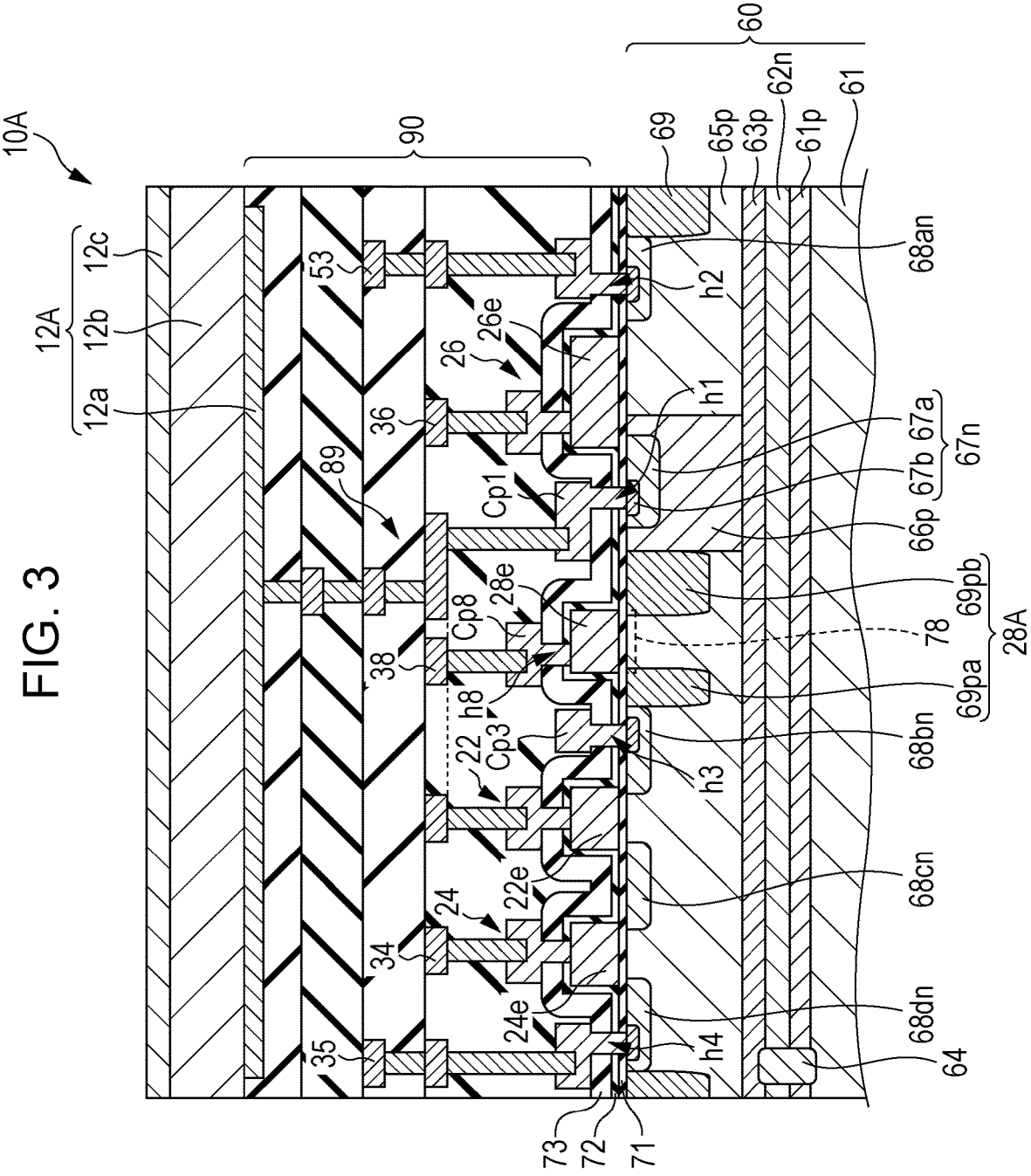
FIG. 3 is a cross-sectional diagram schematically illustrating an example of a device structure of a first pixel illustrated in FIG. 2.
Figure 4:
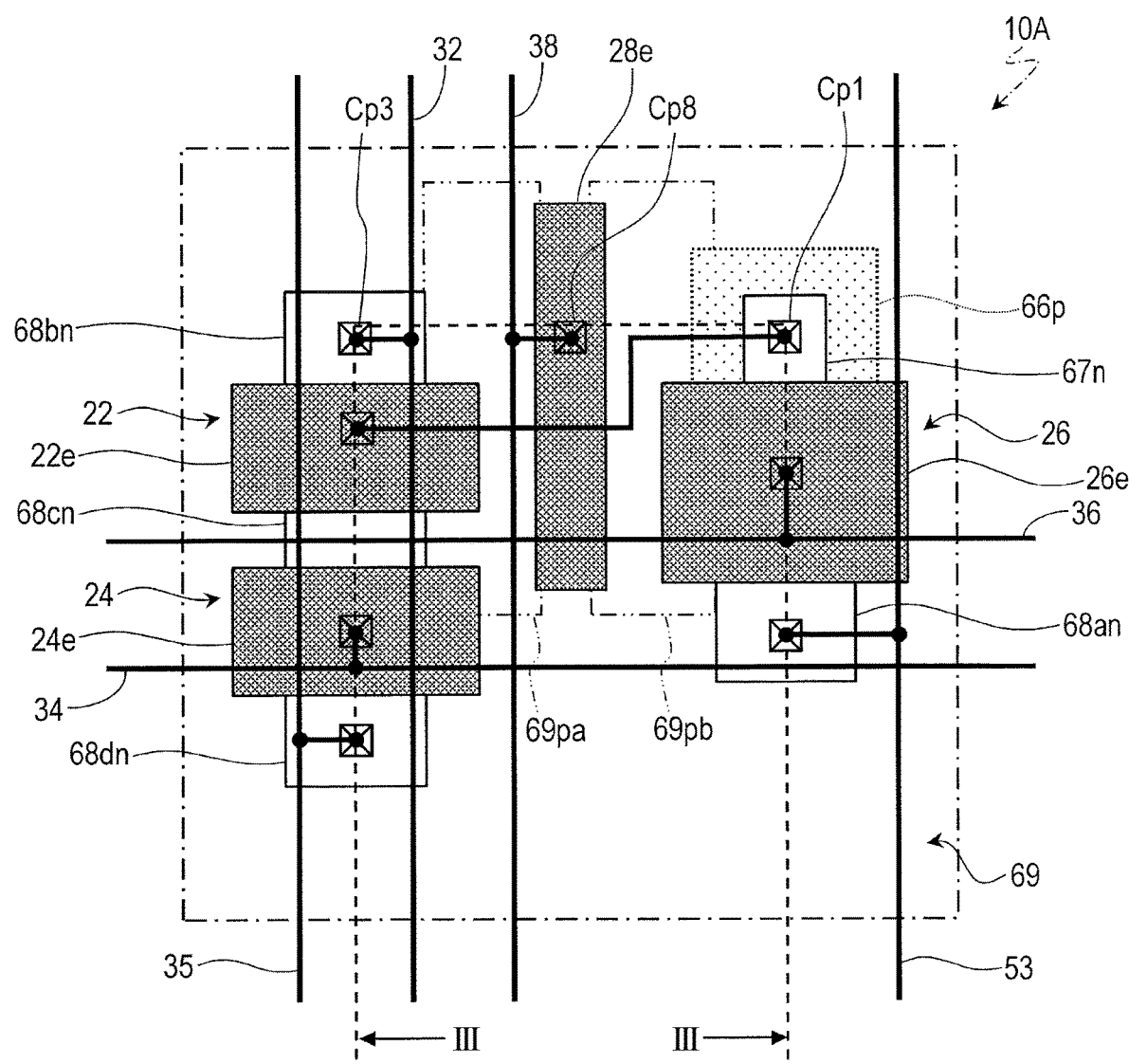
FIG. 4 is a schematic plan view illustrating an example of the layout of elements in the first pixel.

FIG. 3 schematically illustrates an example of the device structure of the pixel 10A. FIG. 4 illustrates an example of the layout of the elements in the pixel 10A. FIG. 4 schematically illustrates the layout of the elements formed on the semiconductor substrate 60 when viewing the pixel 10A illustrated in FIG. 3 along the normal direction of the semiconductor substrate 60. Taking a cross-section of the pixel 10A along lines III-Ill in FIG. 4 and unfolding yields the cross-section illustrated in FIG. 3.

Referencing FIG. 3, the pixel 10A includes the semiconductor substrate 60, the photoelectric conversion structure 12A disposed above the semiconductor substrate 60, and a conductive structure 89. The photoelectric conversion structure 12A is supported by an inter-layer insulating layer 90 that covers the semiconductor substrate 60. The conductive structure 89 is disposed within the inter-layer insulating layer 90. In the exemplified example, the inter-layer insulating layer 90 includes multiple insulating layers. The conductive structure 89 includes part of each of multiple wiring layers disposed within the inter-layer insulating layer 90. The multiple wiring layers disposed within the inter-layer insulating layer 90 may include, for example, a wiring layer that includes the address signal line 34 and reset signal line 36 and so forth as a part thereof, and a wiring layer that includes the vertical signal line 35, power source wiring 32, and feedback line 53 and so forth as a part thereof. It is needless to say that the number of insulating layers and number of wiring layers in the inter-layer insulating layer 90 is not restricted in particular in this example, and is optionally settable.

The photoelectric conversion structure 12A includes a pixel electrode 12a formed on the inter-layer insulating layer 90, an opposing electrode 12c on the incident light side, and a photoelectric conversion layer 12b disposed between these electrodes. The photoelectric conversion layer 12b of the photoelectric conversion structure 12A is formed of an organic material or an inorganic material such as amorphous silicon or the like, and generates positive and negative charges by photoelectric conversion upon receiving incident light via the opposing electrode 12c. The photoelectric conversion layer 12b typically is formed continuously over multiple pixels 10A. The photoelectric conversion layer 12b may include a layer made up of an organic material and a layer made up of an inorganic material.

The opposing electrode 12c is a translucent electrode formed of a transparent conductive material such as indium tin oxide (ITO) or the like. Note that the term "translucent" as used in the present specification means that at least part of light of a wavelength that the photoelectric conversion layer 12b can absorb is transmitted, and transmission of light over the entire wavelength spectrum of visible light is not indispensable. Typically, the opposing electrode 12c is formed over multiple pixels 10A in the same way as the photoelectric conversion layer 12b. The opposing electrode 12c has connection with the above-described accumulation control line 31, although this is omitted from illustration in FIG. 3. When the imaging device 100 is operating, the potential of the accumulation control line 31 is controlled so that the potential of the opposing electrode 12c is higher, for example, than the potential of the pixel electrode 12a. Accordingly, positive charge of the positive and negative charges generated by the photoelectric conversion can be selectively collected by the pixel electrode 12a. The opposing electrode 12c may be formed as a single continuous layer over multiple pixels 10A. Accordingly, a predetermined potential can be applied in a batch to the opposing electrode 12c of the multiple pixels 10A.

The pixel electrode 12a is an electrode formed of a metal such as aluminum, copper, or the like, a metal nitride, or polysilicon that has been imparted conductivity by being doped by an impurity, or the like. The pixel electrode 12a is electrically isolated from the pixel electrodes 12a of other pixels 10A by being spatially isolated from the pixel electrodes 12a of adjacent other pixels 10A.

The conductive structure 89 typically includes multiple lines and plugs formed of a metal such as copper, tungsten, or the like, or metal compounds such as metal nitrides or metal oxides, and polysilicon plugs. One end of the conductive structure 89 is connected to the pixel electrode 12a. The pixel electrode 12a of the photoelectric conversion structure 12A and the circuits on the semiconductor substrate 60 are electrically connected to each other, by the other end of the conductive structure 89 being connected to circuit elements formed on the semiconductor substrate 60, which will be described later.

Giving attention to the semiconductor substrate 60 now, the semiconductor substrate 60 includes a supporting substrate 61, and one or more semiconductor layers formed on the supporting substrate 61, as schematically illustrated in FIG. 3. A p-type silicon substrate is exemplified here as the supporting substrate 61.

In the configuration exemplified illustrated in FIG. 3, the semiconductor substrate 60 has a p-type semiconductor layer 61p on the supporting substrate 61, an n-type semiconductor layer 62n on the p-type semiconductor layer 61p, a p-type semiconductor layer 63p on the n-type semiconductor layer 62n, and a p-type semiconductor layer 65p serving as a first semiconductor layer located on the p-type semiconductor layer 63p. Typically, the p-type semiconductor layer 63p is formed generally over the entire face of the supporting substrate 61. The p-type semiconductor layer 61p, the n-type semiconductor layer 62n, and the p-type semiconductor layer 63p and p-type semiconductor layer 65p, are each typically formed by ion injection of an impurity to a semiconductor layer formed by epitaxial growth. The concentrations of impurity at the p-type semiconductor layer 63p and p-type semiconductor layer 65p are around the same as each other, and are higher than the concentration of impurity of the p-type semiconductor layer 61p.

The n-type semiconductor layer 62n serving as the second semiconductor layer is located between the p-type semiconductor layer 61p and p-type semiconductor layer 63p. An unshown well contact is connected to the n-type semiconductor layer 62n, although omitted from illustration in FIG. 3. The well contact is provided on the outer side of the imaging region R1, and the potential of the n-type semiconductor layer 62n is controlled via the well contact when the imaging device 100 is operating. Providing the n-type semiconductor layer 62n suppresses inflow of minority carriers to the charge accumulation region where signal charges are accumulated from the supporting substrate 61 or peripheral circuits.

Further, in this example, the semiconductor substrate 60 has a p-type region 64 provided between the p-type semiconductor layer 63p and p-type supporting substrate 61, penetrating the p-type semiconductor layer 61p and n-type semiconductor layer 62n. The p-type region 64 has a higher concentration of impurity as compared to the p-type semiconductor layer 63p and p-type semiconductor layer 65p, and has a function of electrically connecting the p-type semiconductor layer 63p and supporting substrate 61 to each other.

The supporting substrate 61 has connection with a substrate contact omitted from illustration in FIG. 3, provided on the outer side of the imaging region R1. When the imaging device 100 is operating, the potential of the supporting substrate 61 and p-type semiconductor layer 63p is controlled via the substrate contact. The potential of the p-type semiconductor layer 65p can also be controlled via the p-type semiconductor layer 63p when the imaging device 100 is operating, due to the p-type semiconductor layer 65p being located so as to be in contact with the p-type semiconductor layer 63p In the configuration exemplified in FIG. 3, the p-type semiconductor layer 65p has a p-type impurity region 66p having a lower concentration of impurity, and an n-type impurity region 67n is formed in the p-type impurity region 66p. The n-type impurity region 67n is formed near the surface of the semiconductor substrate 60, with at least part thereof being located on the surface of the semiconductor substrate 60, as schematically illustrated in FIG. 3. The n-type impurity region 67n here includes a first region 67a, and a second region 67b that is located within the first region 67a and has a relatively higher concentration of impurity than the first region 67a.

An insulating layer is disposed on the principal face of the semiconductor substrate 60, on the side toward the photoelectric conversion structure 12A. In this example, the principal face of the semiconductor substrate 60 on the side toward the photoelectric conversion structure 12A is covered by a first insulating layer 71, a second insulating layer 72, and a third insulating layer 73. The first insulating layer 71 is a thermally oxidized film of silicon, for example. The second insulating layer 72 is a silicon dioxide layer for example, and the third insulating layer 73 is a silicon nitride layer, for example. The second insulating layer 72 may have a layered structure including multiple insulating layers, and in the same way, the third insulating layer 73 may have a layered structure including multiple insulating layers.

The layered structure of the first insulating layer 71, second insulating layer 72, and third insulating layer 73 has a contact hole h1 on the second region 67b of the n-type impurity region 67n. A contact plug Cp1 that is part of the conductive structure 89 is connected to the second region 67b via the contact hole h1 in the example illustrated in FIG. 3, and accordingly, the n-type impurity region 67n is electrically connected to the pixel electrode 12a of the photoelectric conversion structure 12A via the conductive structure 89.

The junction capacitance formed by the p-n junction between the p-type impurity region 66p serving as a p-well and the n-type impurity region 67n functions as capacitance that accumulates at least part of the signal charges. Thus, the n-type impurity region 67n functions as a charge accumulation region temporarily storing signal charges. The conductive structure 89 and n-type impurity region 67n can also be said to make up at least part of the above-described charge accumulation node FD.

The potential of the p-type semiconductor layer 65p can be controlled via the p-type semiconductor layer 63p when the imaging device 100 is operating, by placing the p-type semiconductor layer 65p adjacent to the p-type semiconductor layer 63p, as described above. Employing this sort of structure enables a region with a relatively low concentration of impurity to be disposed in the periphery of the portion where the contact plug Cp1, which has electrical contact with the photoelectric conversion structure 12A, and the semiconductor substrate 60 come into contact. In this example, the p-type impurity region 66p is disposed around the second region 67b of the n-type impurity region 67n. Disposing the first region 67a that has a relatively low concentration of impurity around the second region 67b enables the intensity of the electrical field formed by the p-n junction between the n-type impurity region 67n and the p-type semiconductor layer 65p or the p-type impurity region 66p to be reduced. Reducing the intensity of the electrical field formed by the p-n junction yields an effect of suppressing leak current due to the electrical field formed by the p-n junction.

Note that forming the second region 67b in the n-type impurity region 67n is not indispensable. Note, however, that making the concentration of impurity of the second region 67b that is the contact portion with the contact plug Cp1 and semiconductor substrate 60 relatively high yields the effect of suppressing spread of the depletion layer around the portion where the contact plug Cp1 and semiconductor substrate 60 come into contact. This also enables suppression of crystal defects in the semiconductor substrate 60 at the interface of the contact plug Cp1 and semiconductor substrate 60, in other words, unintended inflow of charges to the n-type impurity region 67n serving as the charge accumulation region and/or unintended outflow of charges from the n-type impurity region 67n, occurring due to the interface state. Also, connecting the contact plug Cp1 to the second region 67b that has a relatively high concentration of impurity yields the effect of reduced contact resistance.

The above-described signal detection circuit 14A is formed on the semiconductor substrate 60. The signal detection circuit 14A in the pixel 10A is electrically isolated from the signal detection circuits 14A in other adjacent pixels 10A due to a pixel isolation region 69 being disposed between mutually adjacent pixels 10A. The pixel isolation region 69 is, for example, a p-type diffusion region.

In the signal detection circuit 14A, the reset transistor 26 includes the n-type impurity region 67n as one of the drain region and source region, and includes an n-type impurity region 68an as the other of the drain region and source region. The reset transistor 26 further includes a gate electrode 26e on the first insulating layer 71, with the portion of the first insulating layer 71 located between the gate electrode 26e and the semiconductor substrate 60 functioning as a gate insulating layer of the reset transistor 26. The n-type impurity region 68an is formed in the p-type semiconductor layer 65p, and is connected to a feedback line 53 via a contact hole h2.

Also, n-type impurity regions 68bn, 68cn, and 68dn are provided in the p-type semiconductor layer 65p. The n-type impurity regions 68an, 68bn, 68cn, and 68dn have a higher concentration of impurity than the first region 67a of the n-type impurity region 67n.

The signal detecting transistor 22 includes the n-type impurity region 68bn, the n-type impurity region 68cn, and a gate electrode 22e on the first insulating layer 71. The gate electrode 22e in this example is connected to a portion of the conductive structure 89 where the pixel electrode 12a and contact plug Cp1 come into contact, in the layer where the address signal line 34, reset signal line 36, and so forth are located, as schematically illustrated by the dashed line in FIG. 3. In other words, the conductive structure 89 also has electrical connection with the gate electrode 22e.

The n-type impurity region 68bn serving as a drain region is connected to a contact plug Cp3 via a contact hole h3. The above-described power source wiring 32 serving as the source follower power source is connected to the contact plug Cp3. Note that the power source wiring 32 is omitted from illustration in FIG. 3.

The n-type impurity region 68bn is located in the p-type semiconductor layer 65p, isolated from the n-type impurity region 67n serving as the charge accumulation region, as schematically illustrated in FIG. 3. In this example, impurity regions 69pa and 69pb are interposed between the n-type impurity region 68bn and n-type impurity region 67n, thereby electrically isolating the n-type impurity region 68bn from the n-type impurity region 67n. The impurity regions 69pa and 69pb are part of the above-described pixel isolation region 69, and typically are p-type diffusion regions. The concentration of impurity in the impurity regions 69pa and 69pb is higher than the concentration of impurity of the p-type semiconductor layer 65p, and is in a range around $5 \times 10^{17}$ cm$^{-3}$ or more to $1 \times 10^{19}$ cm$^{-3}$ or less, for example. When viewing a cross-sectional taken perpendicular to the principal face of the semiconductor substrate 60, the impurity regions 69pa and 69pb are disposed in the p-type impurity region 65p isolated from each other, between the n-type impurity region 67n and the n-type impurity region 68bn, as illustrated in FIG. 3.

Further, a control electrode 28e is disposed in a region between the impurity region 69pa and impurity region 69pb on the first insulating layer 71. The control electrode 28e is covered by the layered structure of the second insulating layer 72 and third insulating layer 73, as illustrated in FIG. 3. Note that in this example, the layered structure of the second insulating layer 72 and third insulating layer 73 covers the gate electrode 26e of the reset transistor 26 and later-described gate electrodes 22e and 24e. The control electrode 28e is connected to the above-described voltage line 38 via the contact plug Cp8 that penetrates the contact hole h8 provided to the second insulating layer 72 and third insulating layer 73. That is to say, the control electrode 28e is configured to be able to apply a predetermined voltage when the imaging device 100 is operating via the voltage line 38. A voltage line 38 may be provided to every multiple column of pixels 10A, in the same way as the vertical signal lines 35 or the like. Although the voltage line 38 is illustrated as being in the same layer as the address signal line 34 and reset signal line 36 in FIG. 3, the voltage line 38 has no electrical connection with any of the address signal line 34, reset signal line 36, and conductive structure 89.

In the configuration exemplified in FIG. 4, the control electrode 28e has a rectangular shape extending in the direction parallel to the column direction of the multiple pixels 10A. The general position of the impurity region 69pa and impurity region 69pb illustrated in FIG. 3 is indicated by a two-dot dashed line in FIG. 4. The control electrode 28e overlaps the end portion of the impurity region 69pa and the end portion of the impurity region 69pb, as schematically illustrated in FIG. 4. The region of the impurity region 69pa that is covered by the control electrode 28e and the region of the impurity region 69pb that is covered by the control electrode 28e are located on the surface of the semiconductor substrate 60, which can be seen by comparing with FIG. 3. Note that in the example illustrated in FIG. 4, the signal detecting transistor 22 and address transistor 24 are laid out on a straight line in the vertical direction in the plane of the drawing. The drain regions and source regions thereof are electrically isolated from the drain region and source region of the reset transistor 26, by the pixel isolation region 69 that has the impurity region 69pa and impurity region 69pb as parts thereof.

Part of the first insulating layer 71 is located between the control electrode 28e and the semiconductor substrate 60, as schematically illustrated in FIG. 3. Looking at the control electrode 28e and the periphery thereof, it can be said that the structure of the control electrode 28e and the periphery thereof in the pixel 10A has a structure resembling a MOS capacitor. In a typical embodiment of the present disclosure, when the imaging device 100 is operating, a voltage of a constant potential is applied to the control electrode 28e. Applying voltage to the control electrode 28e corresponding to the conductivity type of a region located below the control electrode 28e and/or corresponding to the conductivity type of the control electrode 28e when the imaging device 100 is operating enables charges of inverse polarity to the charges moving from the n-type impurity region 68bn toward the n-type impurity region 67n to be concentrated in a region 78 located below the control electrode 28e, which will be described later in detail. Accumulating charges of inverse polarity enables the charges moving from the n-type impurity region 68bn toward the n-type impurity region 67n to be eliminated by recombination at the region 78 located below the control electrode 28e. That is to say, contamination of the n-type impurity region 67n that accumulates signal charges by excess charges can be suppressed, and deterioration of the image due to leak current can be suppressed.

From this perspective, the control electrode 28e, the portion of the first insulating layer 71 located directly beneath the control electrode 28e, and the impurity regions 69pa and 69pb can collectively be referred to as a leak current blocking structure. Hereinafter, the structure including the control electrode 28e, the portion of the first insulating layer 71 located directly beneath the control electrode 28e, and the impurity regions 69pa and 69pb may be referred to as "blocking structure 28A" for the sake of simplicity and convenience. Details of the structure and operations of the blocking structure 28A will be described later. Although both impurity regions 69pa and 69pb are illustrated in the cross-section in FIG. 3 as being located between the n-type impurity region 67n and n-type impurity region 68bn, this is only for the sake of convenience for description. By placing at least one of the impurity regions 69pa and 69pb between the n-type impurity region 67n and n-type impurity region 68bn, effects of preventing contamination of the n-type impurity region 67n serving as the charge accumulation region by excess charges can be anticipated.

The address transistor 24 is further formed on the semiconductor substrate 60. The address transistor 24 includes the n-type impurity region 68cn, an n-type impurity region 68dn and a gate electrode 24e on the first insulating layer 71. The n-type impurity region 68cn functions as a drain region of the address transistor 24, and the n-type impurity region 68dn functions as a source region of the address transistor 24. The portion of the first insulating layer 71 that is located between the gate electrode 24e and the semiconductor substrate 60 functions as a gate insulating film of the address transistor 24. In this example, the n-type impurity region 68cn is shared between the address transistor 24 and the signal detecting transistor 22, so these transistors are electrically connected to each other. The vertical signal line 35 is connected to the n-type impurity region 68dn via a contact hole h4, as schematically illustrated in FIG. 3.

Blocking Structure

Figure 5:
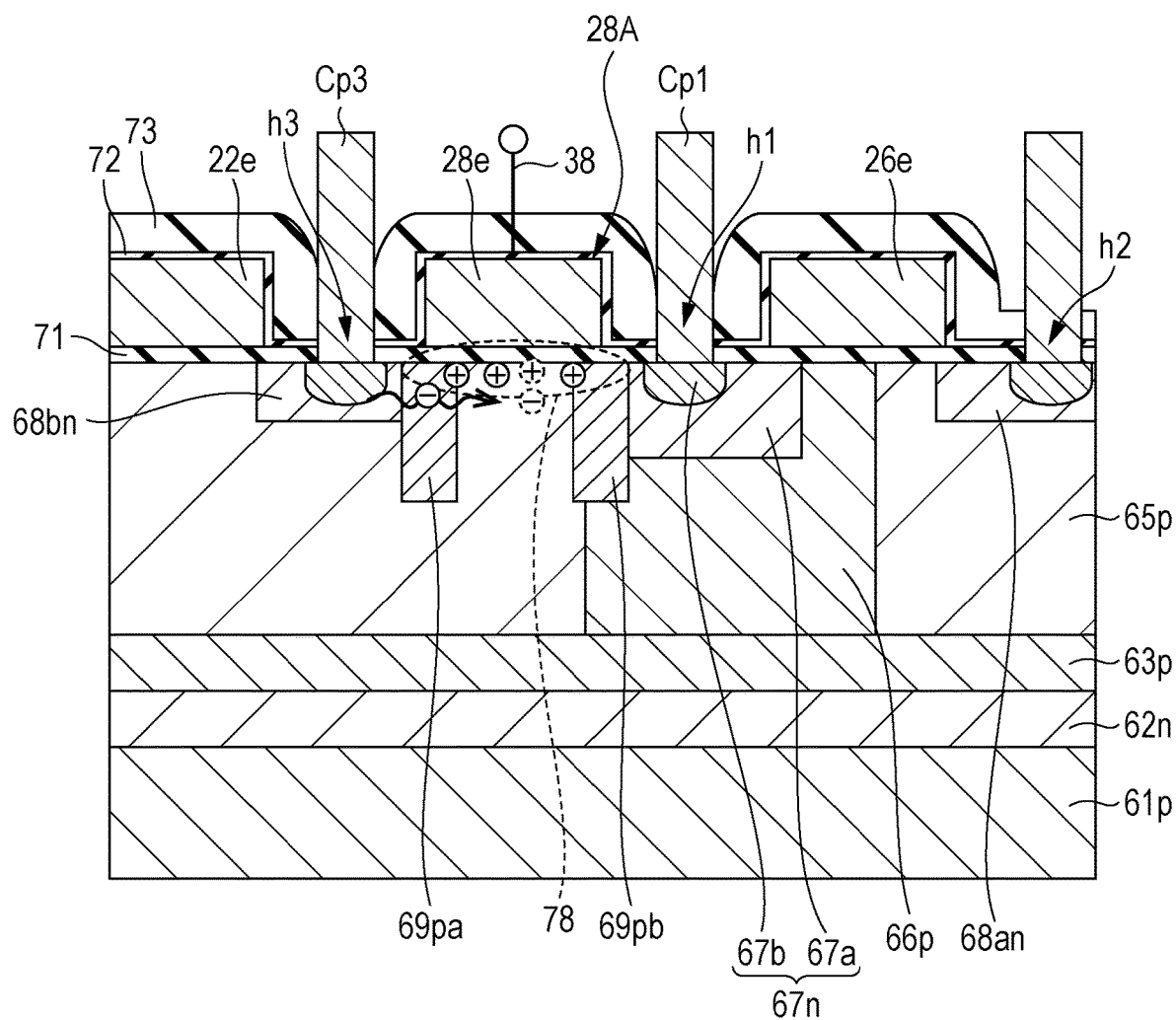
FIG. 5 is a schematic cross-sectional view illustrating a blocking structure and the surroundings thereof illustrated in FIG. 3 enlarged.

Now, an exemplary configuration of the blocking structure and the operations thereof will be described in detail. FIG. 5 illustrates the blocking structure 28A and the periphery thereof extracted from the illustration thereof in FIG. 3.

Of multiple wiring layers disposed within the inter-layer insulating layer 90, the wiring layer located closest to the semiconductor substrate 60 may be a polysilicon layer doped with an impurity. For example, the above-described contact plugs Cp1, Cp3, and Cp8 may be structures formed from a polysilicon film doped with an n-type impurity. In the same way, the above-described gate electrodes 22e and 24e, and the control electrode 28e may be electrodes formed from a polysilicon film doped with an n-type impurity.

For example, in a case of forming the control electrode 28e from polysilicon electrode doped with an n-type impurity, an accumulation state can be formed near the surface of the semiconductor substrate 60 directly below the control electrode 28e, by applying 0 V or a negative voltage to the control electrode 28e. For example, the control circuit 46 drives the voltage supply circuit 48 so as to supply a voltage of 0 V or a negative voltage with a constant potential to the voltage line 38, for the exposure period, i.e., for the entire charge accumulation period where charges generated by the photoelectric converter 12 are accumulated in the n-type impurity region 67n. Note that it is sufficient to be able to supply a predetermined voltage to the voltage line 38, and connecting a power source specialized for forming an accumulation state to the voltage line 38 is not indispensable. For example, the voltage supply circuit 48 may be omitted.

As described above, a relatively high voltage of around 3.3 V is applied to the n-type impurity region 68bn functioning as a drain region of the signal detecting transistor 22 when the imaging device 100 is operating. According to studies made by the present inventors, when electrons are generated at a p-n junction formed between a drain region where high voltage is applied and the perimeter thereof, part of the electrons can flow into the charge accumulation region due to diffusion through the interface state of the element isolation region and the interface state of the surface of the silicon substrate. This sort of leak current that occurs due to inflow of excess charges can become a cause of deterioration in the obtained image.

In comparison with this, the blocking structure 28A is disposed between the n-type impurity region 68bn serving as the drain region of the signal detecting transistor 22 and the n-type impurity region 67n serving as the charge accumulation region for storing signal charges here. Accordingly, even if electrons are generated that move by dispersion from the n-type impurity region 68bn toward the n-type impurity region 67n, such electrons can be eliminated at the region 78, by recombination with holes concentrated at the portion of the semiconductor substrate 60 directly beneath the control electrode 28e, as schematically illustrated in FIG. 5. That is to say, movement of minority carriers to the n-type impurity region 67n is blocked by the blocking structure 28A, and consequently, leak current due to contamination of the n-type impurity region 67n by the minority carriers is suppressed.

Thus, the blocking structure 28A is disposed between the n-type impurity region 68bn and the n-type impurity region 67n, and an appropriate voltage is applied to the control electrode 28e over the entire charge accumulation period. Accordingly, even if charges generated at the p-n junction of the n-type impurity region 68bn move toward the n-type impurity region 67n, such charges can be eliminated by recombination at or nearby the region 78.

Note that in the example described here, the region of the semiconductor substrate 60 directly beneath the control electrode 28e is part of the p-type semiconductor layer 65p, and the above-described region 78 includes p-type impurities. Before forming the control electrode 28e, a region having a relatively high concentration of impurity may be formed in the region of the p-type semiconductor layer 65p that will be located beneath the control electrode 28e, by diffusion of impurities or the like. In other words, the region 78 may be a region that has a relatively high concentration of impurity as compared to the surroundings. Forming an impurity region having a relatively high concentration of impurity in the p-type semiconductor layer 65p below the control electrode 28e enables an accumulation state to be formed with a negative voltage having a less absolute value. In other words, voltage closer to 0 V can be used as voltage to be applied to the control electrode 28e.

The control electrode 28e may be a polysilicon electrode doped with a p-type impurity. In this case, employing control where a voltage of 1 V or lower to the control electrode 28e over the entire charge accumulation period is applied enables an accumulation state to be formed in the region of the semiconductor substrate 60 located below the control electrode 28e and concentrate positive charges. That is to say, charges generated at the p-n junction of the n-type impurity region 68bn that move toward the n-type impurity region 67n can be eliminated by recombination, in the same way as the example illustrated in FIG. 5.

The voltage applied to the control electrode 28e can be appropriately decided taking into consideration the conductivity type of the region located below the control electrode 28e and/or the conductivity type of the control electrode 28e. In a case where the supporting substrate 61 is an n-type silicon substrate, and the control electrode 28e is a polysilicon electrode doped with an n-type impurity, it is sufficient to use a voltage of −1 V or higher as the voltage to be applied to the control electrode 28e. Accordingly, effects of suppressing leak current, the same as the above-described form, can be anticipated. In a case where the supporting substrate 61 is an n-type silicon substrate, and the control electrode 28e is a polysilicon electrode doped with a p-type impurity, it is sufficient to use a voltage of 0 V or above as voltage to be applied to the control electrode 28e.

First Modification

Figure 6:
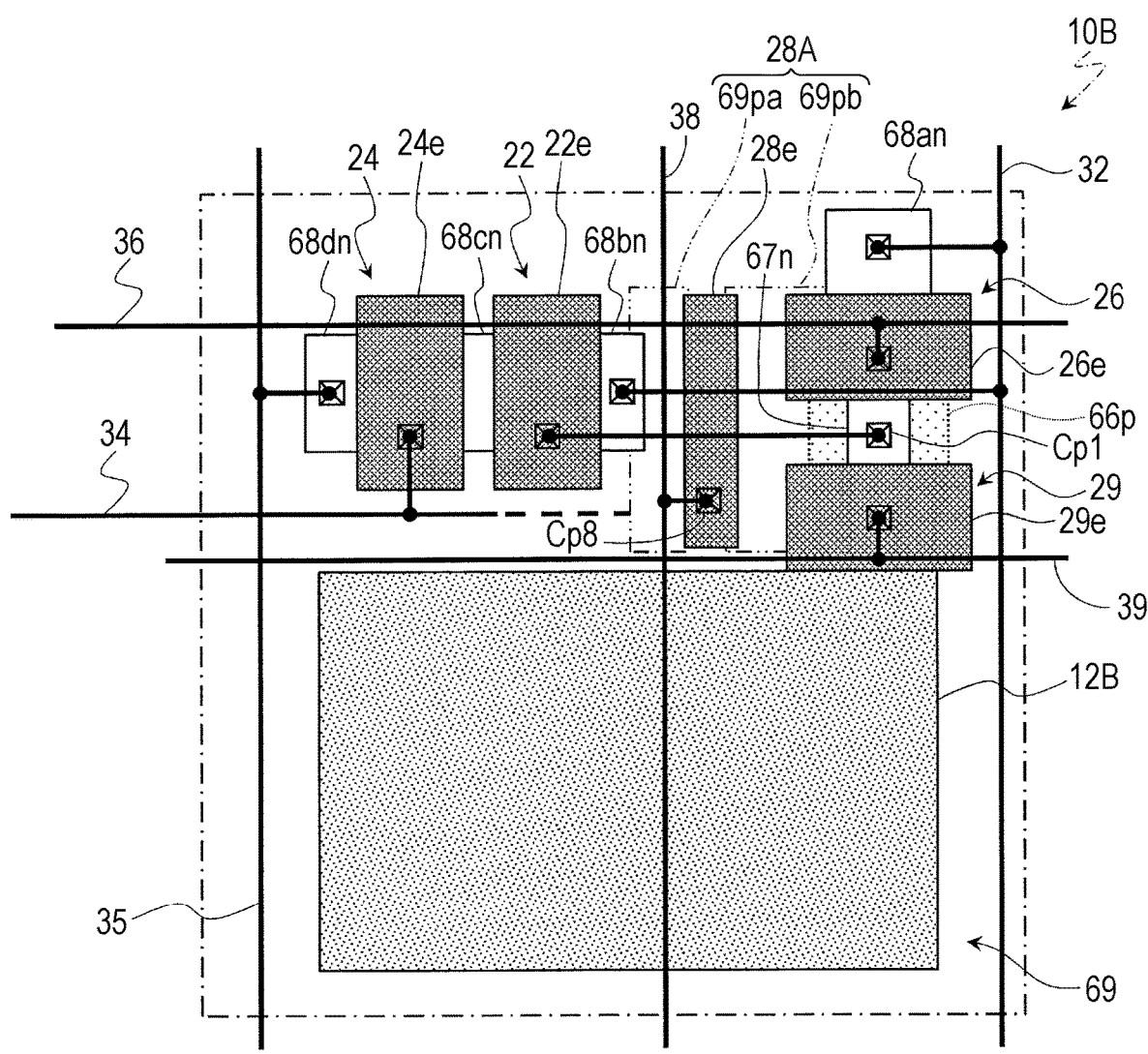
FIG. 6 is a schematic plan view illustrating a first modification of the imaging device according to the first embodiment of the present disclosure.
Figure 7:
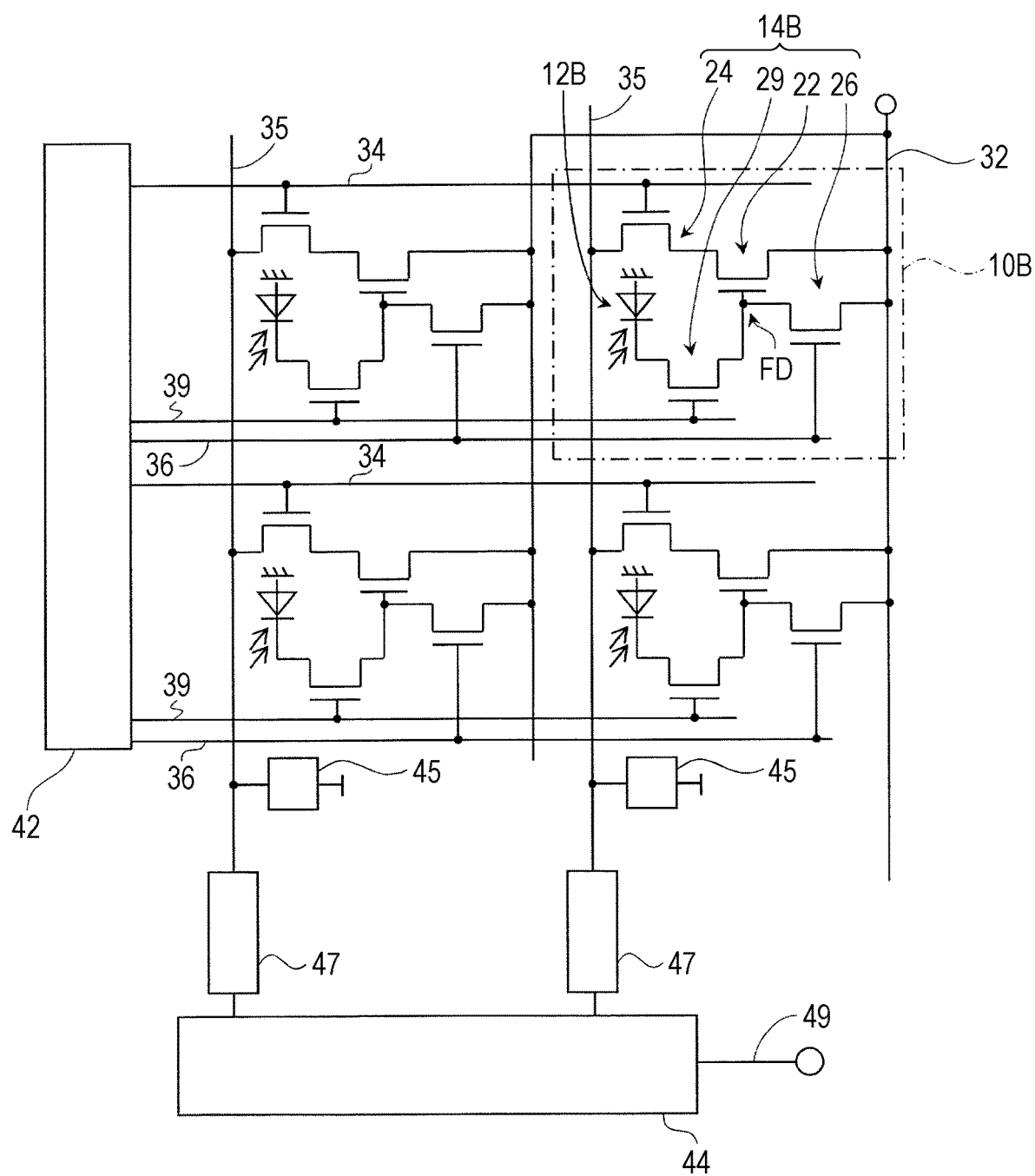
FIG. 7 is an exemplary circuit diagram of a second pixel of the imaging device according to the first modification.

FIGS. 6 and 7 illustrate an imaging device according to a first modification of the first embodiment of the present disclosure. FIG. 6 illustrates an example of the layout of elements in a pixel 10B that the imaging device according to the first embodiment has, and FIG. 7 illustrates an exemplary circuit configuration of the pixel 10B illustrated in FIG. 6.

The pixel 10B illustrated in FIGS. 6 and 7 has a photodiode 12B as the photoelectric converter 12 instead of the photoelectric conversion structure 12A, as compared with the pixel 10A described with reference to FIGS. 2 through 4. In this example, the accumulation control line 31 illustrated in FIG. 2 is omitted. The point of one of the drain and source of the reset transistor 26 being connected to the charge accumulation node FD is the same as the configuration illustrated in FIG. 2. Note, however, that the power source wiring 32 is connected to the other of the drain and source of the reset transistor 26 here.

The pixel 10B includes a signal detection circuit 14B connected to the photodiode 12B. The signal detection circuit 14B further includes a transfer transistor 29 connected between the gate of the signal detecting transistor 22 and the photodiode 12B, as compared with the signal detection circuit 14A of the pixel 10A. A transfer signal line 39 is connected to a gate electrode 29e of the transfer transistor 29. The transfer signal line 39 has connection with the vertical scanning circuit 42 for example, and the potential thereof is controlled by the vertical scanning circuit 42. The vertical scanning circuit 42 can control the timing of transferring signal charges generated at the photodiode 12B to the charge accumulation node FD, by on and off control of the transfer transistor 29.

In this example, the charge accumulation node FD is a node where the gate electrode 22e of the signal detecting transistor 22 connects to the photodiode 12B. The charge accumulation node FD includes as part thereof the n-type impurity region 67n formed on the semiconductor substrate 60A, in the same way as the examples described above. In the configuration exemplified in FIG. 6, the p-type impurity region 66p with a relatively low concentration of impurity is located between the gate electrode 26e and gate electrode 29e in plan view. The n-type impurity region 67n is located in the p-type impurity region 66p.

The blocking structure 28A that urges recombination of charges is disposed between the n-type impurity region 67n and the n-type impurity region 68bn in the example illustrated in FIG. 6 as well. Accordingly, the unwanted minority carriers moving toward the n-type impurity region 67n can be suppressed from contaminating the n-type impurity region 67n, in the same way as with the examples described with reference to FIGS. 1 through 5.

Second Modification

Figure 8:
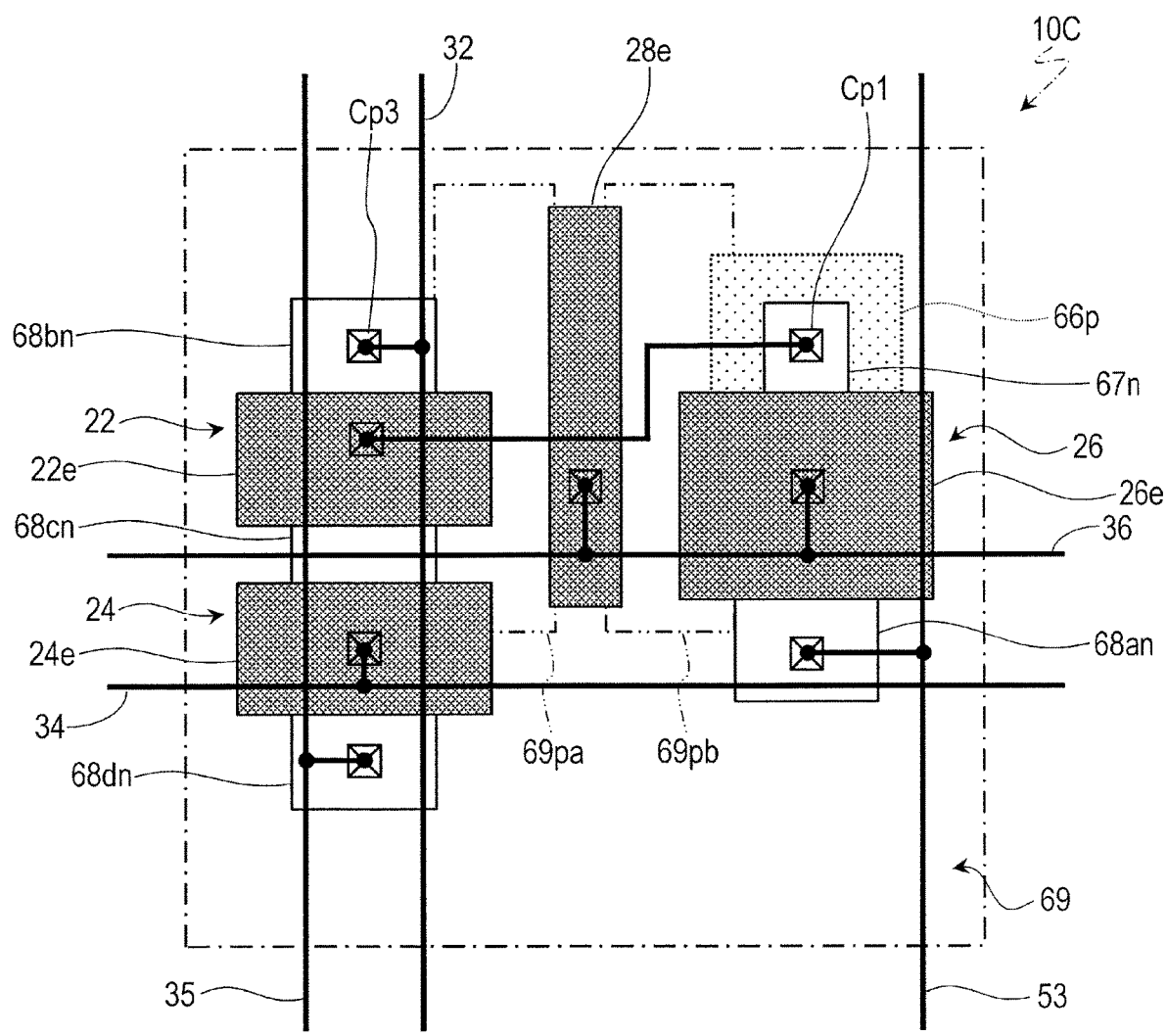
FIG. 8 is a schematic plan view illustrating a second modification of the imaging device according to the first embodiment of the present disclosure.

FIG. 8 illustrates a second modification of the imaging device according to the first embodiment of the present disclosure. FIG. 8 illustrates an example of layout of elements in a pixel 10C that the imaging device according to the second modification has.

The primary point of difference between the pixel 10C illustrated in FIG. 8 and the pixel 10A illustrated in FIG. 4 is that the pixel 10C has the reset signal line 36 connected to the control electrode 28e instead of the voltage line 38. That is to say, in this example, the control electrode 28e is equipotential with the gate electrode 26e of the reset transistor 26.

In this example, the vertical scanning circuit 42 also has the functions of the above-described voltage supply circuit 48. Connecting the reset signal line 36 to the control electrode 28e enables the voltage line 38 and the voltage supply circuit 48 to be omitted, as exemplified in FIG. 8. Accordingly, effects of suppressing leak current can be obtained with a simpler circuit. Although a predetermined voltage is applied to the control electrode 28e for the entire exposure period in the embodiment according to the present disclosure, applying voltage equal to or less than the threshold voltage of the reset transistor 26 as voltage to be applied to the control electrode 28e enables an inverted state to be formed directly beneath the control electrode 28e while leaving the reset transistor 26 off. For example, in a case where the control electrode 28e is formed as a polysilicon electrode doped with an n-type impurity, it is sufficient to apply a voltage of 0 V or lower to the control electrode 28e.

Third Modification

Figure 9:
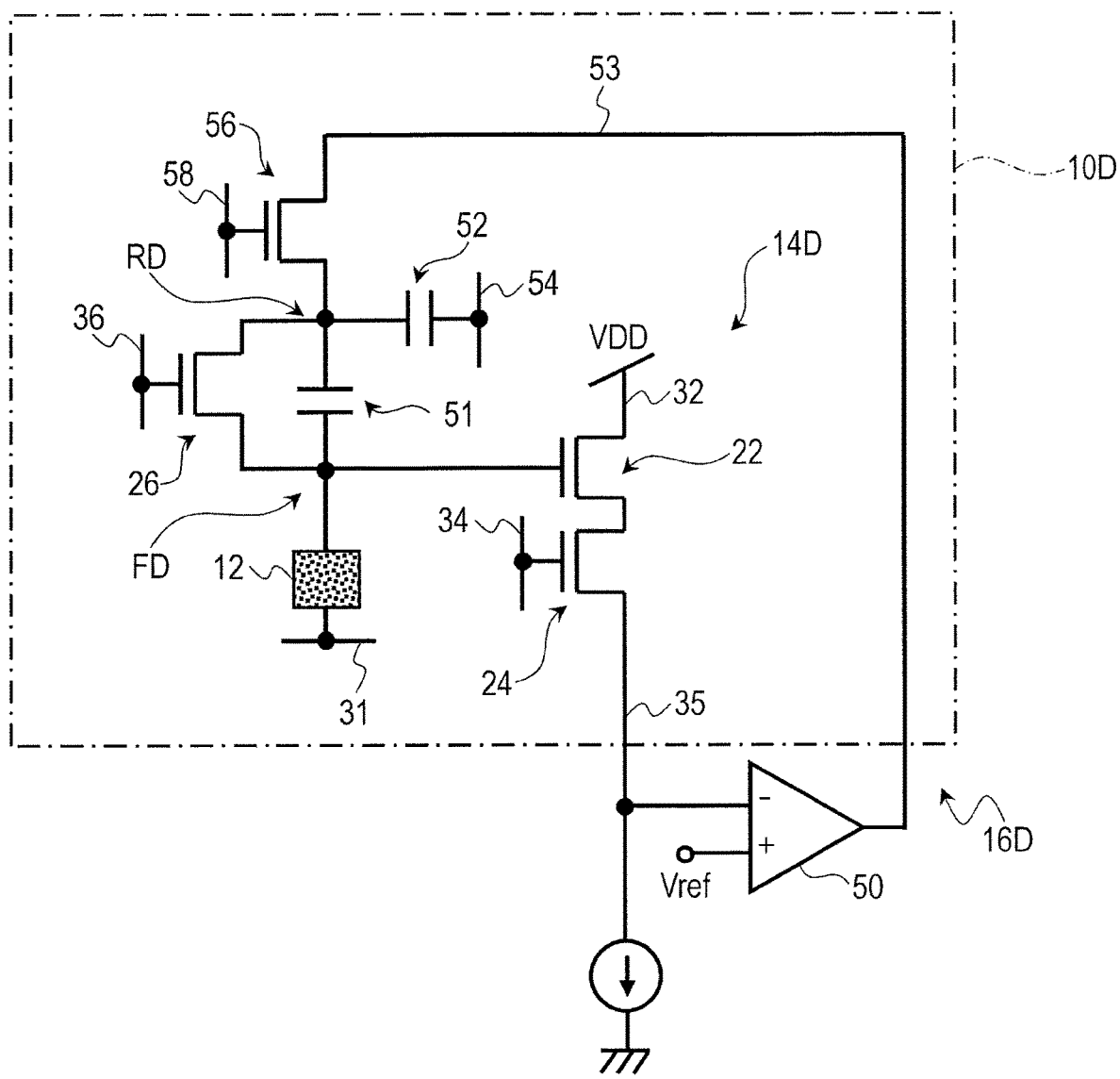
FIG. 9 is a schematic diagram illustrating the circuit configuration of the second modification of the imaging device according to the first embodiment of the present disclosure.

FIG. 9 illustrates a third modification of the imaging device according to the first embodiment. FIG. 9 illustrates an exemplary circuit configuration of a pixel 10D that has been representatively selected from pixels 10D according to the third modification of the imaging device. A signal detection circuit 14D of the pixel 10D illustrated in FIG. 9 further includes, in addition to the signal detecting transistor 22, address transistor 24, and reset transistor 26, a bandwidth control transistor 56, a first capacitive element 51, and a second capacitive element 52, in comparison with the signal detection circuit 14A illustrated in FIG. 2.

The bandwidth control transistor 56 is connected between the reset transistor 26 and feedback line 53, and the gate thereof is connected to a feedback control line 58. The feedback control line 58 is connected to the vertical scanning circuit 42, for example, with the gate voltage of the bandwidth control transistor 56 being controlled by the vertical scanning circuit 42 when the imaging device is operating.

The first capacitive element 51 has a relatively small capacitance value, and is connected to the reset transistor 26 in parallel. The second capacitive element 52 has a larger capacitance value than the first capacitive element 51, with one electrode being connected to a node RD between the reset transistor 26 and bandwidth control transistor 56. The other electrode of the second capacitive element 52 is connected to a sensitivity adjustment line 54. The sensitivity adjustment line 54 is connected to the vertical scanning circuit 42, for example, and the potential thereof is set to 0 V, for example, when the imaging device 100 is operating.

A feedback path that includes the signal detecting transistor 22 and the bandwidth control transistor 56 in the path can be formed by turning the bandwidth control transistor 56 on. That is to say, the feedback path formed by the feedback circuit 16D illustrated in FIG. 9 includes the bandwidth control transistor 56 in addition to the inverting amplifier 50. The second capacitive element 52 and bandwidth control transistor 56 may function as a resistor-capacitor (RC) filter circuit.

Formation of the feedback loop where part or all of the output signals of the signal detecting transistor 22 are fed back electrically enables the effects of kTC noise that occurs when the reset transistor 26 and bandwidth control transistor 56 turn off to be reduced. Details of such noise cancellation using feedback are described in Japanese Unexamined Patent Application Publication No. 2017-046333. The reset transistor 26 can also be made to function as a gain switching transistor in the circuit configuration exemplified in FIG. 9. Details of such mode switching are also described in Japanese Unexamined Patent Application Publication No. 2017-046333. Japanese Unexamined Patent Application Publication No. 2017-046333 is incorporated herein by reference in its entirety, for reference.

The circuit configuration such as illustrated in FIG. 9, where the bandwidth control transistor 56 is connected between the reset transistor 26 and the feedback line 53, is advantageous from the perspective of noise reduction, since contamination by excess charges at the node RD from the drain region of the signal detecting transistor 22, for example, can be suppressed, and leak current at the node RD can be suppressed. Applying a connection structure the same as that of the charge accumulation node FD to the node RD enables leak current to be suppressed at the node RD, which will be described below.

Device Configuration of Pixel 10D

Figure 10:
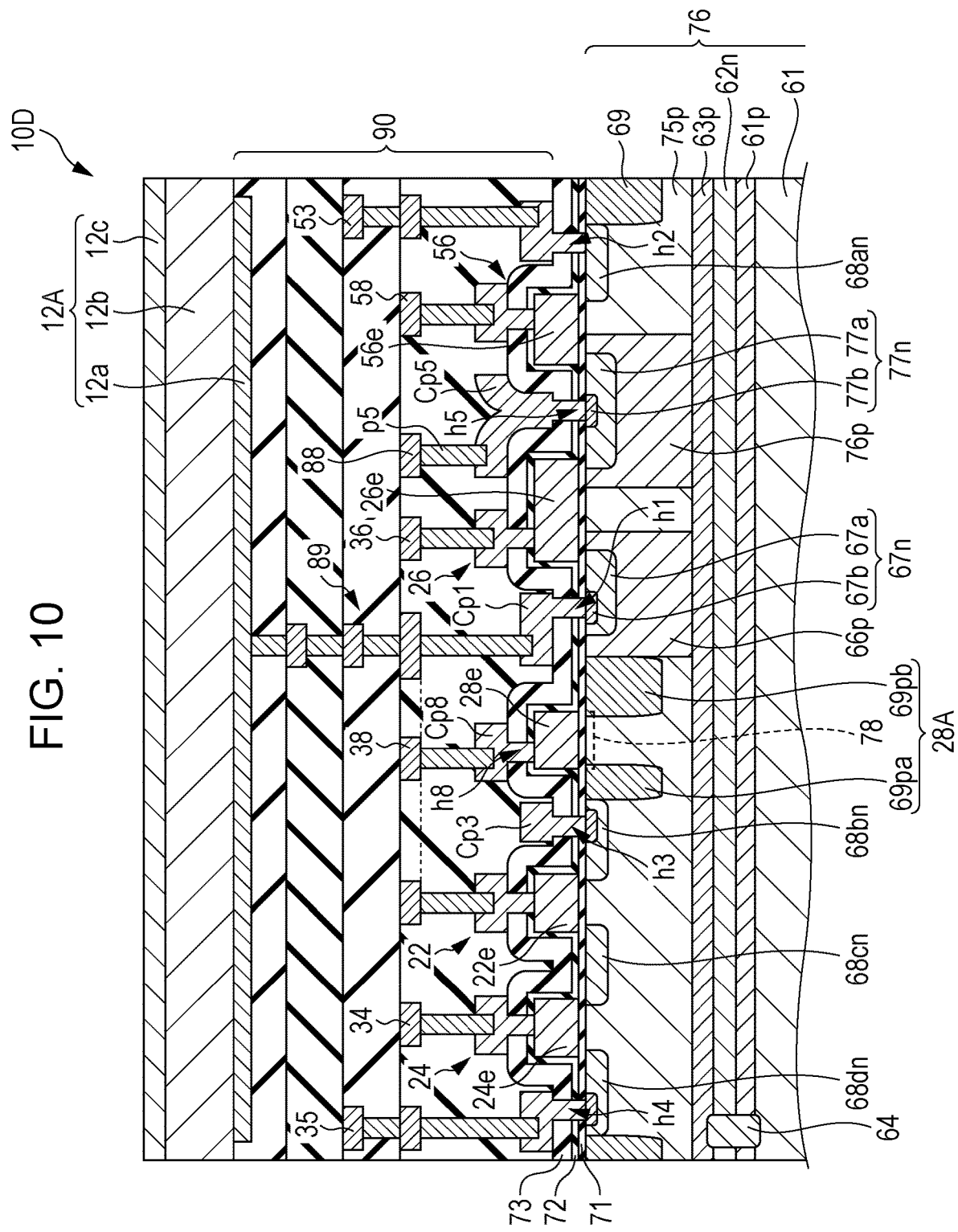
FIG. 10 is a cross-sectional view schematically illustrating an example of the device structure of a fourth pixel illustrated in FIG. 9.
Figure 11:
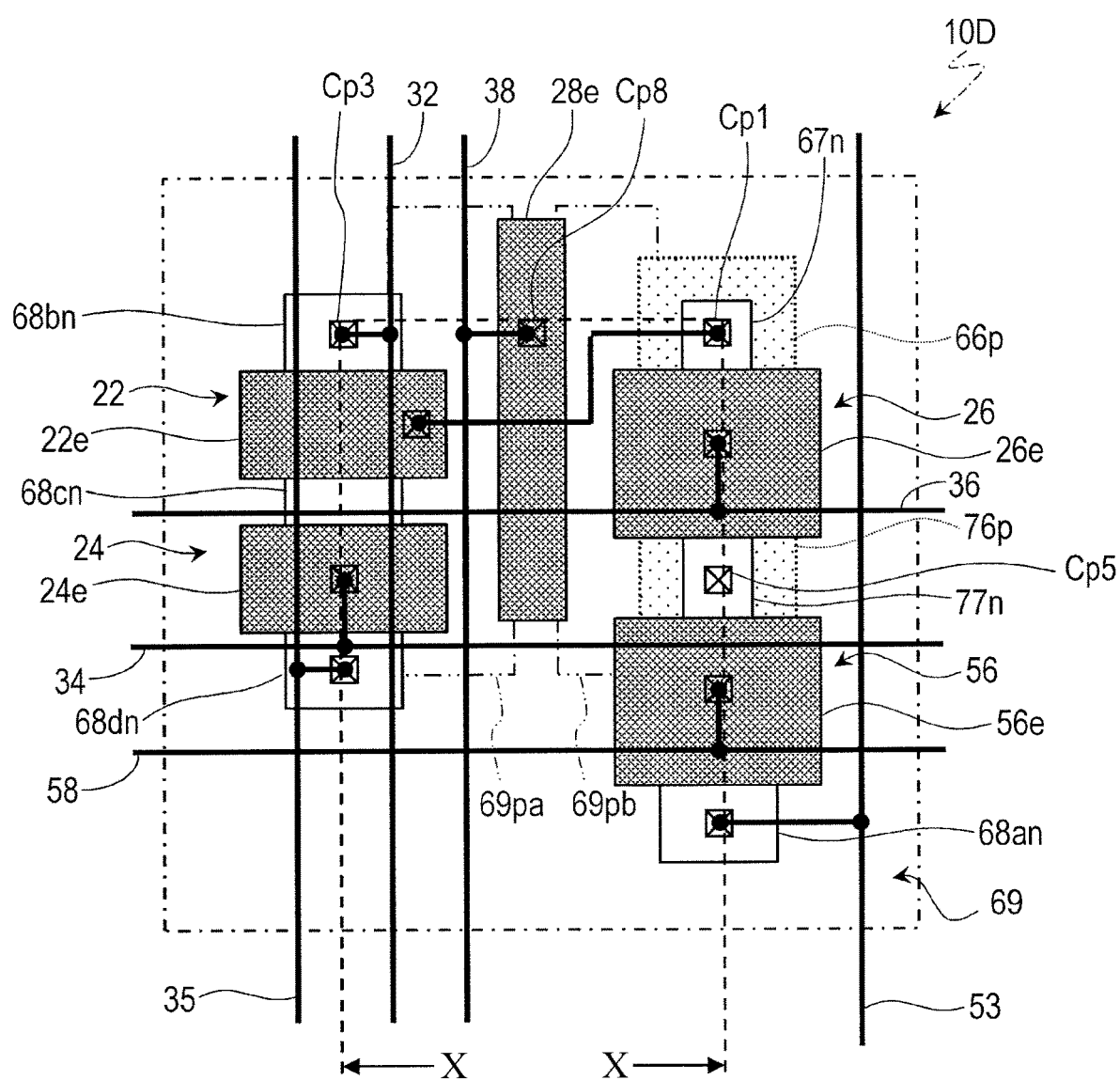
FIG. 11 is a schematic plan view illustrating an example of the layout of elements in the fourth pixel.

FIG. 10 schematically illustrates an example of the device structure of the pixel 10D illustrated in FIG. 9. FIG. 11 illustrates an example of layout of the elements in the pixel 10D. Taking a cross-section of the pixel 10D along lines X-X in FIG. 11 and unfolding yields the cross-section illustrated in FIG. 10. Although the voltage line 38 is illustrated as being in the same layer as the address signal line 34 and reset signal line 36 in this example as well, like in the example described with reference to FIG. 3, the voltage line 38 has no electrical connection with any of the address signal line 34, reset signal line 36, and conductive structure 89.

In the configuration exemplified in FIG. 10, the pixel 10D includes a semiconductor substrate 76 that supports the photoelectric conversion structure 12A. The semiconductor substrate 76 includes a p-type semiconductor layer 75p formed on the p-type semiconductor layer 63ps. The p-type semiconductor layer 75p has the p-type impurity region 66p and a p-type impurity region 76p. The concentration of impurity of the p-type impurity region 76p may be around the same as that of the p-type impurity region 66p. An n-type impurity region 77n is formed on the p-type impurity region 76p. The n-type impurity region 77n functions as the drain region or source region of the reset transistor 26.

The n-type impurity region 77n includes a first region 77a, and a second region 77b placed within the first region 77a, in the same way as the n-type impurity region 67n. The first region 77a has a concentration of impurity that is around the same or greater than the first region 67a of the n-type impurity region 67n. This is because the tolerance value of leak current can be set greater for the node RD as compared to the charge accumulation node FD. Parasitic resistance at the source side of the reset transistor 26, for example, can be reduced by making the concentration of impurity of the first region 77a to be higher than the concentration of impurity of the first region 67a, and the current driving performance of the reset transistor 26 can be improved.

In this example, the first insulating layer 71 has a contact hole h5 provided in a region on the n-type impurity region 77n. A contact plug Cp5 is connected to the n-type impurity region 77n via this contact hole h5. The contact plug Cp5 is connected to the second region 77b of the n-type impurity region 77n in this example. Now, the second region 77b has a higher concentration of impurity than the first region 77a. Although formation of the second region 77b having a high concentration of impurity within the n-type impurity region 77n is not indispensable, forming the second region 77b within the n-type impurity region 77n yields the effects of reduced contact resistance.

The contact plug Cp5 is on the same layer as other contact plugs such as the contact plug Cp1, and typically is formed by patterning of a polysilicon film. The contact plug Cp5 is connected to wiring 88 via a metal plug p5 disposed within the inter-layer insulating layer 90 and so forth. The wiring 88 is wiring connected to, out of the electrodes that the second capacitive element 52 has, the electrode at the side not connected to the sensitivity adjustment line 54. The first capacitive element 51 and second capacitive element 52 omitted from illustration in FIG. 10 may be formed in the pixel 10D in the form of a metal-insulator-semiconductor (MIS) structure, or may be formed in the form of a metal-insulator-meta (MIM) structure. Using the MIM structure enables a larger capacitance value to be obtained.

The upper face of the contact plug Cp5 does not have a metal silicide layer. Accordingly, the metal plug p5 is directly connected to the upper face of the contact plug Cp5 in this example. Directly connecting the metal plug p5 to the contact plug Cp5 without going through a metal silicide layer enables dispersion of metal into the n-type impurity region 77n via the contact plug Cp5, particularly dispersion of nickel, to be prevented. In other words, contamination of the node RD by excess changes can be suppressed, and noise at the pixel 10D can be further suppressed.

In the example exemplified in FIG. 10, the bandwidth control transistor 56 shares the n-type impurity region 77n with the reset transistor 26. That is to say, the n-type impurity region 77n also functions as one of the source region and drain region of the bandwidth control transistor 56. The n-type impurity region 68an here is formed in the p-type semiconductor layer 75p, and functions as the other of the source region and drain region of the bandwidth control transistor 56.

The bandwidth control transistor 56 further has a gate electrode 56e located on the first insulating layer 71. The gate electrode 56e typically is a polysilicon electrode, and is located in the same layer as the gate electrode 22e of the signal detecting transistor 22, the gate electrode 24e of the address transistor 24, and the gate electrode 26e of the reset transistor 26.

The pixel 10D also has the blocking structure 28A including the impurity regions 69pa and 69pb located between the n-type impurity region 68bn and n-type impurity region 67n, in the same way as the example illustrated in FIGS. 3 and 4. Applying a predetermined voltage of 0 V or lower, for example, to the control electrode 28e forms an accumulation state near the surface of the region of the semiconductor substrate 60 directly beneath the control electrode 28e, whereby excess charges dispersing form the n-type impurity region 68bn toward the n-type impurity region 67n functioning as part of the charge accumulation region can be blocked by the blocking structure 28A. That is to say, occurrence of leak current can be suppressed.

In the configuration exemplified in FIG. 11, the reset transistor 26 and bandwidth control transistor 56 are arrayed on a straight line in the vertical direction of the plane of the drawing. Accordingly, the second region 77b that is the connecting portion of the contact plug Cp5 and the semiconductor substrate 76 is located between the gate electrode 26e of the reset transistor 26 and the gate electrode 56e of the bandwidth control transistor 56. It can be seen from FIG. 11 that the control electrode 28e and the impurity regions 69pa and 69pb may exist in the pixel 10D in a form of extending to the side of the n-type impurity region 77n in the vertical direction of the drawing. That is to say, in this example, the blocking structure 28A includes a portion located between the n-type impurity region 77n and the n-type impurity region 68bn that functions as the drain region of the signal detecting transistor 22. According to this configuration, minority carriers generated at the n-type impurity region 68bn and moving toward the n-type impurity region 77n can also be blocked by the blocking structure 28A. That is to say, occurrence of leak current at the node RD can be suppressed.

Fourth Modification

Figure 12:
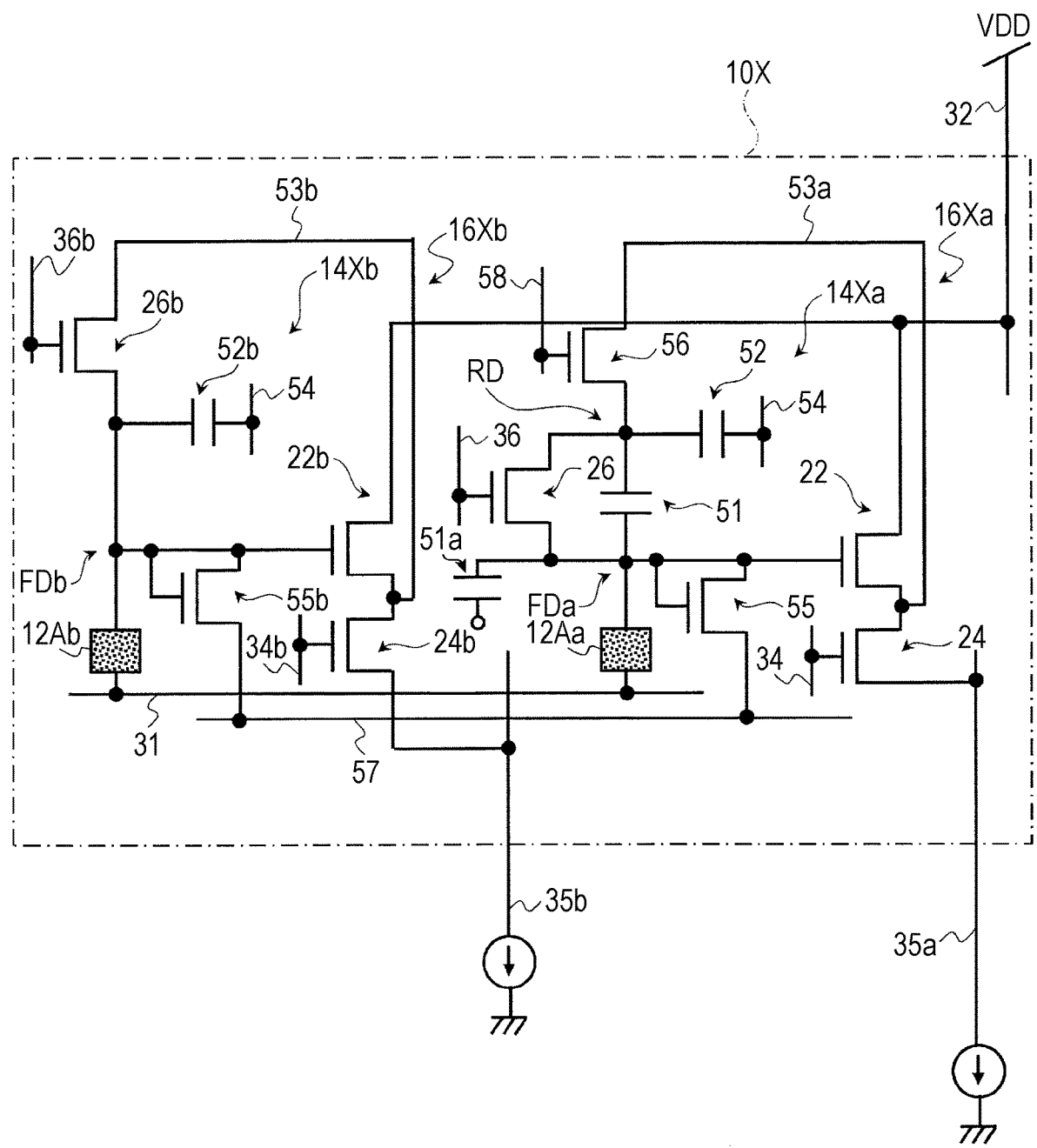
FIG. 12 is a schematic diagram illustrating the circuit configuration of a fourth modification of the imaging device according to the first embodiment of the present disclosure.

FIG. 12 illustrates a fourth modification of the imaging device according to the first embodiment of the present disclosure. A pixel 10X illustrated in FIG. 12 has a photoelectric conversion structure 12Aa and a photoelectric conversion structure 12Ab.

As illustrated in FIG. 12, a signal detection circuit 14Xa is connected to the photoelectric conversion structure 12Aa, and a signal detection circuit 14Xb is connected to the photoelectric conversion structure 12Ab. The photoelectric conversion structure 12Aa and photoelectric conversion structure 12Ab have the opposing electrode and photoelectric conversion layer 12b in common, for example, but on the other hand, have pixel electrodes that are electrically independent of each other. The pixel electrode of the photoelectric conversion structure 12Aa is electrically connected to a charge accumulation node FDa, and the signal detection circuit 14Xa reads out to a vertical signal line 35a signals corresponding to signal charges generated by the photoelectric conversion structure 12Aa and stored in the charge accumulation node FDa. On the other hand, the pixel electrode of the photoelectric conversion structure 12Ab is electrically connected to a charge accumulation node FDb, and the signal detection circuit 14Xb reads out to a vertical signal line 35b signals corresponding to signal charges generated by the photoelectric conversion structure 12Ab and stored in the charge accumulation node FDb. That is to say, the pixel 10X is configured to be capable of independently reading out two types of signals, in accordance with which of the signal detection circuit 14Xa and signal detection circuit 14Xb is used to execute readout of signals.

In the example illustrated in FIG. 12, the signal detection circuit 14Xa has a circuit configuration similar to that of the signal detection circuit 14D of the pixel 10D illustrated in FIG. 9, and includes the signal detecting transistor 22, address transistor 24, reset transistor 26, bandwidth control transistor 56, first capacitive element 51, and second capacitive element 52. In this example, the signal detection circuit 14Xa further includes a third capacitive element 51a of which one electrode is connected to the charge accumulation node FDa. The third capacitive element 51a may have a capacitance value around the same as that of the first capacitive element 51.

The signal detection circuit 14Xa also has a feedback circuit 16Xa for feedback of part or all of the output signals of the signal detecting transistor 22. Note, however, that a feedback line 53a connected to one of the source and drain of the bandwidth control transistor 56 is connected to the source of the signal detecting transistor 22. That is to say, in the feedback circuit 16Xa, the output of the signal detecting transistor 22 itself is used as the reference voltage for resetting.

This circuit configuration also enables a feedback loop to be formed where part or all of the output signals of the signal detecting transistor 22 are fed back electrically, and the effects of kTC noise that occurs when the reset transistor 26 and bandwidth control transistor 56 turn off can be reduced. Moreover, the inverting amplifier 50 has been omitted in comparison with the example in FIG. 9, so noise cancellation using feedback can be implemented in increments of pixels 10X. Details of noise cancellation using feedback in increments of pixels are described in Japanese Unexamined Patent Application Publication No. 2016-127593, for example. Japanese Unexamined Patent Application Publication No. 2016-127593 is incorporated herein by reference in its entirety, for reference.

The signal detection circuit 14Xa further has a protection transistor 55 in this example. The drain or source of the protection transistor 55, and the gate, are connected to the charge accumulation node FDa between the gate of the signal detecting transistor 22 and the photoelectric conversion structure 12Aa. The one of the drain and source of the protection transistor 55 that is not connected to the photoelectric conversion structure 12Aa is connected to a power line 57 that receives supply of a predetermined power source when the imaging device 100 is operating, by being connected to a power source that is omitted from illustration.

On the other hand, looking at the signal detection circuit 14Xb having electrical connection with the photoelectric conversion structure 12Ab, the signal detection circuit 14Xb includes a second signal detecting transistor 22b having a gate connected to the photoelectric conversion structure 12Ab, an address transistor 24b connected between the signal detecting transistor 22b and the vertical signal line 35b, a reset transistor 26b connected between the photoelectric conversion structure 12Ab and a feedback line 53b, and a second protection transistor 55b. The gate of the reset transistor 26b is connected to the reset signal line 36b, and the vertical scanning circuit 42, for example, controls on and off of the reset transistor 26b by control of the potential at the reset signal line 36b. The drain or source of the protection transistor 55b and the gate thereof are connected to a charge accumulation node FDb between the gate of the signal detecting transistor 22b and photoelectric conversion structure 12Ab, and the one of the drain and source of the protection transistor 55b that is not connected to the photoelectric conversion structure 12Ab is connected to the power line 57, in the same way as the above-described protection transistor 55.

An address signal line 34b is connected to the gate of the address transistor 24b of the signal detection circuit 14Xb. The address signal line 34b is connected to the vertical scanning circuit 42 for example, and the vertical scanning circuit 42 controls on and off of the address transistor 24b by control of the potential at the address signal line 34b. That is to say, according to the circuit exemplified in FIG. 12, one of the signal detection circuits 14Xa and 14Xb can be selected and signals corresponding to the amount of charge accumulated in the charge accumulation node FDa or signals corresponding to the amount of charge accumulated in the charge accumulation node FDb can be selectively read out.

The signal detection circuit 14Xb includes a feedback circuit 16Xb. Accordingly, due to formation of a feedback loop where part or all of the output signals of the signal detecting transistor 22b are fed back electrically, the effects of kTC noise that occurs when the reset transistor 26b goes off can be reduced, in the same way as with the signal detection circuit 14Xa.

Figure 13:
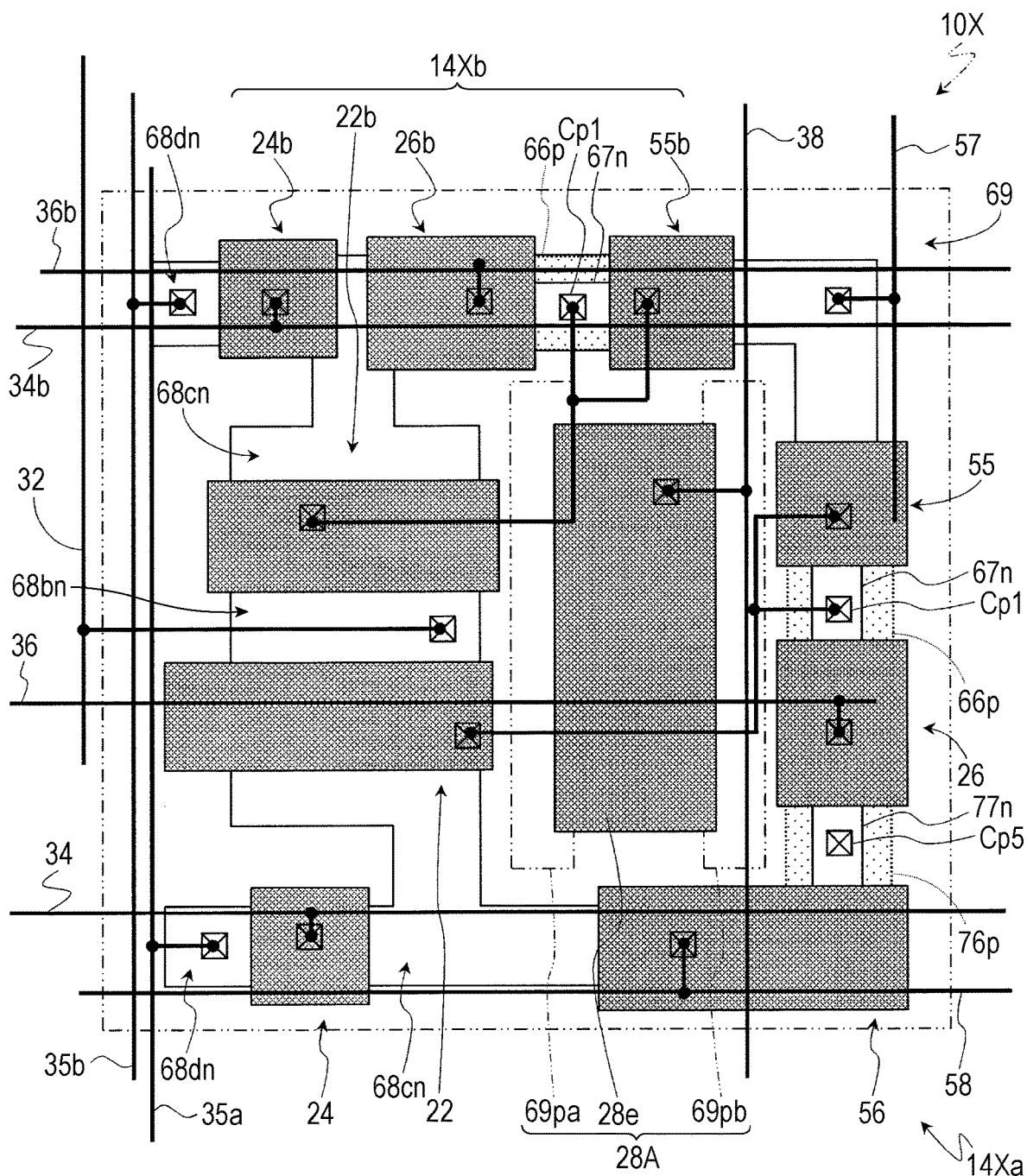
FIG. 13 is a schematic plan view illustrating an example of the layout of elements in a fifth pixel illustrated in FIG. 12.

The signal detection circuit 14Xb has, as a part thereof, a capacitive element 52b having a relatively large capacitance value by being provided within the pixel 10X in a MIM structure, for example. As illustrated in FIG. 13, one electrode of the capacitive element 52b is connected to the charge accumulation node FDb, and the other electrode is connected to the sensitivity adjustment line 54. The capacitive element 52b connected to the charge accumulation node FDb has functions of increasing the capacitance value of the overall charge accumulation region that accumulates signal charges.

According to the circuit exemplified in FIG. 12, signals in accordance with the amount of charge accumulated in the charge accumulation node FDa and signals in accordance with the amount of charge accumulated in the charge accumulation node FDb can be selectively read out, as described above. The capacitive element 52b that has a relatively large capacitance value is connected to the charge accumulation node FDb in the signal detection circuit 14Xb, and accordingly, more signal charges can be stored, which is advantageous in shooting in a high-luminance environment, for example. On the other hand, the signal detection circuit 14Xa includes, as a part thereof, the first capacitive element 51 connected in parallel to the reset transistor 26, and can execute noise cancellation more effectively while suppressing increase in the capacitance value of the overall charge accumulation region. Accordingly, this is particularly advantageous in shooting with high sensitivity. Thus, an arrangement may be made where two signal detection circuits are provided within one pixel, and readout of signals may be executed via the signal detection circuit of these that is more suitable for the shooting scene. The term "pixel" in the present specification indicates, for example, a unit configuring a repetitive structure in the imaging region R1, and is not restricted to a structure including a single signal detection circuit but rather may include two or more signal detection circuits.

Figure 14:
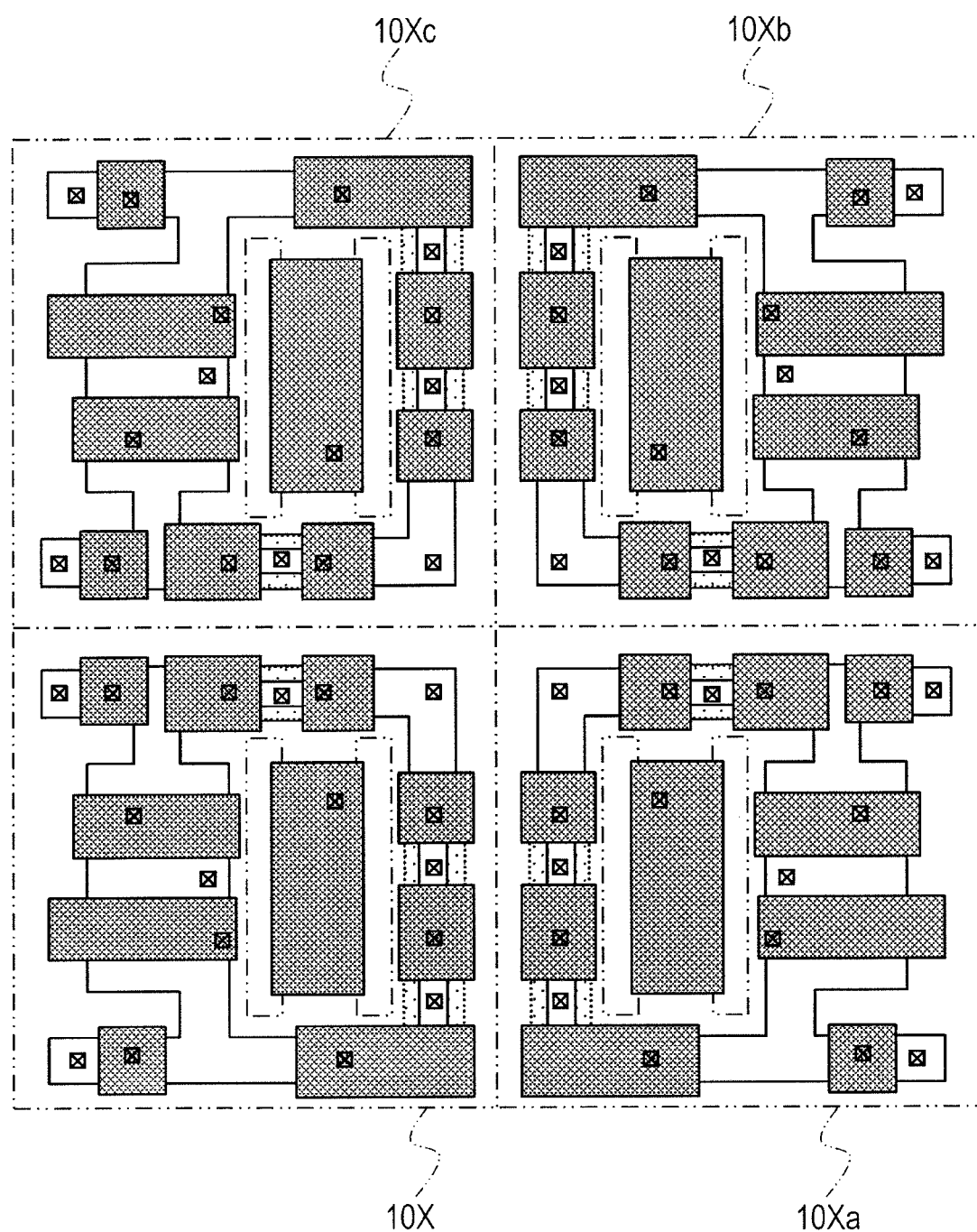
FIG. 14 is a schematic plan view illustrating an example of a two-dimensional layout of fifth pixels illustrated in FIG. 12.

FIG. 13 illustrates an example of the layout of the elements in the pixel 10X illustrated in FIG. 12, and FIG. 14 illustrates an example of a two-dimensional array of the pixel 10X illustrated in FIG. 12. Of the four pixels illustrated in FIG. 14, a pixel 10Xa located to the lower right has a structure of a mirror image of the pixel 10X on a virtual axis passing through the center of the pixel 10X and extending parallel to the column direction of the multiple pixels. Of the four pixels illustrated in FIG. 14, a pixel 10Xb located to the upper right and a pixel 10Xc located to the upper left have a structure of a mirror image of the pixel 10X and pixel 10Xa on a virtual axis passing through the center of the pixel 10X and extending parallel to the row direction of the multiple pixels. In the fourth modification, the imaging region R1 can be formed from a repetition where a group of these four pixels 10X and 10Xa through 10Xc are an increment.

In the example illustrated in FIG. 13, the blocking structure 28A is disposed at the general middle of the pixel 10X, and the signal detection circuits 14Xa and 14Xb are disposed in the pixel 10X surrounding the blocking structure 28A. The impurity region 69pa and impurity region 69pb of the blocking structure 28A is located between the n-type impurity region 68bn and the n-type impurity region 67n serving as the signal detection circuit 14Xa side charge accumulation region in this example. Accordingly, inflow of excess charges from the n-type impurity region 68bn to the n-type impurity region 67n of the signal detection circuit 14Xa side can be suppressed by the blocking structure 28A. Placing the blocking structure 28A so as to be interposed between the n-type impurity region 67n of the signal detection circuit 14Xa at the high-sensitivity side where demand for noise suppression is relatively strict, and the n-type impurity region 68bn, enables deterioration in image quality due to leak current to be effectively suppressed. While the feedback lines 53a and 53b are illustrated in the form of lines in FIG. 12, the structure to electrically connect the source of the signal detecting transistor 22 to the bandwidth control transistor 56 and the structure to electrically connect the source of the signal detecting transistor 22b to the reset transistor 26b are not restricted to the form of lines.

Second Embodiment

Figure 15:
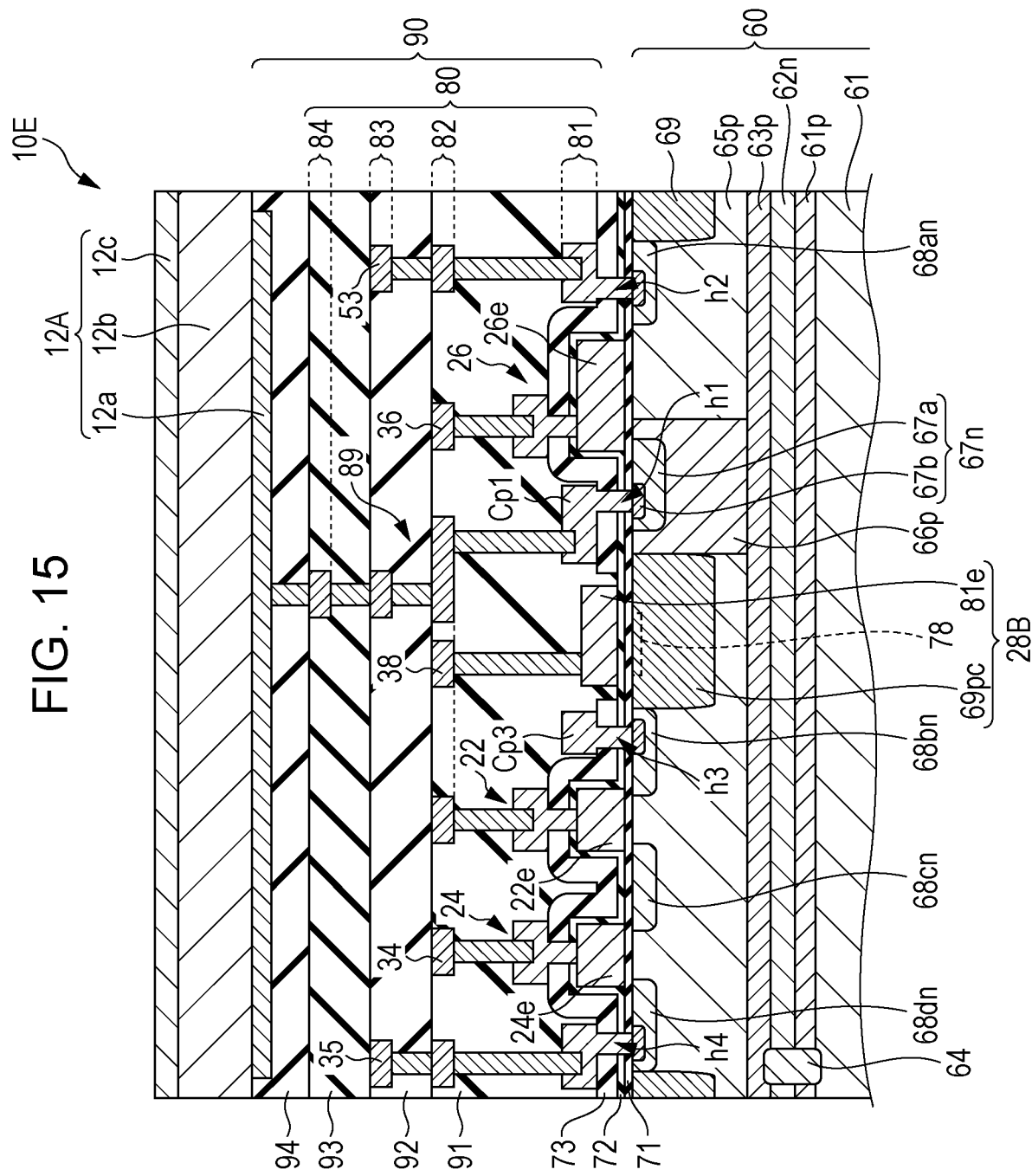
FIG. 15 is a cross-sectional view schematically illustrating an exemplary device structure of a pixel that the imaging device according to a second embodiment of the present disclosure has.
Figure 16:
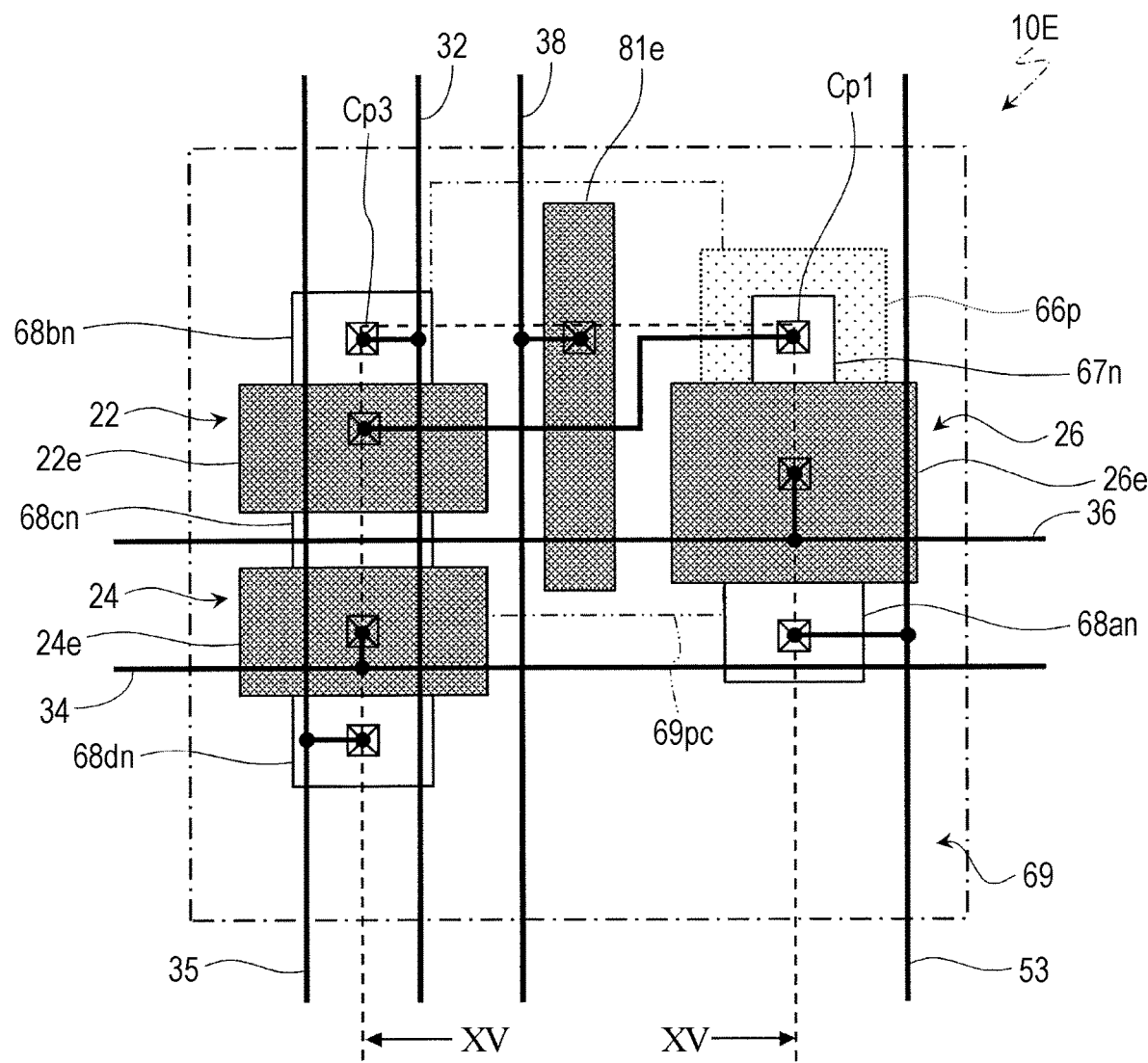
FIG. 16 is a schematic plan view illustrating an example of the layout of elements in a sixth pixel illustrated in FIG. 15.

FIG. 15 schematically illustrates an exemplary device structure of the pixel 10E that an imaging device according to a second embodiment of the present disclosure has. FIG. 16 illustrates an example of layout of the elements in the pixel 10E illustrated in FIG. 15. Taking a cross-section of the pixel 10D along lines XV-XV in FIG. 16 and unfolding yields the cross-section illustrated in FIG. 15. As in the example illustrated in FIGS. 3 and 10, the voltage line 38 has no electrical connection with any of the address signal line 34, reset signal line 36, and conductive structure 89. The pixel 10E has a blocking structure 28B instead of the blocking structure 28A, in comparison with the first embodiment.

The blocking structure 28B includes a control electrode 81e, a portion of the first insulating layer 71 and second insulating layer 72 that is located directly beneath the control electrode 81e, and an impurity region 69pc. The impurity region 69pc is part of the pixel isolation region 69 in the same way as the above-described impurity regions 69pa and 69pb, and typically is a p-type diffusion region. The concentration of impurity in the impurity region 69pc may be the same as the concentration of impurity in the impurity regions 69pa and 69pb. The impurity region 69pc is located between the n-type impurity region 68bn and n-type impurity region 67n in cross-sectional view, and electrically isolates the n-type impurity region 68bn and n-type impurity region 67n from each other.

In the configuration exemplified in FIG. 15, the inter-layer insulating layer 90 has a multi-layer structure including insulating layers 91 through 94, with multi-layer wiring 80 being disposed within the inter-layer insulating layer 90. The multi-layer wiring 80 includes a first wiring layer 81 located within the insulating layer 91, a second wiring layer 82 located within the insulating layer 92, a third wiring layer 83 located within the insulating layer 93, and a wiring layer 84 located within the insulating layer 94. The first wiring layer 81 out of these wiring layers 81 through 84 is located closest to the semiconductor substrate 60.

The first wiring layer 81 is typically a polysilicon layer formed across multiple pixels 10E in the imaging region R1, and has conductivity due to being doped with an impurity. The first wiring layer 81 includes the above-described contact plugs Cp1 and Cp3 as part thereof, and the control electrode 81e is part of the first wiring layer 81 in this example. Also in this example, the control electrode 81e is located on the second insulating layer 72, and is connected to the voltage line 38, so as to be capable of applying a predetermined voltage. Note that in the configuration exemplified in FIG. 15, in the layered structure of the first insulating layer 71, second insulating layer 72, and third insulating layer 73, the control electrode 81e is disposed on a portion where the third insulating layer 73 has been partially removed, but the third insulating layer 73 may be interposed between the control electrode 81e and the semiconductor substrate 60. That is to say, the control electrode 81e may be located upon the layered structure of the first insulating layer 71, second insulating layer 72, and third insulating layer 73. The first wiring layer 81 may be a metal wiring layer.

When viewing from a direction perpendicular to the semiconductor substrate 60, the control electrode 81e is located between the n-type impurity region 67n and the n-type impurity region 68bn, and covers at least part of the impurity region 69pc, as schematically illustrated in FIG. 16. The control electrode 81e is also located between the gate electrode 22e and the gate electrode 26e here.

The region of the impurity region 69pc that is covered by the control electrode 81e is located on the surface of the semiconductor substrate 60, as schematically illustrated in FIG. 15. As illustrated in the example in FIGS. 15 and 16, in a structure that uses part of a wiring layer in a layer that is above the gate electrode of the transistor as a control electrode for a blocking structure, there is no need to have the impurity regions 69pc and 69pb disposed separated from each other between the n-type impurity region 67n and n-type impurity region 68bn as in the above-described blocking structure 28A. A region with a relatively high concentration of impurity can be disposed in the semiconductor substrate 60 in the form of a single continuous impurity region between the n-type impurity region 67n and n-type impurity region 68bn.

In a case where the control electrode 81e is a polysilicon electrode doped with an n-type impurity for example, an accumulation state can be formed at the impurity region 69pc in the same way as with the blocking structure 28A in the first embodiment, by applying a voltage of 0 V or lower to the control electrode 81e from the voltage supply circuit 48, for example, via the voltage line 38. That is to say, minority carriers moving toward the n-type impurity region 67n can be eliminated by recombination at the region 78 located below the control electrode 81e. Applying a voltage of 0 V or lower to the control electrode 81e over the entire charge accumulation period enables contamination of the n-type impurity region 67n by excess minority carriers to be suppressed, and effects of suppressed leak current can be obtained.

Thus, an arrangement may be made where part of a wiring layer in a layer that is above the gate electrode of the transistor, located above the semiconductor substrate 60, is used as a control electrode for a blocking structure, instead of forming a control electrode in the same layer as the gate of the transistor included in the signal detecting circuit. In this case, a voltage can be applied that has a larger absolute value as compared to providing the control electrode in the same layer as the gate electrode of the transistor formed on the semiconductor substrate 60. The control electrode 81e may be a polysilicon electrode doped with a p-type impurity. In this case, a voltage equal to or greater than the substrate potential applied to the supporting substrate 61 via the substrate contact can be applied to the control electrode 81e over the entire charge accumulation period.

Figure 17:
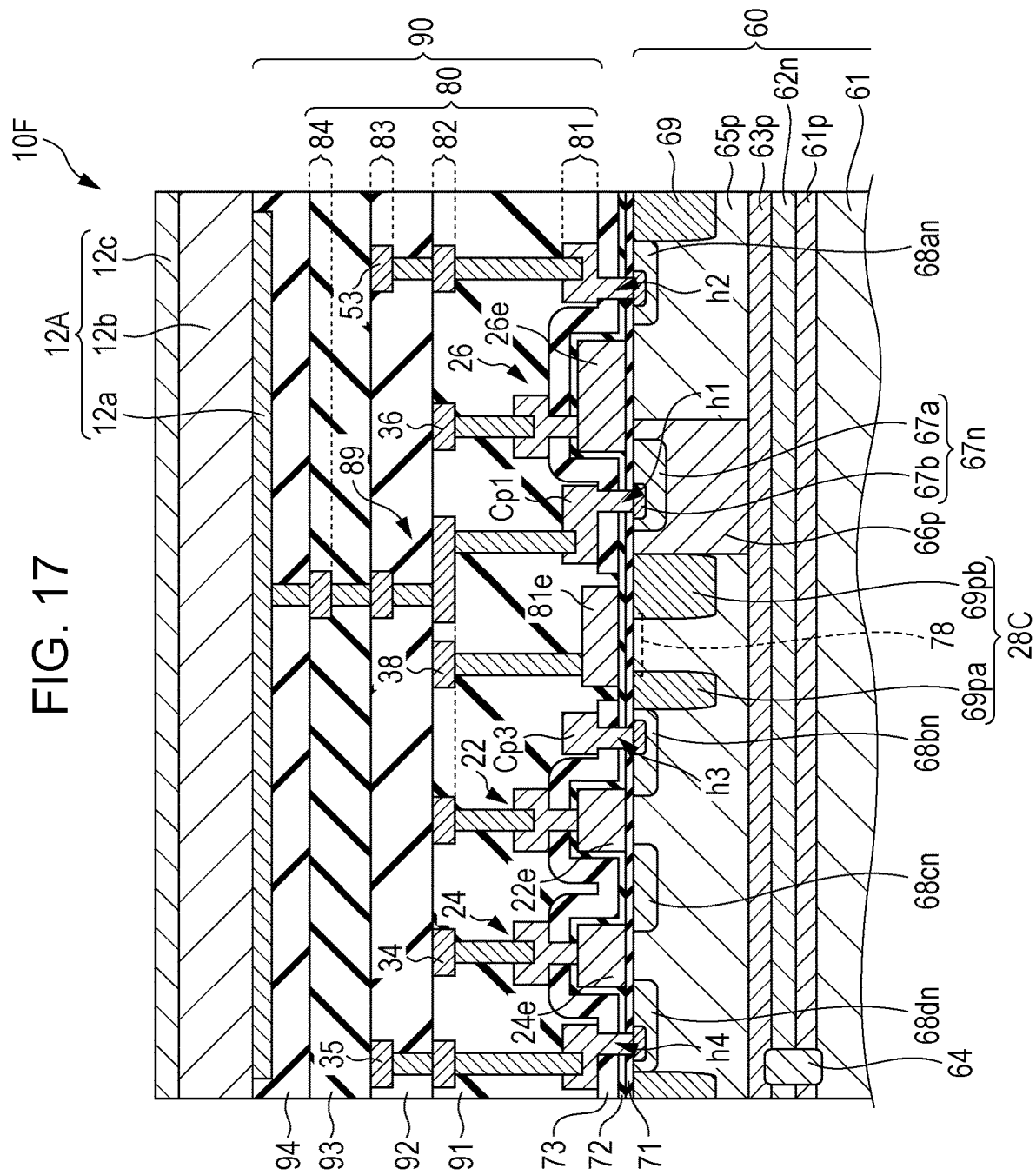
FIG. 17 is a cross-sectional view schematically illustrating another example of an exemplary device structure of a pixel that the imaging device according to the second embodiment of the present disclosure has.

Of course, in a configuration using part of a wiring layer in a layer that is above the gate electrode of the transistor as a control electrode for a blocking structure, the impurity regions 69pa and 69pb may be disposed separated from each other between the n-type impurity region 67n and n-type impurity region 68bn. FIG. 17 schematically illustrates the device structure of a pixel 1OF that has a blocking structure 28C including impurity regions 69pa and 69pb formed separated between the n-type impurity region 67n and n-type impurity region 68bn. In this example as well, the voltage line 38 has no electrical connection with any of the address signal line 34, reset signal line 36, and conductive structure 89.

Part of a wiring layer located in a layer that is further above can be used as a control electrode for a blocking structure, which will be described below. Providing the control electrode of the blocking structure in a layer higher than the gate electrode of the transistor formed on the semiconductor substrate 60 avoids physical interference with the gate electrode, so the degree of freedom relating design of the shape of the control electrode improves. Accordingly, the control electrode can be enlarged to a position near the n-type impurity region 67n in a plan view, for example. In this sort of configuration, layout of wiring where part of the control electrode overlaps the n-type impurity region 67n in the plan view may be tolerated.

Figure 18A:
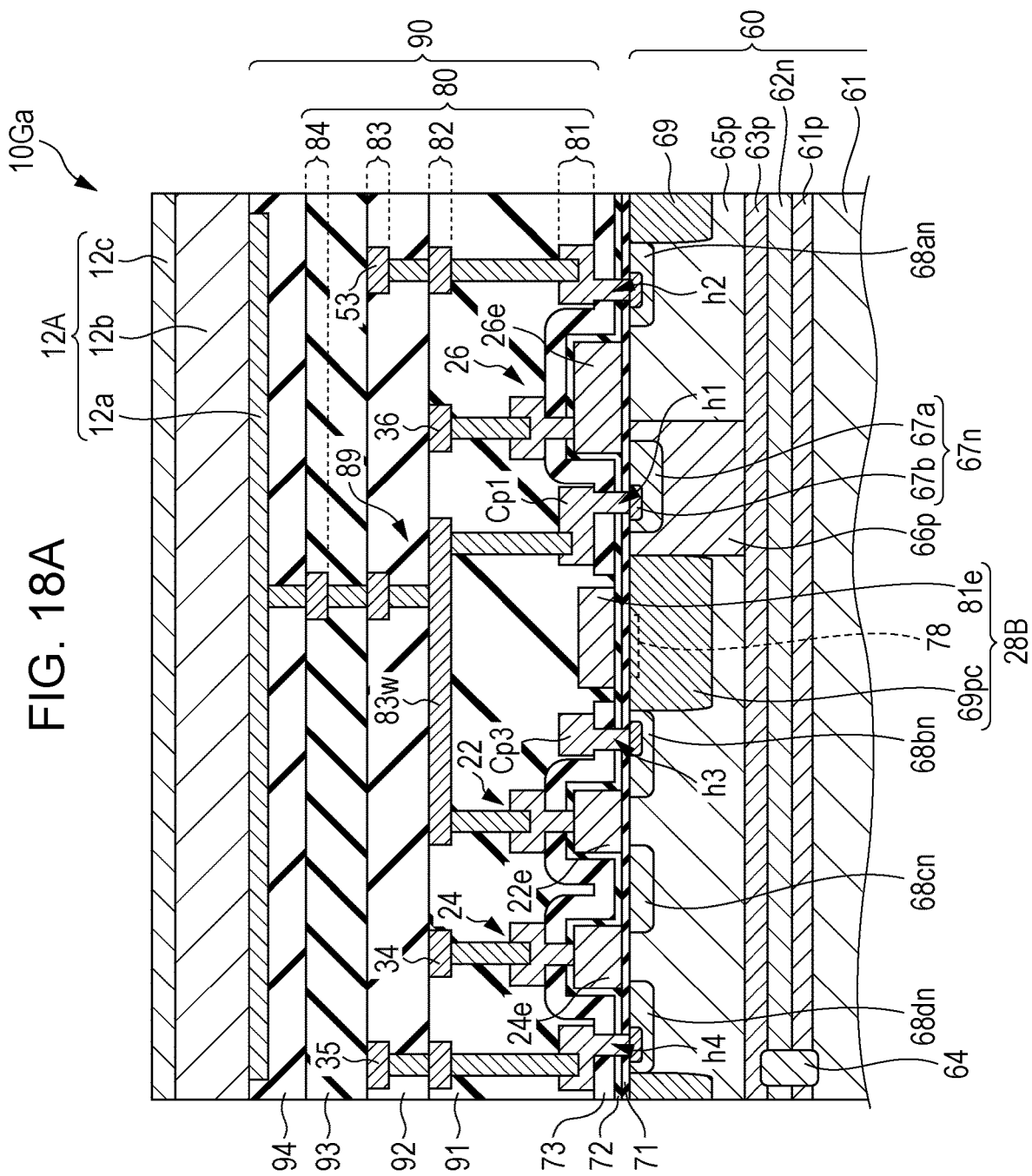
FIG. 18A is a cross-sectional view schematically illustrating another example of a device structure relating to a pixel that the imaging device according to the second embodiment of the present disclosure has.

FIG. 18A schematically illustrates another example of a device structure relating to a pixel that the imaging device according to the second embodiment of the present disclosure has. Although omitted from illustration in FIG. 18A, the control electrode 81e is connected to the voltage line 38 in the same way as in the example described with reference to FIG. 15 and is configured so that a predetermined voltage can be applied. Also, when viewing from a direction perpendicular to the semiconductor substrate 60, the control electrode 81e is located between the n-type impurity region 67n and the n-type impurity region 68bn, in the same way as in the example described with reference to FIG. 16.

The second wiring layer 82 of a pixel 10Ga illustrated in FIG. 18A has a wiring portion 83w located above the blocking structure 28B, in addition to the address signal line 34 and reset signal line 36. In this example exemplified here, the wiring portion 83w is a portion electrically connecting a via extending upwards from the contact plug Cp1 and a via extending upwards from a contact plug connected to the gate electrode 22e of the signal detecting transistor 22, in the conductive structure 89 or second wiring layer 82. The wiring portion 83w may be part of wiring covering the n-type impurity region 67n. The address signal line 34, reset signal line 36, and wiring portion 83w typically may be formed of a metal such as copper, tungsten, or the like, or a metal compound such as a metal nitride or a metal oxide, in the same way as the above-described conductive structure 89. The third wiring layer 83 located at a position in a layer further above the second wiring layer 82 is located within the insulating layer 92, and includes the above-described vertical signal line 35, feedback line 53, and so forth, as a part thereof.

Figure 18B:
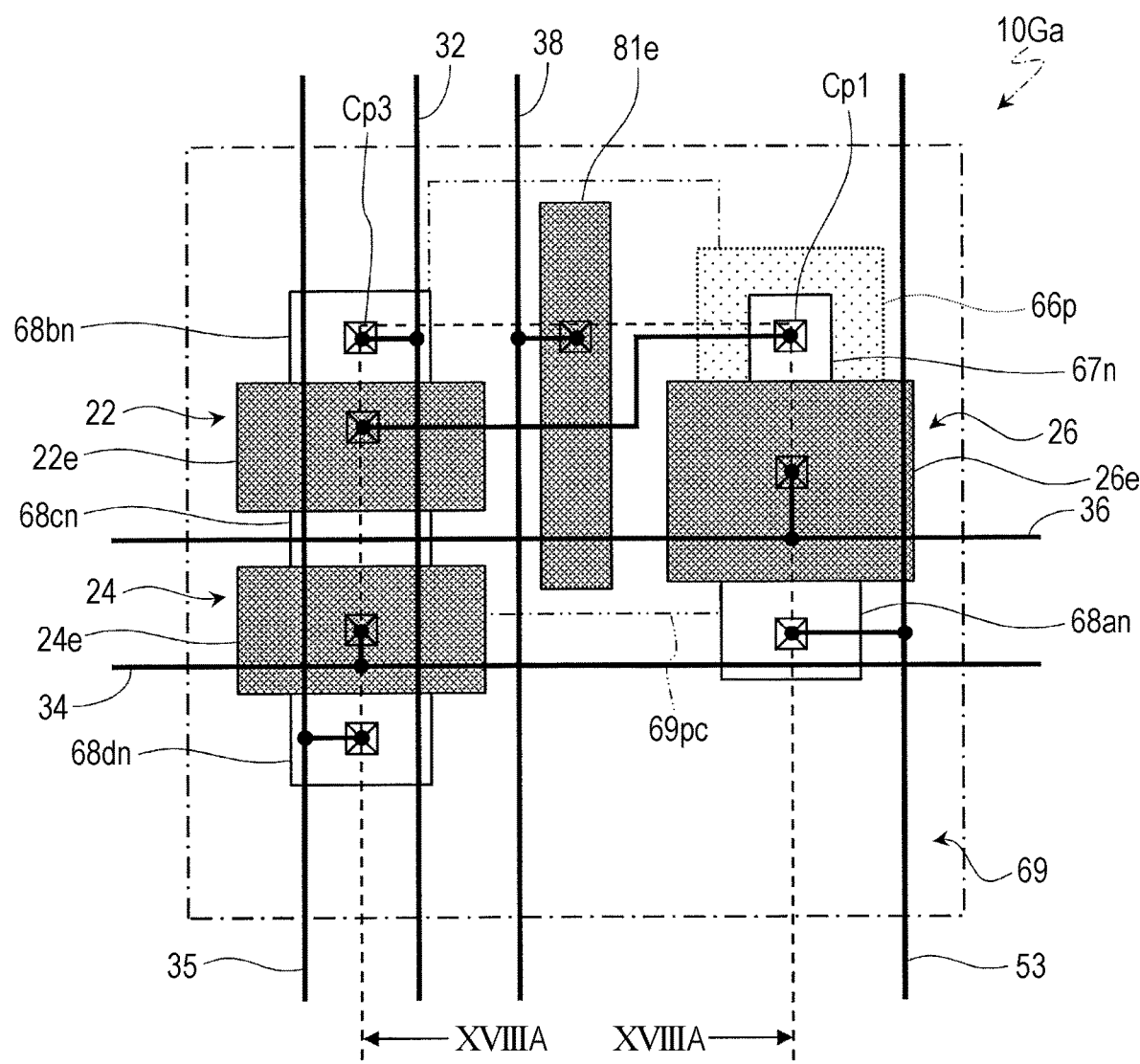
FIG. 18B is a schematic plan view illustrating an example of the layout of elements in a seventh pixel illustrated in FIG. 18A.

FIG. 18B illustrates an example of layout of the elements in the pixel 10Ga illustrated in FIG. 18A. Taking a cross-section of the pixel 10Ga along lines XVIIIA-XVIIIA in FIG. 18B and unfolding yields the cross-section illustrated in FIG. 18A.

The second wiring layer 82 is located in an upper layer from the gate electrode of the signal detecting transistor 22 and so forth formed on the semiconductor substrate 60, as described with reference to FIG. 18A. Accordingly, layout-related restrictions regarding structures of wiring included in the second wiring layer 82 and so forth are relatively few, and for example, wiring crossing the n-type impurity region 67n can be disposed within the inter-layer insulating layer 90. The above-described wiring portion 83w may have a shape covering the n-type impurity region 68bn and the n-type impurity region 67n serving as the charge accumulation region.

A voltage that is different from the voltage applied to the control electrode 81e of the blocking structure may be applied to the wiring portion 83w. For example, in a case where the supporting substrate 61 is an n-type silicon substrate, and the control electrode 81e is formed in the form of a polysilicon electrode doped with an n-type impurity, a voltage of the substrate potential or lower is applied to the control electrode 81e, whereas a voltage of the substrate potential or higher can be applied to the wiring portion 83w. Loss of the functions of the blocking structure 28B can be avoided even if such voltage is applied to the wiring portion 83w, due to the blocking effects of the control electrode 81e. In the same way, in a case where the control electrode 81e is a polysilicon electrode doped with a p-type impurity, a voltage that is not more than the substrate potential plus 1 V is applied to the control electrode 81e, whereas voltage that is not less than the substrate potential plus 1 V can be applied to the wiring portion 83w.

On the other hand, in a case where the supporting substrate 61 is a p-type silicon substrate, in other words, in a case where a p-type conductivity type has been employed for the n-type impurity region 67n, n-type impurity region 68bn, and so forth, instead of an n-type conductivity type, and in a case where the control electrode 81e is formed as a polysilicon electrode doped with an n-type impurity, a voltage that is not less than the substrate potential minus 1 V is applied to the control electrode 81e. At this time, a voltage of the substrate potential or lower may be applied to the wiring portion 83w. In a case where the supporting substrate 61 is a p-type silicon substrate, and the control electrode 81e is formed as a polysilicon electrode doped with a p-type impurity, a voltage of the substrate potential or higher is applied to the control electrode 81e. At this time, a voltage of the substrate potential or lower may be applied to the wiring portion 83w.

Figure 19:
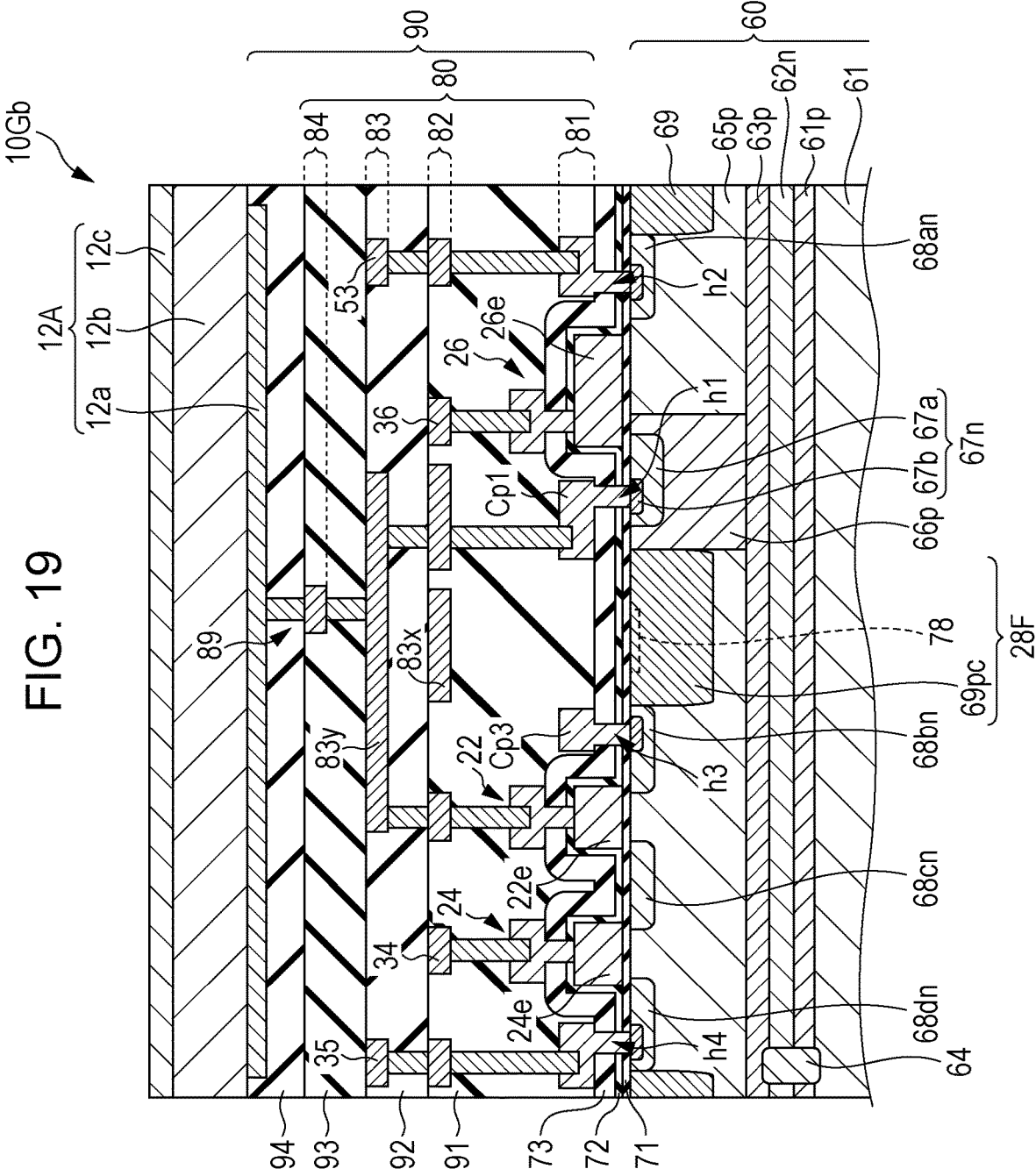
FIG. 19 is a cross-sectional view schematically illustrating yet another example of a device structure relating to a pixel that the imaging device according to the second embodiment of the present disclosure has.

FIG. 19 schematically illustrates yet another example of a device structure relating to a pixel that the imaging device according to the second embodiment of the present disclosure has. In the pixel 10Ga illustrated in FIG. 18A, the third insulating layer 73 in the layered structure of the first insulating layer 71, second insulating layer 72, and third insulating layer 73 are partially removed, and the control electrode 81e is disposed at the portion where the third insulating layer 73 has been removed. Conversely, partial removal of the third insulating layer 73 is not performed in a pixel 10Gb illustrated in FIG. 19, and the third insulating layer 73 covers the impurity region 69pc.

In the configuration exemplified in FIG. 19, the second wiring layer 82 includes a wiring portion 83x as a part thereof. Although omitted from illustration in FIG. 19, the wiring portion 83x is configured such that a predetermined voltage can be applied when operating, by being connected to the voltage line 38. The wiring portion 83x may be part of the voltage line 38. The wiring portion 83x typically is located between the n-type impurity region 67n and n-type impurity region 68bn in plan view.

In this example, the n-type impurity region 67n and the gate electrode 22e of the signal detecting transistor 22 are electrically connected to each other by a wiring portion 83y that is part of the third wiring layer 83 located at an upper layer than the second wiring layer 82. The wiring portion 83y may have a shape covering the n-type impurity region 68bn and the n-type impurity region 67n. The wiring portion 83x and wiring portion 83y in the pixel 10Gb typically may be formed of a metal such as copper, tungsten, or the like, or a metal compound such as a metal nitride or a metal oxide, in the same way as the above-described wiring portion 83w.

In comparison with the example described with reference to FIG. 18A, the wiring portion 83x that has electrical connection with the voltage line 38 can be made to function in the same way as the control electrode 81e in the above-described pixel 10Ga, in the example illustrated in FIG. 19. That is to say, a blocking structure 28F is configured of the wiring portion 83x, a portion of the first insulating layer 71, second insulating layer 72, and third insulating layer 73 located directly beneath the wiring portion 83x, and the impurity region 69pc.

In a case where the conductivity type of the impurity region near the surface of the semiconductor substrate 60, including the n-type impurity region 67n as the charge accumulation region and so forth, is n-type, as exemplified in FIG. 19, a voltage of the substrate potential or lower is applied to the wiring portion 83x when operating. At this time, voltage that is different from the voltage applied to the wiring portion 83x serving as the control electrode of the blocking structure may be applied to the wiring portion 83y located in an upper layer. For example, a voltage of the substrate potential or higher may be applied to the wiring portion 83y. On the other hand, in a case where the conductivity type of the impurity region near the surface of the semiconductor substrate 60 is p-type, a voltage of the substrate potential or higher is applied to the wiring portion 83x when operating. At this time, a voltage that is the substrate potential or lower may be applied to the wiring portion 83y located in an upper layer.

Example of Layout of Elements Among Multiple Pixels

The pixels 10 of the imaging device 100 may be two-dimensionally laid out, for example, on the semiconductor substrate 60, as described with reference to FIG. 1. A typical example of the layout of the elements in the pixels 10 two-dimensionally laid out will be described below.

Figure 20:
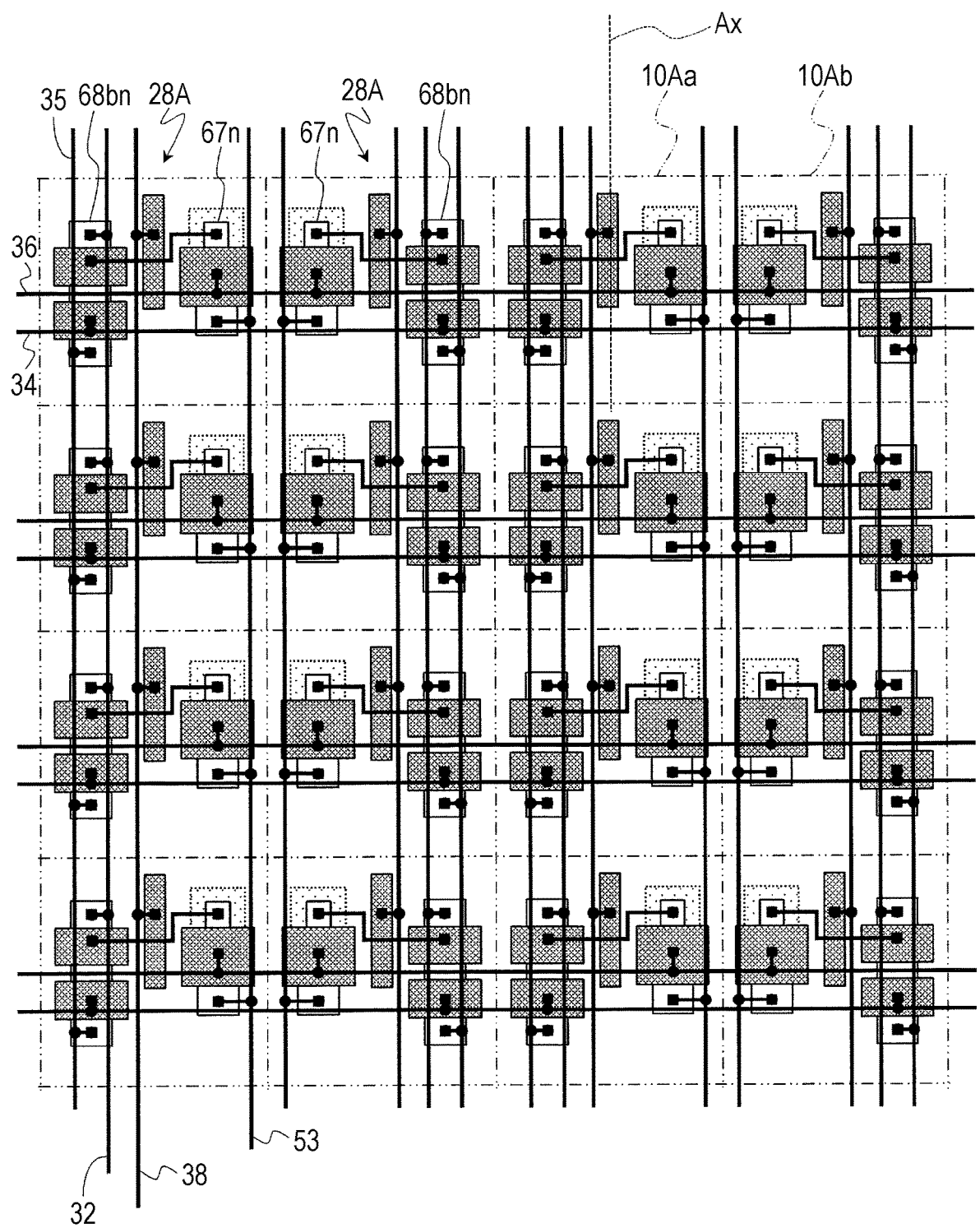
FIG. 20 is a schematic plan view illustrating an example of two-dimensional layout of the first pixels illustrated in FIG. 4.

FIG. 20 illustrates an example of a two-dimensional array of pixels 10A illustrated in FIG. 4. The imaging region R1 has a two-dimensional array of sets of pixels 10Aa and pixels 10Ab in the example illustrated in FIG. 20. Pixels 10Aa here are the same as the pixel 10A illustrated in FIG. 4. On the other hand, pixels 10Ab have a structure of a mirror image of the pixels 10Aa on a virtual axis Ax passing through the center of the pixels 10Aa and extending parallel to the column direction of the multiple pixels.

In the example illustrated in FIG. 20, an array is employed where, in the column direction of the multiple pixels, i.e., in the vertical direction of the plane of the drawing, pixels 10Aa are adjacent to pixels 10Aa and pixels 10Ab are adjacent to pixels 10Ab. On the other hand, in the row direction of the multiple pixels, i.e., in the horizontal direction of the plane of the drawing, pixels 10Aa and pixels 10Ab are disposed alternately repeating.

By employing this array of pixels, a blocking structure 28A is always interposed between the n-type impurity region 68*bn* and the n-type impurity region 67*n* closest to that n-type impurity region 68*bn* in the row direction. Accordingly, inflow of excess minority carriers from the n-type impurity region 68*bn* of a certain pixel 10Aa to the n-type impurity region 67*n* in a pixel 10Ab adjacent to the pixel 10Aa in the row direction can be effectively suppressed. In the same way, inflow of excess minority carriers from the n-type impurity region 68*bn* of a certain pixel 10Ab to the n-type impurity region 67*n* in a pixel 10Aa adjacent to the pixel 10Ab in the row direction can be avoided. An array may be employed where pixels 10Aa and pixels 10Ab are disposed alternately repeating in the column direction instead of in the row direction, or in addition to in the row direction.

Figure 21:
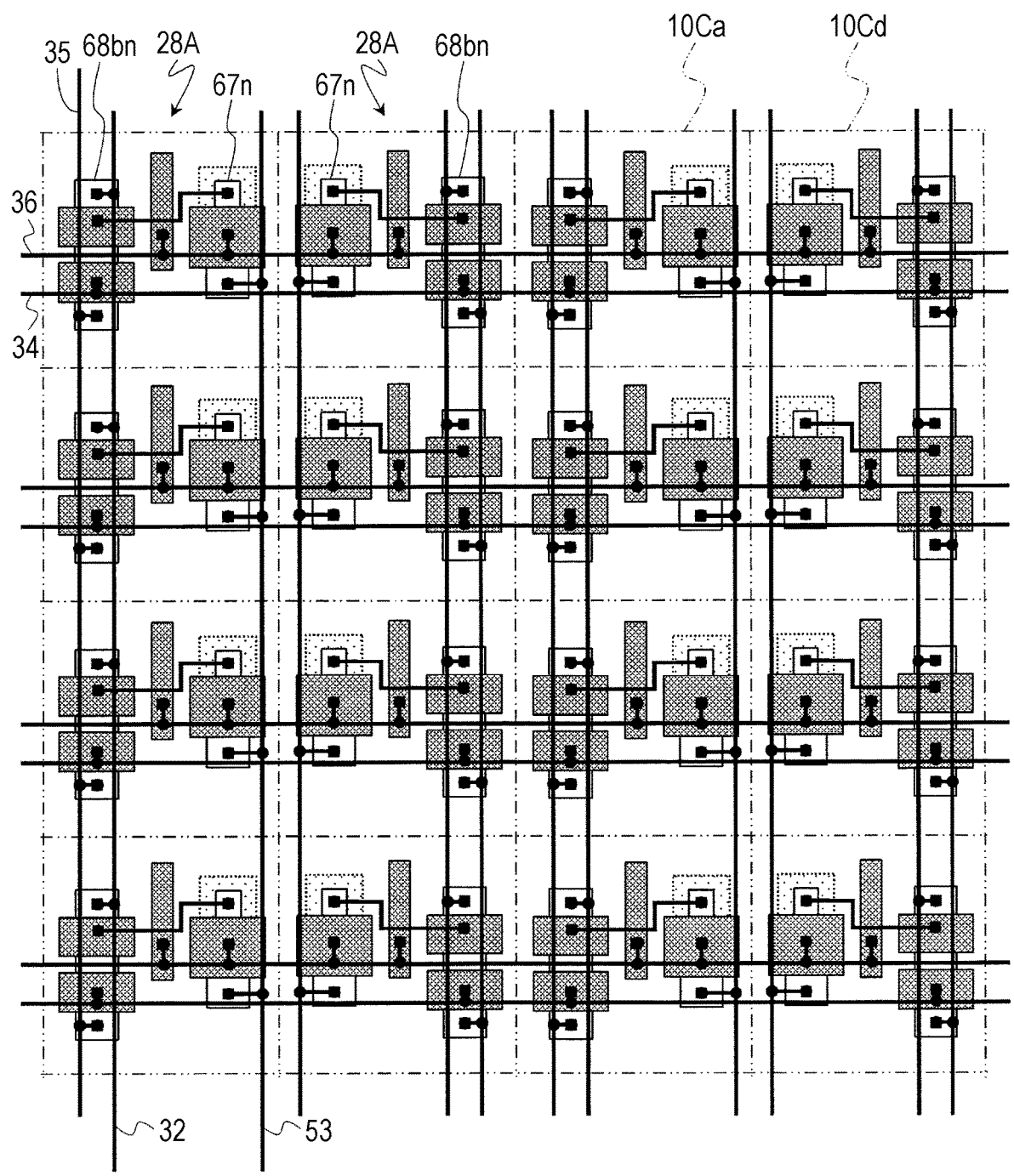
FIG. 21 is a schematic plan view illustrating an example of two-dimensional layout of third pixels illustrated in FIG. 8.

The same element layout and pixel array may be employed for the pixel 10B illustrated in FIG. 6 and the pixel 10C illustrated in FIG. 8. FIG. 21 illustrates an example of a two-dimensional array of the pixel 10C illustrated in FIG. 8. In this example as well, the imaging region R1 has an array of sets of pixels 10Ca and pixels 10Cb that have a structure of a mirror image of the pixels 10Ca on a symmetric axis extending in the vertical direction of the plane of the drawing. Pixels 10Ca and pixels 10Cb are disposed alternately repeating in the row direction of the multiple pixels, as illustrated in FIG. 21. Of course, an array may be employed where pixels 10Ca and pixels 10Cb are disposed alternately repeating in the column direction in addition to in the row direction.

Figure 22:
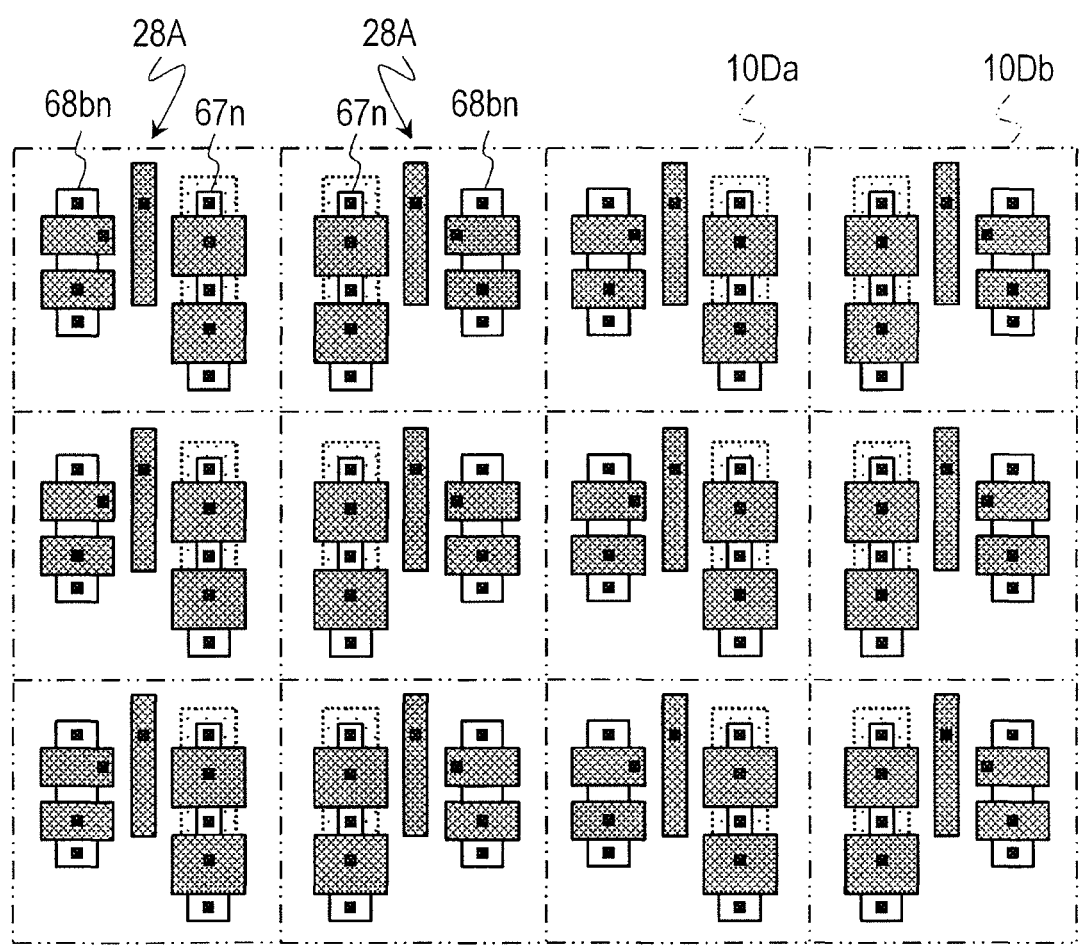
FIG. 22 is a schematic plan view illustrating an example of two-dimensional layout of the fourth pixels illustrated in FIG. 11.

FIG. 22 illustrates an example of the two-dimensional array of pixels 10D illustrated in FIG. 11. In this illustrated example, pixels 10Da, and pixels 10Db that have a structure of a mirror image of the pixels 10Da on a symmetric axis extending in the vertical direction of the plane of the drawing, are disposed alternately repeating in the row direction of the multiple pixels. Of course, an array may be employed where pixels 10Da and pixels 10Db are disposed alternately repeating in the column direction, in addition to the row direction. According to this array, inflow of excess charges to charge accumulation regions of adjacent pixels can be suppressed, in the same way as the examples in FIGS. 20 and 21.

Figure 23:
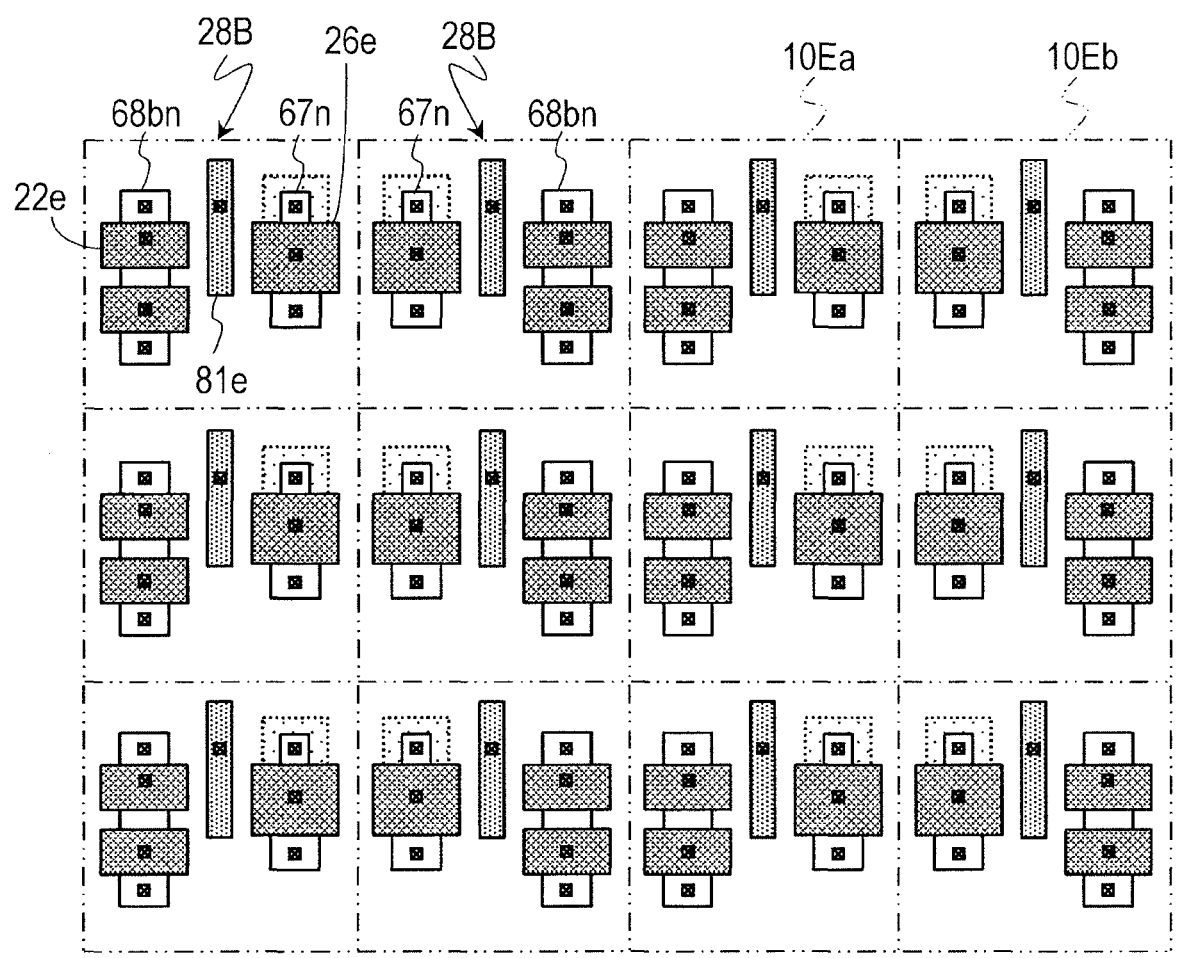
FIG. 23 is a schematic plan view illustrating an example of two-dimensional layout of the sixth pixels illustrated in FIG. 16.

FIG. 23 illustrates an example of the two-dimensional array of pixels 10E illustrated in FIG. 16. In this example as well, in the same way as with the examples described with reference to FIGS. 20 through 22, pixels 10Ea, and pixels 10Eb that have a structure of a mirror image of the pixels 10Ea on a symmetric axis extending in the vertical direction of the plane of the drawing, are disposed alternately repeating in the row direction of the multiple pixels.

In each of the pixel 10Ea and pixels 10Eb, the control electrode 81*e* of the blocking structure 28B is located between the gate electrode 22*e* of the signal detecting transistor 22 and the gate electrode 26*e* of the reset transistor 26. By employing the array in the example described with reference to FIGS. 20 through 22 to the pixels 10E that have the blocking structure 28B, suppression of contamination by excess charges in charge accumulation regions of adjacent pixels can be anticipated. An array may be employed where pixels 10Ea and pixels 10Eb are disposed alternately repeating in the column direction in addition to in the row direction.

Other Modifications

Figure 24:
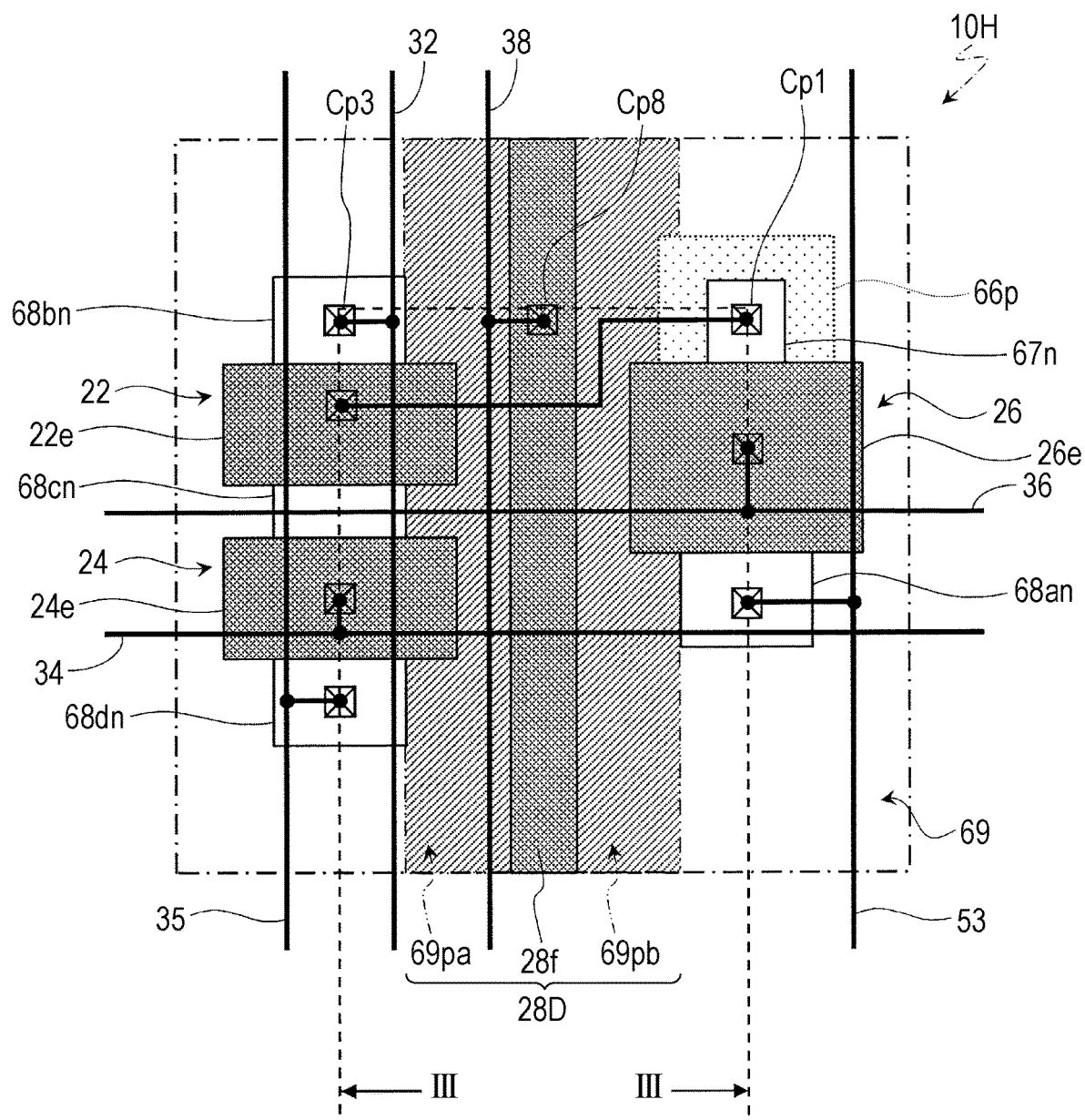
FIG. 24 is a schematic plan view illustrating another example of a pixel having a blocking structure.

FIG. 24 illustrates another example of a pixel having a blocking structure. Pixel 10H illustrated in FIG. 24 has a structure similar to that of the pixel 10A illustrated in FIG. 4, and includes a blocking structure 28D instead of the blocking structure 28A. Note that taking a cross-section of the pixel 10H along lines III-Ill in FIG. 24 and unfolding may yield the same as the cross-section illustrated in FIG. 3. Accordingly, illustration of a cross-section here is omitted.

In the configuration exemplified in FIG. 24, a control electrode 28*f* of the blocking structure 28D has a shape extending from one edge portion of the pixel 10H to the other edge portion following the vertical signal line 35 in plan view, as compared with the control electrode 28*e* illustrated in FIG. 4. The impurity regions 69*pa* and 69*pb* also have shapes extending from one edge portion of the pixel 10H to the other edge portion. Portions corresponding to the impurity regions 69*pa* and 69*pb* in the pixel isolation region 69 are schematically indicated by hatching in FIG. 24. The positions of the impurity regions 69*pa* and 69*pb* may be represented by hatching in the following plan views as well.

Providing this blocking structure 28D in the pixel enables contamination by excess charges from the n-type impurity region 68*bn* to be blocked. Further, charges generated at the p-n junction of the n-type impurity region 68*cn* and the periphery thereof and moving toward the n-type impurity region 67*n*, and/or charges generated at the n-type impurity region 68*dn* and the periphery thereof and moving toward the n-type impurity region 67*n*, can be blocked by the blocking structure 28D. Accordingly, inflow of excess charges to the n-type impurity region 67*n* functioning as part of the charge accumulation region can be suppressed, and leak current due to inflow of such excess charges can be suppressed more effectively. Note that the impurity regions 69*pa* and 69*pb* extending from one edge portion of the pixel 10H to the other end portion is not indispensable. For example, these may be placed at least between the n-type impurity region 67*n* and n-type impurity region 68*bn*, between the n-type impurity region 67*n* and n-type impurity region 68*cn*, and between the n-type impurity region 67*n* and n-type impurity region 68*dn*.

Figure 25:
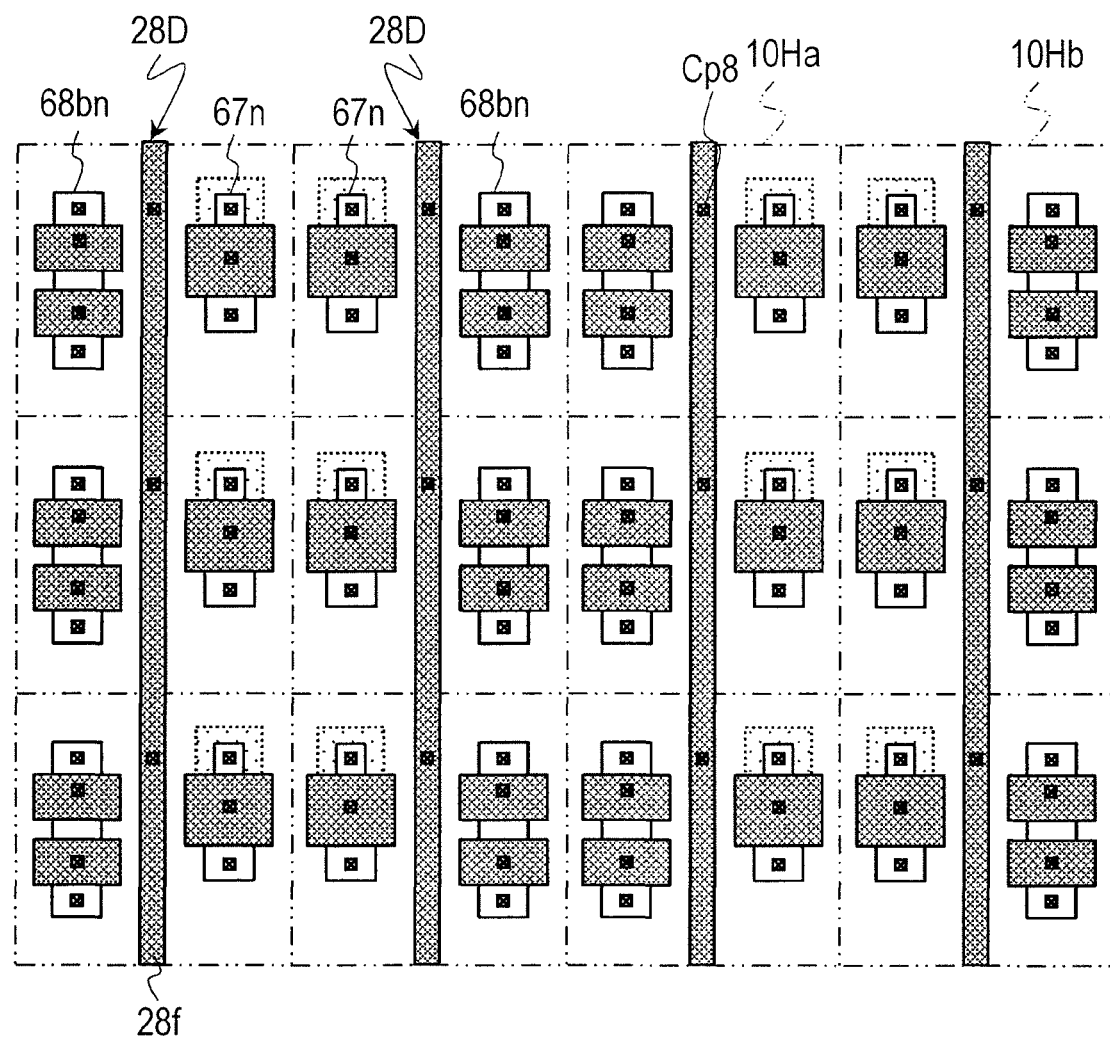
FIG. 25 is a schematic plan view illustrating an example of a two-dimensional array of eighth pixels described with reference to FIG. 24.

FIG. 25 illustrates an example of the two-dimensional array of pixels 10H described with reference to FIG. 24. In the example illustrated in FIG. 25, in the same way as with the examples described with reference to FIGS. 20 through 23, pixels 10Ha, and pixels 10Hb that have a structure of a mirror image of the pixels 10Ha on a symmetric axis extending in the vertical direction of the plane of the drawing, are arrayed alternately repeating in the row direction of the multiple pixels. It is needless to say that an array may be employed where pixels 10Ha and pixels 10Hb are disposed alternately repeating in the column direction in addition to in the row direction.

In the configuration described in FIG. 25, the control electrode 28f of the blocking structure 28D continuously extends through multiple pixels 10Ha or multiple pixels 10Hb in the column direction of the multiple pixels. Accordingly, movement of excess charges in the row direction of the multiple pixels can be more effectively suppressed. In this example, the contact plug Cp8 that electrically connects the control electrode 28f to the voltage line 38 is provided to each of the pixels 10Ha and each of the pixels 10Hb. However, the control electrode 28f is formed continuously over multiple pixels in this example, so there is no need to connect the control electrode 28f to the voltage line 38 in all pixels included in the imaging region R1. For example, an arrangement may be made where the contact plug Cp8 is selectively disposed in pixels located at the edge portion in the column direction out of the multiple pixels disposed in the imaging region R1, and the control electrode 28f is connected to the voltage line 38 therein. Alternatively, an arrangement may be made where dummy pixels having the blocking structure 28D are disposed in the peripheral region R2, and the contact plug Cp8 is disposed at the control electrode 28f in the dummy pixels, thereby electrically connecting the voltage line 38 to the control electrode 28f in each of the pixels.

Figure 26:
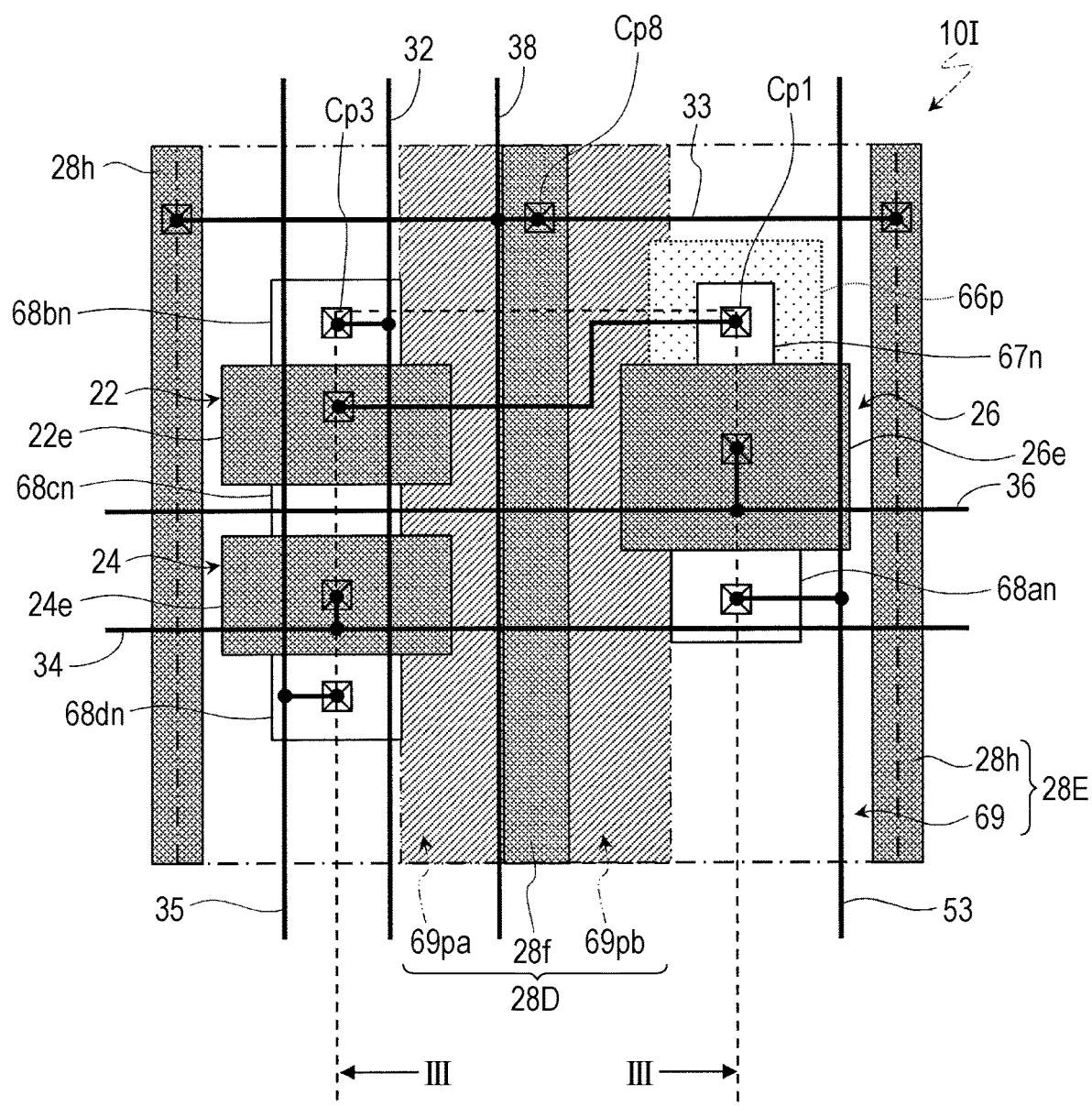
FIG. 26 is a schematic plan view illustrating yet another example of a pixel having a blocking structure.

FIG. 26 illustrates yet another example of a pixel having a blocking structure. Pixel 10I illustrated in FIG. 26 has two control electrodes 28h extending in the column direction at the edge portions of the pixel 10I, with the control electrode 28f interposed between, as compared with the pixel 10H described with reference to FIG. 24. The control electrodes 28h each are provided along the boundary of two pixels 10I adjacent in the row direction, as schematically illustrated in FIG. 26.

Note that taking a cross-section of the pixel 10I along lines III-III in FIG. 26 and unfolding may yield the same as the cross-section illustrated in FIG. 3. It can be understood from comparison with FIG. 3, that the first insulating layer 71 and second insulating layer 72 exist directly beneath the control electrodes 28h, and further, the pixel isolation region 69 may be disposed in a region of the semiconductor substrate 60 covered by the control electrodes 28h. The pixel isolation region 69 here is a p-type diffusion region, and accordingly, the pixel 10I has a blocking structure 28E that has a configuration generally the same as that as the blocking structure 28D at and near the control electrodes 28h.

As illustrated in FIG. 26, the control electrodes 28h are electrically connected to the voltage line 38 by wiring 33, and are configured such that a predetermined voltage can be applied via the voltage line 38 when the imaging device 100 is operating, in the same way as with the control electrode 28f. Accordingly, blocking structures 28E located at the edge portions of the pixel 10I can be made to function in the same way as the blocking structure 28D located at the general middle of the pixel 10I.

Figure 27:
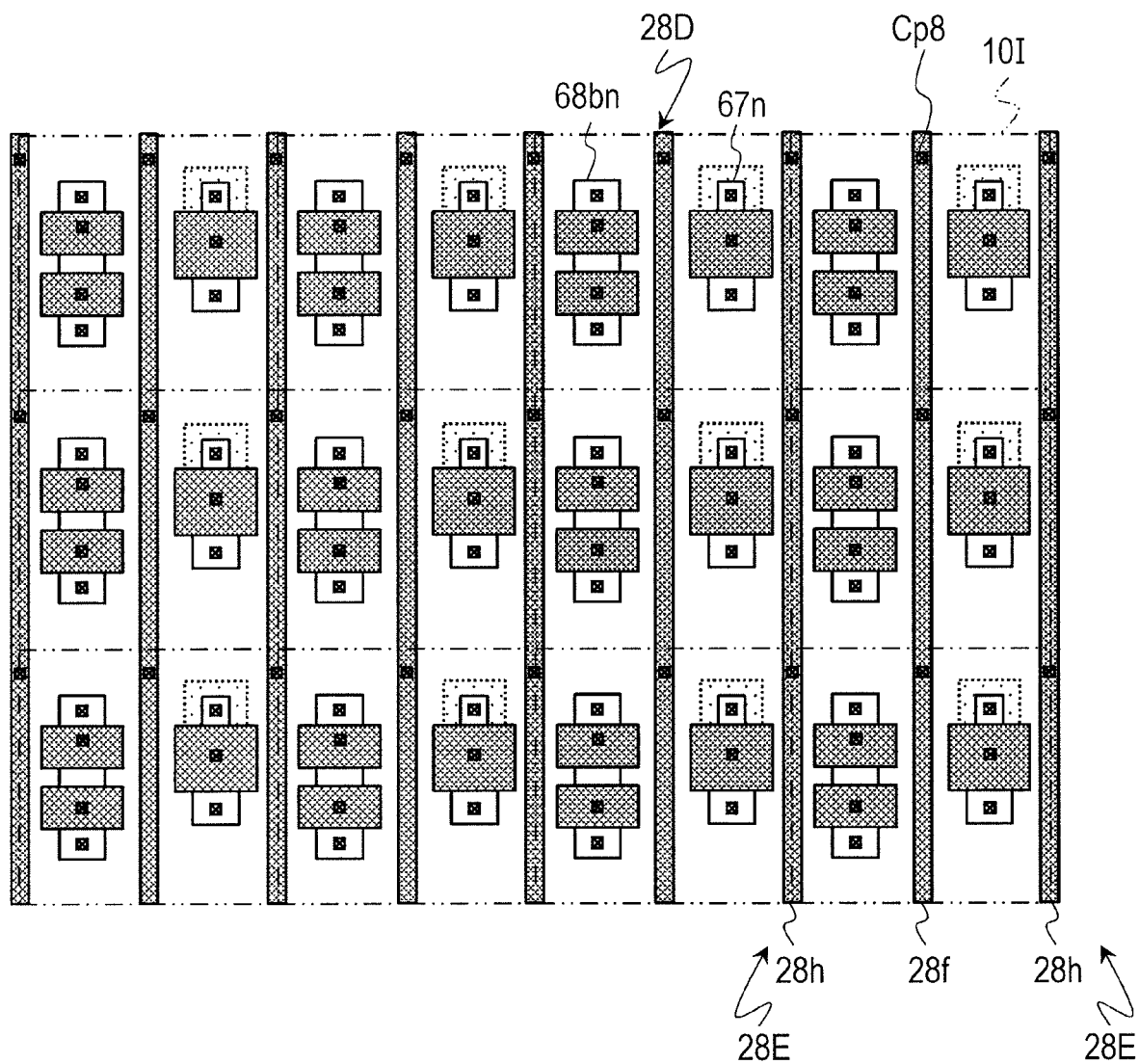
FIG. 27 is a schematic plan view illustrating an example of a two-dimensional array of ninth pixels described with reference to FIG. 26.

FIG. 27 illustrates an example of a two-dimensional array of the pixels 10I described with reference to FIG. 26. Unlike the examples described with reference to FIGS. 20 through 25, the layout of the pixel elements are all the same in the example illustrated in FIG. 27, instead of combining with pixels that have a structure of a mirror image of the pixels 10I on a symmetric axis in the column direction. It can be seen from FIG. 27 that the control electrode 28f and control electrodes 28h each continuously extend over multiple pixels 10I in the column direction of the multiple pixels 10I.

As described above, providing the blocking structure 28D in the pixel 10I enables inflow of excess charges from the n-type impurity regions 68bn, 68cn, and 68dn to the n-type impurity region 67n to be suppressed within each pixel 10I. Further, providing the blocking structures 28E at the edge portions of the pixel 10I in the column direction, for example, of the multiple pixels 10I enables contamination by excess charges between pixels 10I adjacent to each other in the row direction to be suppressed, while not needing combining with pixels of different element layout, as illustrated in FIG. 27. There is no need to combine with pixels of different element layout, so effects of misalignment due to different processes can be avoided, and the difference in pixel properties per column can be reduced.

Figure 28:
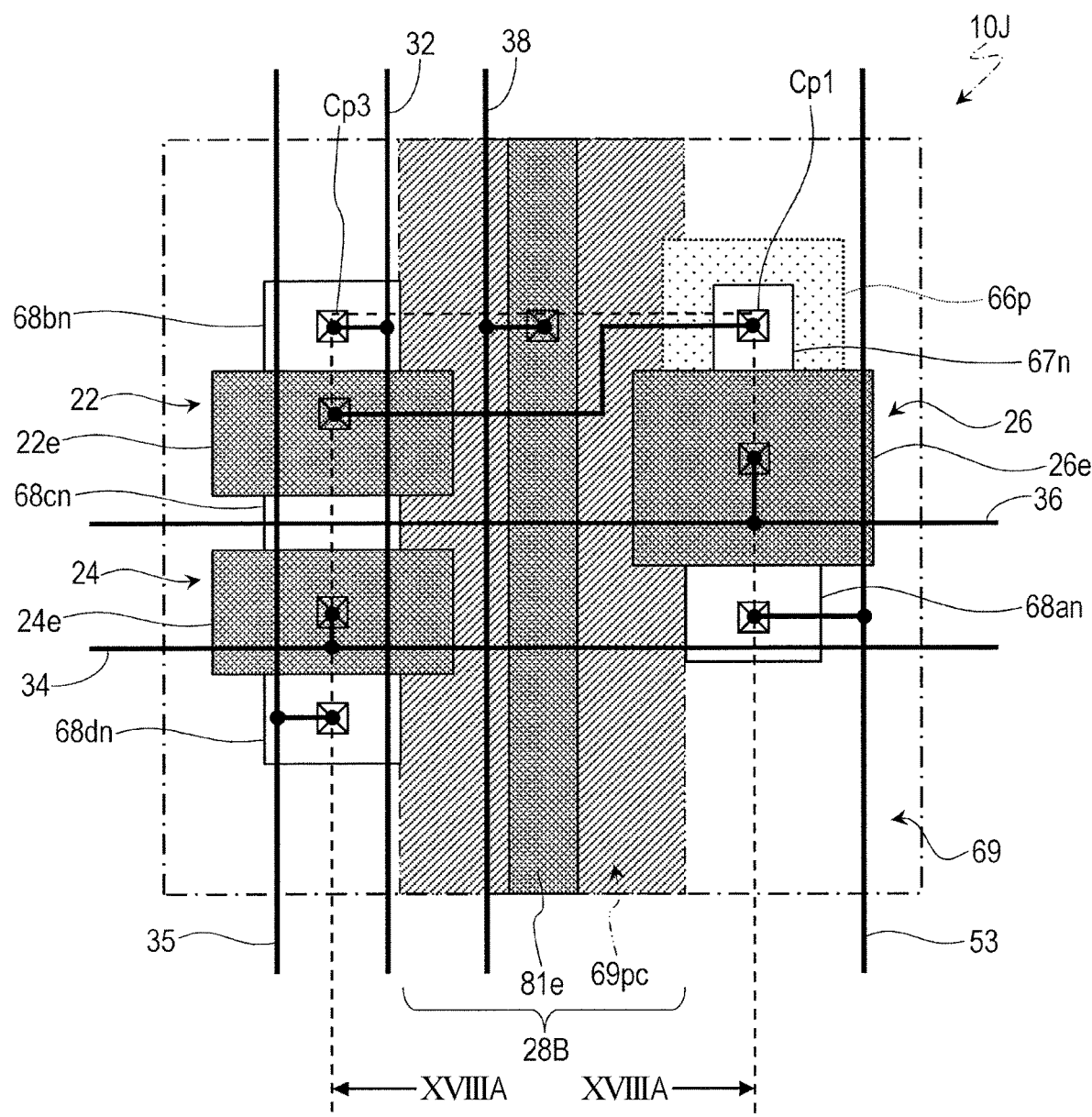
FIG. 28 is a schematic plan view illustrating a modification of the seventh pixel described with reference to FIGS. 18A and 18B.

FIG. 28 illustrates a modification of the pixel 10Ga described with reference to FIGS. 18A and 18B. Taking a cross-section of pixel 10J along lines XVIIIA-XVIIIA in FIG. 28 and unfolding may yield the same as the cross-section illustrated in FIG. 18A. Accordingly, illustration of a cross-section is omitted here.

The pixel 10J illustrated in FIG. 28 has the blocking structure 28B in the same way as the above-described pixel 10Ga. Note, however, the control electrode 81e of the blocking structure 28B has a shape extending from one edge portion of the pixel 10J to the other edge portion along the vertical signal line 35 in plan view. In accordance with the control electrode 81e extending from one edge portion of the pixel 10J to the other edge portion in plan view, the impurity region 69pc also extends from one edge portion of the pixel 10J to the other edge portion in this example, as schematically illustrated in FIG. 28.

The control electrode 81e can be extended over the entirety of the pixel 10J in the column direction for example, in the second embodiment as well, as illustrated in FIG. 28, instead of forming the control electrode 81e at selective regions between the gate electrode 22e and the gate electrode 26e, in the same way as with the examples illustrated in FIGS. 24 through 27. According to this configuration, inflow of excess charges from the n-type impurity regions 68bn, 68cn, and 68dn to the n-type impurity region 67n can be suppressed, in the same way as in the example illustrated in FIG. 24 and so forth.

Figure 29:
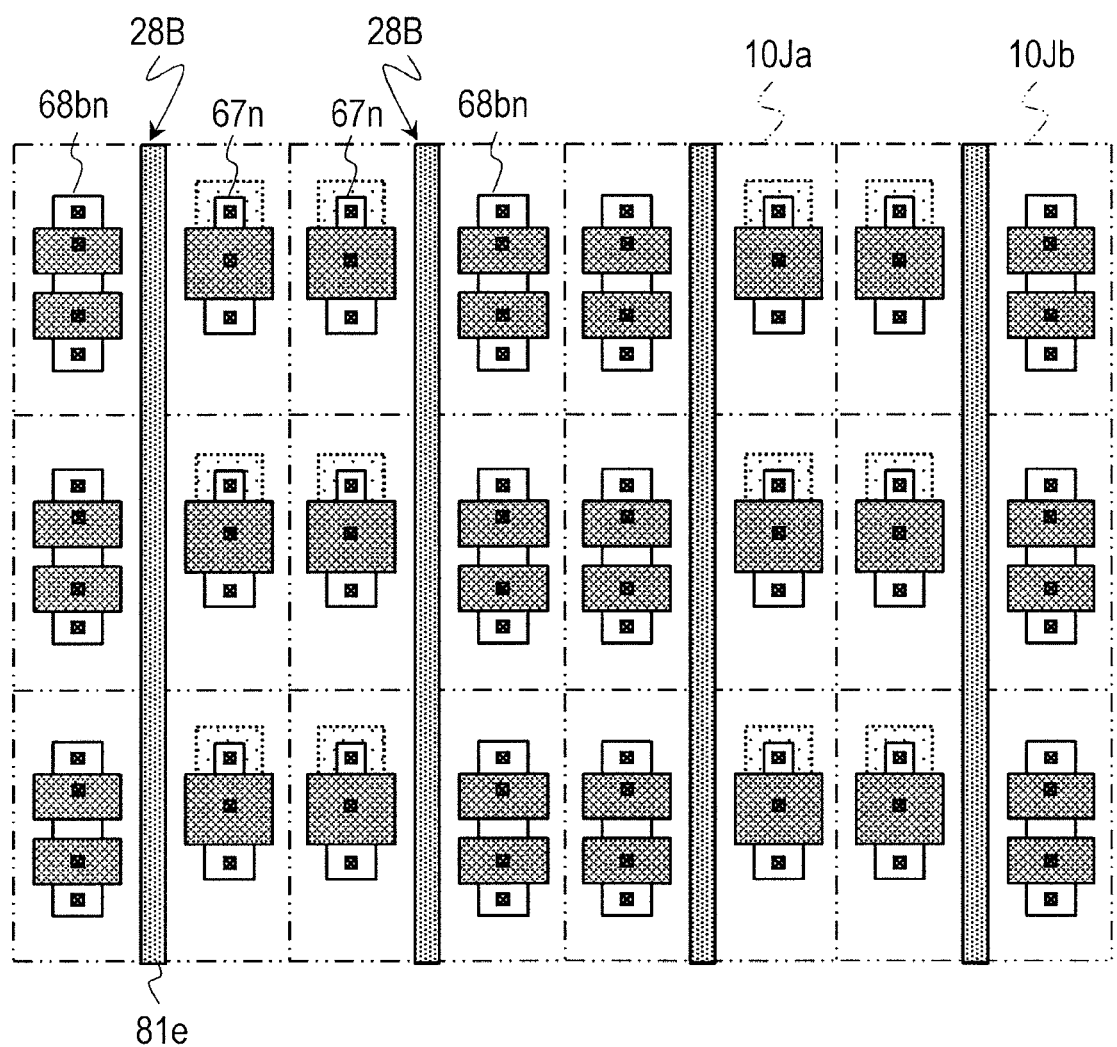
FIG. 29 is a schematic plan view illustrating an example of two-dimensional layout of tenth pixels described with reference to FIG. 28.

FIG. 29 illustrates an example of the two-dimensional array of pixels 10J described with reference to FIG. 28. In the example illustrated in FIG. 28, in the same way as in the examples described with reference to FIGS. 20 through 25, pixels 10Ja, and pixels 10Jb that have a structure of a mirror image of the pixels 10Ja on a symmetric axis extending in the vertical direction of the plane of the drawing, are arrayed alternately repeating in the row direction of the multiple pixels. An array may be employed where pixels 10Ja and pixels 10Jb are disposed alternately repeating in the column direction in addition to in the row direction.

In the configuration exemplified in FIG. 28, the control electrode 81e of the blocking structure 28B extends continuously over multiple pixels 10Ja or multiple pixels 10Jb in the column direction of the multiple pixels. Electrical contact between the control electrode 81e and voltage line 38 may be provided at pixels located on the end portion of multiple pixels in the column direction, for example.

As described above, according to embodiments of the present disclosure, the effects of leak current can be suppressed, and accordingly, an imaging device capable of imaging with high image quality can be provided. Note that the conductivity types of impurity regions in the semiconductor substrate are not restricted to the arrangements in the above-described examples, and that configurations may be made where n-type and p-type are inverted. Also note that the transistors described above, such as the signal detecting transistor 22, address transistor 24, reset transistor 26, and so forth, may be N-channel MOS devices or may be P-channel MOS devices. These transistors do not have to be all N-channel MOS devices or all P-channel MOS devices. In a case of using N-channel MOS devices for the transistors in the pixel, and using electrons as the signal charge, it is sufficient to invert the layout of sources and drains of the transistors.

Although a configuration where the impurity regions 69*pa* and 69*pb* are disposed separated from each other, and a configuration where the impurity region 69*pc* is disposed below the control electrode, have been exemplified in the above-described examples, these impurity profiles are not restrictive, and the region of the semiconductor substrate directly beneath the control electrode of the blocking structure may be the pixel isolation region 69. In this case, an accumulation state, for example, can be formed in the region directly beneath the control electrode by applying bias voltage with a larger absolute value to the control electrode.

According to embodiments of the present disclosure, an imaging device that can suppress effects of leak current and take high quality images is provided. The imaging device according to the present disclosure is useful in, for example, image sensors, digital cameras, and so forth. The imaging device according to the present disclosure can be used in medical cameras, robotic cameras, security cameras, cameras installed in vehicles and used, and so forth.

What is claimed is:

1. An imaging device, comprising:
   a photoelectric converter that generates a signal charge by photoelectric conversion of light;
   a semiconductor substrate that includes a first semiconductor layer on a surface of the semiconductor substrate;
   a charge accumulation region that is an impurity region of a first conductivity type in the first semiconductor layer, the charge accumulation region being configured to accumulate the signal charge;
   a first transistor that includes, as a source or a drain, a first impurity region of the first conductivity type in the first semiconductor layer; and
   a blocking structure that is located between the charge accumulation region and the first transistor, wherein the blocking structure includes
      a second impurity region of a second conductivity type in the first semiconductor layer, the second impurity region being located between the charge accumulation region and the first impurity region, the second conductivity type being different from the first conductivity type, and
      a first electrode that is located above the first semiconductor layer, the first electrode overlapping at least a part of the second impurity region in a plan view, the first electrode being configured to be applied with a first voltage in a period when the charge accumulation region accumulates the signal charge, the first voltage being a constant voltage.

2. The imaging device according to claim 1, wherein the second impurity region has a first region located on the surface of the semiconductor substrate, the first electrode overlapping at least a part of the first region in the plan view.

3. The imaging device according to claim 1, further comprising:
   a third impurity region of the second conductivity type in the first semiconductor layer, the third impurity region being adjacent to the charge accumulation region.

4. The imaging device according to claim 3, wherein the semiconductor substrate includes
   a supporting substrate of the second conductivity type, and
   a second semiconductor layer of the first conductivity type, the second semiconductor layer being located between the supporting substrate and the first semiconductor layer.

5. The imaging device according to claim 1, wherein the first conductivity type is n-type.

6. The imaging device according to claim 5, wherein the first electrode includes an n-type impurity, and the first voltage is 0 V or a negative voltage.

7. The imaging device according to claim 5, wherein the first electrode includes a p-type impurity, and the first voltage is 1 V or less.

8. The imaging device according to claim 1, wherein the blocking structure includes a fourth impurity region of the second conductivity type in the first semiconductor layer, the fourth impurity region being located between the charge accumulation region and the first impurity region, the fourth impurity region being different from the second impurity region.

9. The imaging device according to claim 8, wherein the first electrode overlaps at least a part of the fourth impurity region in the plan view.

10. The imaging device according to claim 1, further comprising:
    multi-layer wiring that is located above the semiconductor substrate, the multi-layer wiring including a first wiring layer closest to the first semiconductor layer, and the first electrode is a part of the first wiring layer.

11. The imaging device according to claim 10, wherein the semiconductor substrate includes
    a supporting substrate of the second conductivity type, and
    a second semiconductor layer of the first conductivity type, the second semiconductor layer being located between the supporting substrate and the first semiconductor layer.

12. The imaging device according to claim 10, wherein the first conductivity type is n-type, and the first voltage is equal to or less than a substrate potential.

13. The imaging device according to claim 12, wherein the multi-layer wiring includes a second wiring layer that is located farther from the semiconductor substrate than the first wiring layer is, and
    a part of the second wiring layer covers the charge accumulation region and the first impurity region in the plan view, the part of the second wiring layer being configured to be applied with a voltage equal to or greater than the substrate potential.

14. The imaging device according to claim 10, wherein the first conductivity type is p-type, and the first voltage is equal to or greater than a substrate potential.

15. The imaging device according to claim 14, wherein
the multi-layer wiring includes a second wiring layer that
is located farther from the semiconductor substrate than
the first wiring layer is,
a part of the second wiring layer covers the charge accumulation region and the first impurity region in the plan view, the part of the second wiring layer being configured to be applied with a voltage equal to or less than the substrate potential.

16. The imaging device according to claim 1, wherein the first electrode is electrically insulated from the first semiconductor layer.

17. The imaging device according to claim 1, wherein the photoelectric converter is located above the surface of the semiconductor substrate.

18. The imaging device according to claim 1, wherein the charge accumulation region is configured to accumulate the signal charge transmitted from the photoelectric converter.

19. The imaging device according to claim 1, wherein
the first transistor includes a gate electrode above the semiconductor layer, and
the first electrode is electrically insulated from the gate electrode.

20. The imaging device according to claim 1, wherein the photoelectric converter is spaced from the surface of the semiconductor substrate.

\* \* \* \* \*